(12) United States Patent
Yu et al.

(10) Patent No.: US 12,412,799 B2
(45) Date of Patent: Sep. 9, 2025

(54) INTEGRATED CIRCUIT PACKAGE AND METHOD

(71) Applicant: Taiwan Semiconductor Manufacturing Co., Ltd., Hsinchu (TW)

(72) Inventors: Chen-Hua Yu, Hsinchu (TW); Wei Ling Chang, Hsinchu (TW); Chuei-Tang Wang, Taichung (TW); Fong-Yuan Chang, Hsinchu (TW); Chieh-Yen Chen, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 63 days.

(21) Appl. No.: 17/874,782

(22) Filed: Jul. 27, 2022

(65) Prior Publication Data
US 2022/0359333 A1 Nov. 10, 2022

Related U.S. Application Data

(62) Division of application No. 16/882,132, filed on May 22, 2020, now Pat. No. 11,532,533.
(Continued)

(51) Int. Cl.
*H01L 23/31* (2006.01)
*H01L 21/02* (2006.01)
*H01L 23/00* (2006.01)

(52) U.S. Cl.
CPC .... *H01L 23/3185* (2013.01); *H01L 21/02074* (2013.01); *H01L 23/3192* (2013.01); *H01L 24/02* (2013.01)

(58) Field of Classification Search
None
See application file for complete search history.

(56) References Cited

U.S. PATENT DOCUMENTS

| 8,361,842 B2 | 1/2013 | Yu et al. |
| 8,680,647 B2 | 3/2014 | Yu et al. |

(Continued)

FOREIGN PATENT DOCUMENTS

| CN | 107221526 A | 9/2017 |
| WO | 2019132968 A1 | 7/2019 |

OTHER PUBLICATIONS

What is technology node. IGI Global. (n.d.). https://www.igi-global.com/dictionary/technology-node/44459 (Year: 2024).*

*Primary Examiner* — Jay C Chang
(74) *Attorney, Agent, or Firm* — Slater Matsil, LLP

(57) ABSTRACT

In an embodiment, a device includes: a processor die including circuit blocks, the circuit blocks including active devices of a first technology node; a power gating die including power semiconductor devices of a second technology node, the second technology node larger than the first technology node; and a first redistribution structure including first metallization patterns, the first metallization patterns including power supply source lines and power supply ground lines, where a first subset of the circuit blocks is electrically coupled to the power supply source lines and the power supply ground lines through the power semiconductor devices, and a second subset of the circuit blocks is permanently electrically coupled to the power supply source lines and the power supply ground lines.

20 Claims, 41 Drawing Sheets

Related U.S. Application Data

(60) Provisional application No. 62/916,954, filed on Oct. 18, 2019.

(56) References Cited

U.S. PATENT DOCUMENTS

| | | | |
|---|---|---|---|
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 2011/0291288 | A1 | 12/2011 | Wu et al. |
| 2013/0026468 | A1 | 1/2013 | Yoshimuta et al. |
| 2013/0040423 | A1 | 2/2013 | Tung et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0307140 | A1 | 11/2013 | Huang et al. |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2016/0086918 | A1 | 3/2016 | Lin et al. |
| 2016/0197029 | A1 | 7/2016 | Tsai et al. |
| 2017/0053897 | A1 | 2/2017 | Lai et al. |
| 2017/0092626 | A1 | 3/2017 | Yuan et al. |
| 2017/0287839 | A1 | 10/2017 | Lee et al. |
| 2018/0083626 | A1 | 3/2018 | Tang |
| 2018/0102470 | A1 | 4/2018 | Das et al. |
| 2018/0102776 | A1 | 4/2018 | Chandrasekar et al. |
| 2018/0350715 | A1 | 12/2018 | Sinning et al. |
| 2018/0366442 | A1* | 12/2018 | Gu ............ H01L 25/0657 |
| 2020/0075521 | A1* | 3/2020 | Elsherbini ........... H03M 9/00 |

* cited by examiner

US 12,412,799 B2

INTEGRATED CIRCUIT PACKAGE AND METHOD

PRIORITY CLAIM AND CROSS-REFERENCE

This application is a divisional of U.S. patent application Ser. No. 16/882,132, filed May 22, 2020, entitled "Integrated Circuit Package and Method," which claims the benefit of U.S. Provisional Application No. 62/916,954, filed on Oct. 18, 2019, which applications are hereby incorporated herein by reference.

BACKGROUND

As semiconductor technologies continue to evolve, integrated circuit dies are becoming increasingly smaller. Further, more functions are being integrated into the dies. Accordingly, the numbers of input/output (I/O) pads needed by dies has increased while the area available for the I/O pads has decreased. The density of the I/O pads has risen quickly over time, increasing the difficulty of die packaging. Some applications call for greater parallel processing capabilities of integrated circuit dies. Packaging technologies may be used to integrate of multiple dies, allowing a greater degree of parallel processing capabilities.

In some packaging technologies, integrated circuit dies are singulated from wafers before they are packaged. An advantageous feature of this packaging technology is the possibility of forming fan-out packages, which allow the I/O pads on a die to be redistributed to a greater area. The number of I/O pads on the surfaces of the dies may thus be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
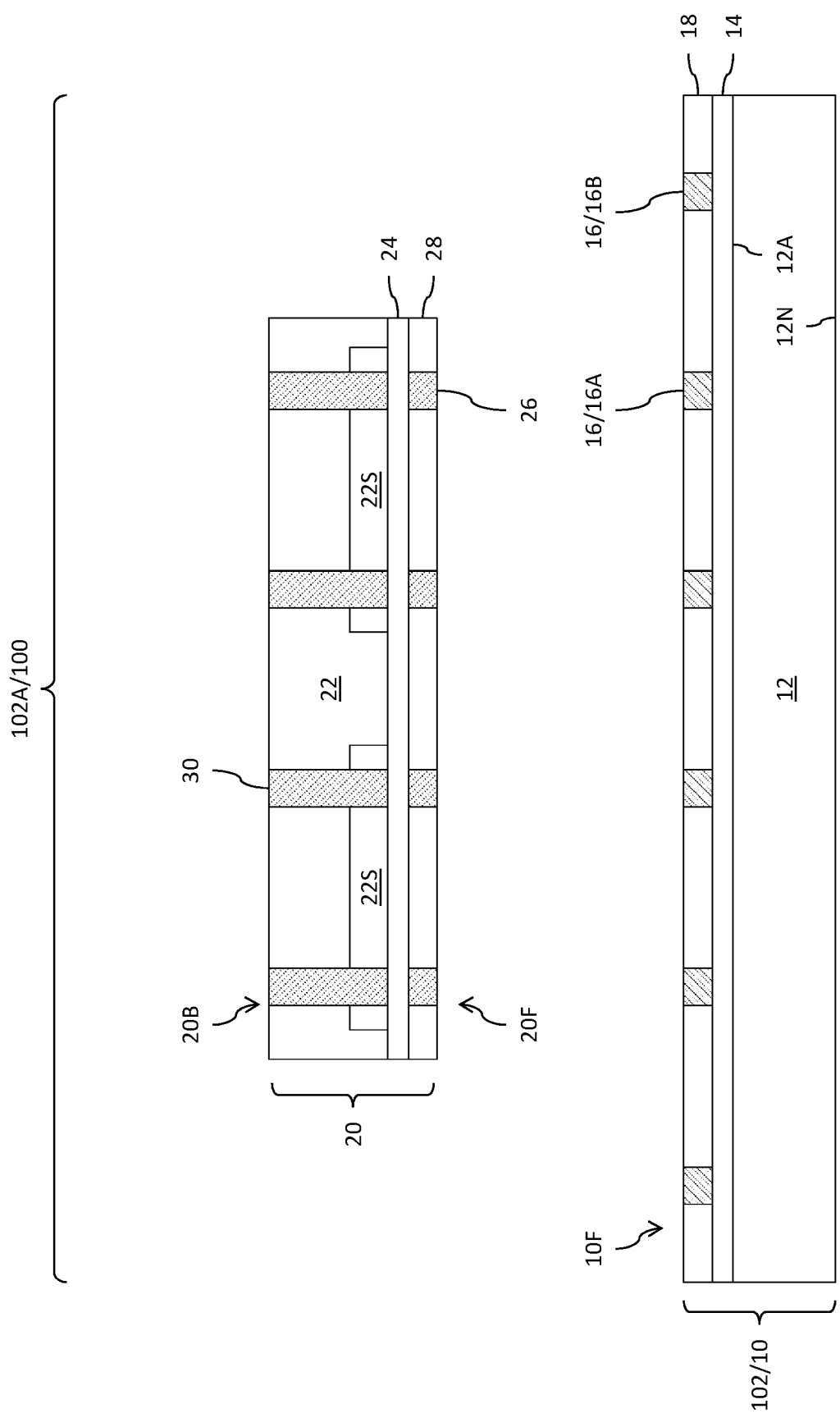
FIGS. 1, 2, and 3 are cross-sectional views of intermediate steps during a process for forming an integrated circuit package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, integrated circuit packages are formed having processor devices and power gating devices that are separate semiconductor devices. The power gating devices are formed with larger active devices than the processor devices, and include power semiconductor devices providing power gating to the processor devices. Switch transistors of a large technology node may thus be used for power delivery, allowing a reduction in the power consumption of the resulting integrated circuit packages.

Figure 2:
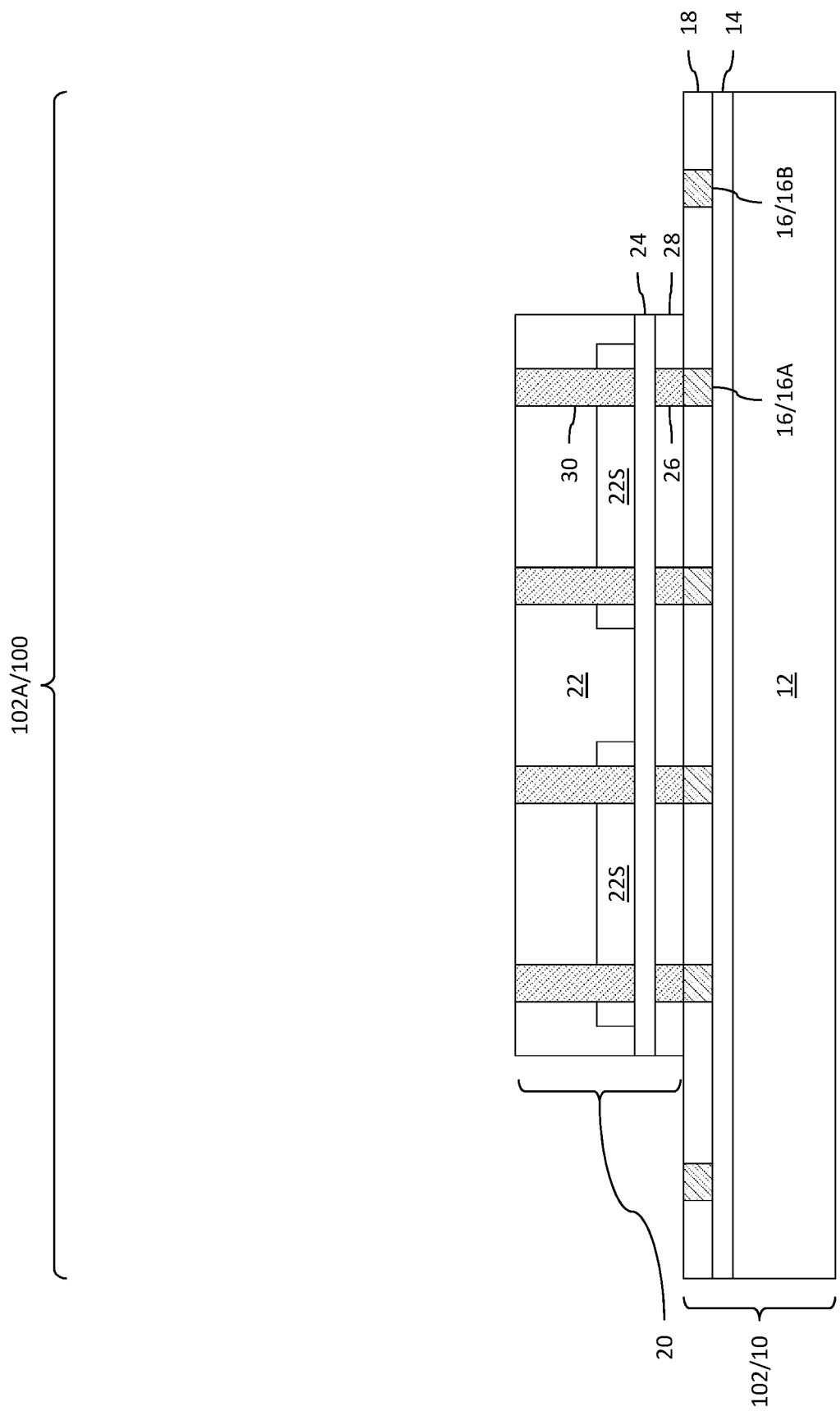
Figure 3:
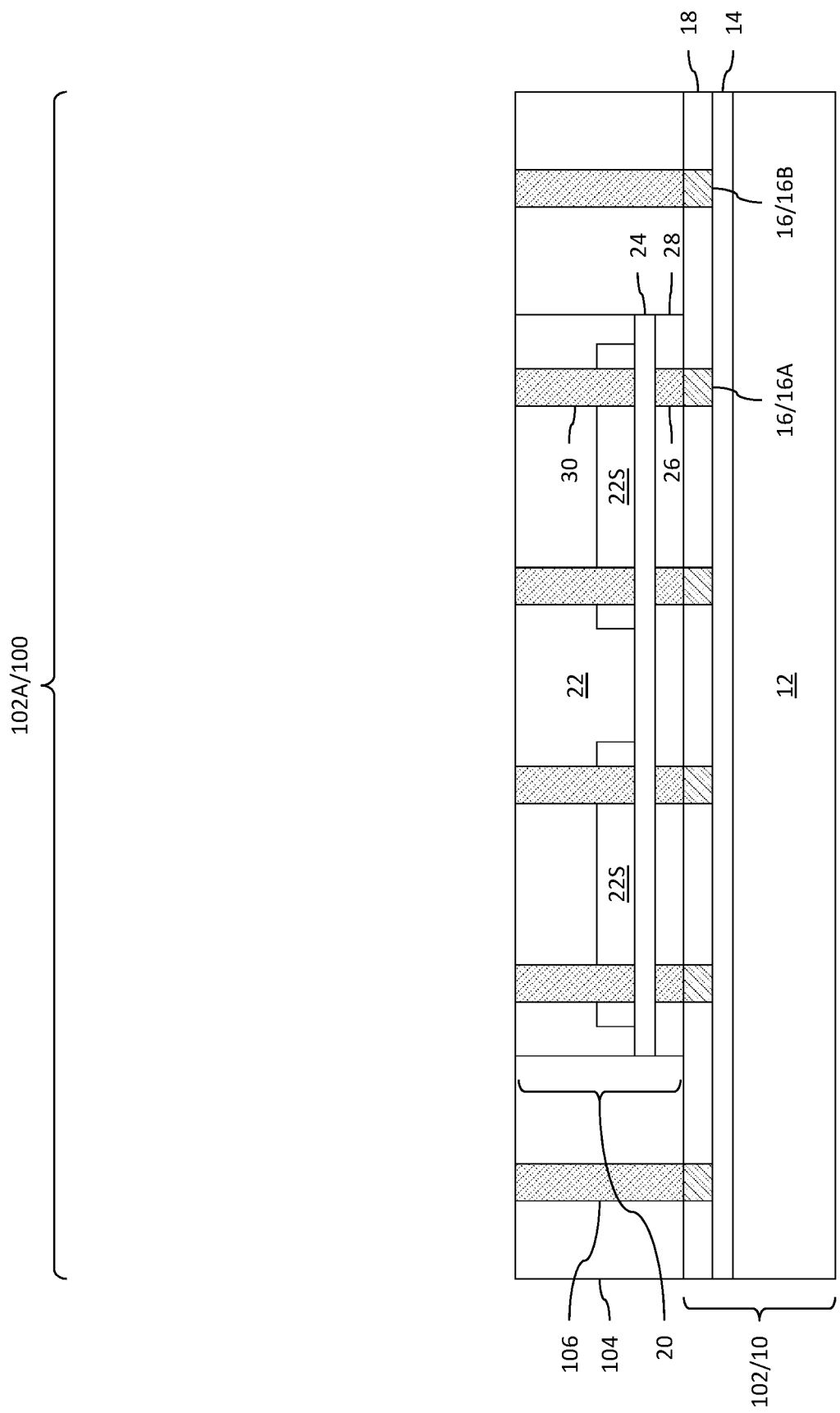

FIGS. 1, 2, and 3 are cross-sectional views of intermediate steps during a process for forming an integrated circuit package 100, in accordance with some embodiments. The integrated circuit package 100 is formed by stacking semiconductor devices on a wafer 102. Stacking of devices in one device region 102A of the wafer 102 is illustrated, but it should be appreciated that the wafer 102 may have any number of device regions, and semiconductor devices may be stacked to form an integrated circuit package in each device region. The semiconductor devices can be bare integrated circuit dies or packaged dies. In the embodiment illustrated, each semiconductor device is a bare integrated circuit die. In other embodiments, one or more of the illustrated semiconductor devices can be packaged dies that are encapsulated.

In FIG. 1, the wafer 102 is obtained. The wafer 102 comprises a processor device 10 in the device region 102A. The processor device 10 will be singulated in subsequent processing to be included in the integrated circuit package 100. The processor device 10 can be any acceptable processor or logic device, such as a central processing unit (CPU), graphics processing unit (GPU), arithmetic logic unit (ALU), system-on-a-chip (SoC), application processor (AP), image signal processor (ISP), digital signal processing (DSP), field programmable gate array (FPGA), microcontroller, artificial intelligence (AI) accelerator, or the like. As discussed further below, the processor device 10 is formed without power gating features.

The processor device 10 may be processed according to applicable manufacturing processes to form integrated circuits. For example, the processor device 10 includes a semiconductor substrate 12, such as silicon, doped or undoped, or an active layer of a semiconductor-on-insulator (SOI) substrate. The semiconductor substrate 12 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 12 has an active surface 12A and an inactive surface 12N.

Devices may be formed at the active surface 12A of the semiconductor substrate 12. The devices may be active devices (e.g., transistors, diodes, etc.), capacitors, resistors, etc. The inactive surface 12N may be free from devices. An inter-layer dielectric (ILD) is over the active surface 12A of the semiconductor substrate 12. The ILD surrounds and may cover the devices. The ILD may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

An interconnect structure 14 is over the active surface 12A of the semiconductor substrate 12. The interconnect structure 14 interconnects the devices at the active surface 12A of the semiconductor substrate 12 to form an integrated circuit. The interconnect structure 14 may be formed by, for example, metallization patterns in dielectric layers. The metallization patterns include metal lines and vias formed in one or more dielectric layers. The metallization patterns of the interconnect structure 14 are electrically coupled to the devices at the active surface 12A of the semiconductor substrate 12.

Die connectors 16 are at a front side 10F of the processor device 10. The die connectors 16 may be conductive pillars, pads, or the like, to which external connections are made. The die connectors 16 are in and/or on the interconnect structure 14. The die connectors 16 can be formed of a metal, such as copper, aluminum, or the like, and can be formed by, for example, plating, or the like.

A dielectric layer 18 is at the front side 10F the processor device 10. The dielectric layer 18 is in and/or on the interconnect structure 14. The dielectric layer 18 laterally encapsulates the die connectors 16, and the dielectric layer 18 is laterally coterminous with sidewalls of the processor device 10. Initially, the dielectric layer 18 may bury the die connectors 16, such that the topmost surface of the dielectric layer 18 is above the topmost surfaces of the die connectors 16. The dielectric layer 18 may be a polymer such as polybenzoxazole (PBO), polyimide, a benzocyclobuten (BCB) based polymer, or the like; a nitride such as silicon nitride or the like; an oxide such as silicon oxide, PSG, BSG, BPSG, or the like; the like, or a combination thereof. The dielectric layer 18 may be formed, for example, by spin coating, lamination, chemical vapor deposition (CVD), or the like. After formation, the die connectors 16 and dielectric layer 18 can be planarized using, e.g., a chemical-mechanical polish (CMP) process, an etch back process, the like, or combinations thereof. After planarization, surfaces of the die connectors 16 and dielectric layer 18 are planar and are exposed at the front side 10F of the processor device 10.

The processor device 10 includes a plurality of circuit blocks. A circuit block is a logical block or unit of circuits of the processor device 10. In other words, a circuit block comprises a subset of the circuits of the processor device 10, where the circuits in a circuit block are all related to the same domain. Examples of circuit blocks include arithmetic circuit blocks, memory circuit blocks, DSP circuit blocks, and the like.

A power gating device 20 is also obtained. The power gating device 20 is part of the power delivery network for the processor device 10. Specifically, the power gating device 20 provides power gating to some or all of the circuit blocks of the processor device 10. The power gating device 20 is operable at runtime to receive control signals and turn the circuit blocks of the processor device 10 on or off responsive to the control signals. For example, the circuit blocks of the processor device 10 can be turned on when needed and can be turned off when not in use, thus reducing the leakage power of the unused circuit blocks. The power consumption of the processor device 10 may thus be reduced. Further, forming the processor device 10 without power gating features allows for a reduction in the area of the processor device 10. For example, moving the power gating features to a dedicated power gating device 20 allows the area of the processor device 10 to be reduced by to 20%.

The power gating device 20 may be processed according to applicable manufacturing processes to form integrated circuits. For example, the power gating device 20 includes a semiconductor substrate 22, an interconnect structure 24, die connectors 26, and a dielectric layer 28 which, respectively, can be similar to the semiconductor substrate 12, interconnect structure 14, die connectors 16, and dielectric layer 18. The die connectors 26 and dielectric layer 28 are exposed at a front side 20F of the power gating device 20. The power gating device 20 further includes conductive vias 30, which are formed extending into the semiconductor substrate 22. The conductive vias 30 are electrically coupled to metallization patterns of the interconnect structure 24.

As an example to form the conductive vias 30, recesses can be formed in the interconnect structure 24 and/or semiconductor substrate 22 by, for example, etching, milling, laser techniques, a combination thereof, and/or the like. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed from an oxide, a nitride, or an oxynitride, such as titanium nitride, titanium oxynitride, tantalum nitride, tantalum oxynitride, tungsten nitride, a combination thereof, and/or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the surface of the interconnect structure 24 and/or semiconductor substrate 22 by, for example, a CMP. Remaining portions of the barrier layer and conductive material form the conductive vias 30.

In the embodiment illustrated, the conductive vias 30 are not yet exposed at a back side 20B of the power gating device 20. Rather, the conductive vias 30 are buried in the semiconductor substrate 22. As discussed further below, the conductive vias 30 will be exposed at the back side 20B of the power gating device 20 through a planarization process in subsequent processing. After exposure, the conductive vias 30 can be referred to as through-substrate vias or through-silicon vias (TSVs).

The power gating device 20 includes power semiconductor devices (e.g., semiconductor devices used for power electronics) to provide power gating to the processor device 10. Specifically, the power gating device 20 can include switch transistors, power gating controllers, and a power gating fabric. The power semiconductor devices of the power gating device 20 can be bipolar devices, such as insulated-gate bipolar transistor (IGBT) devices or the like, or can be power MOSFET devices, such as complementary metal-oxide-semiconductor (CMOS) devices, double diffused metal-oxide-semiconductor (DMOS) devices, or the like. In some embodiments, the processor device 10 and power gating device 20 are formed by different semiconductor process technologies, and have devices (e.g., active devices) of different pitches. For example, the processor device 10 can comprise CMOS devices, and the power gating device 20 can comprise IGBT devices or DMOS devices. The active surface of the semiconductor substrate 22 includes switching device regions 22S comprising switch transistors. The switch transistors of the switching device regions 22S are connected to power supply source ($V_{DD}$) lines (discussed further below) and, when activated, electrically couple the $V_{DD}$ lines to the circuit blocks of the processor device 10. Likewise, the metallization patterns of the interconnect structure 24 can form some or all of the power gating fabric. For example, the interconnect structure 24 can include metal lines and vias that are used to route the $V_{DD}$ lines from the switch transistors to the circuit blocks of the processor device 10.

The metallization patterns of the interconnect structure 24 can form some, all, or none of the power gating fabric. In some embodiments, the interconnect structure 24 of the power gating device 20 comprises all of the power gating fabric. In some embodiments, the interconnect structure 24 of the power gating device 20 comprises some of the power gating fabric, and the interconnect structure 14 of the processor device 10 comprises some of the power gating fabric. In some embodiments, the interconnect structure 24 of the power gating device 20 does not comprise the power gating fabric, and the interconnect structure 14 of the processor device 10 comprises all of the power gating fabric.

The power delivery performance of the switch transistors can significantly impact the overall power delivery performance of the power gating device 20. Specifically, switch transistors of a large technology node can accommodate greater rush currents and have a smaller voltage drop (e.g., IR drop) when the circuit blocks of the processor device 10 are turned on. Similarly, switch transistors of a large technology node can have a greater threshold voltage, which allows the switch transistors to have less power leakage. In accordance with some embodiment, the processor device 10 have active devices of a smaller technology node (e.g., smaller device pitch or spacing), which are unsuitable for switch transistors but are suitable for logic devices, and the power gating device 20 have active devices of a larger technology node (e.g., larger device pitch or spacing), which are unsuitable for logic devices but are suitable for switch transistors. For example, the processor device 10 can have active devices (e.g., forming circuit blocks) of a technology node in the range of about 2 nm to about 28 nm, and the power gating device 20 can have active devices (e.g., power semiconductor devices) of a technology node in the range of about 3 nm to about 90 nm. Forming the power gating device 20 with larger active devices than the processor device 10 allows the processor device 10 to be scaled down to smaller technology nodes that provide improved logic device performance, while still allowing the power gating device 20 to provide sufficient power delivery performance. Further, forming the power gating device 20 with larger active devices allows the manufacturing costs of the power gating device 20 to be reduced.

In FIG. 2, the power gating device 20 is bonded to the processor device 10 (e.g., the wafer 102). The processor device 10 and power gating device 20 are directly bonded in a face-to-face manner by hybrid bonding, such that the front side 10F of the processor device 10 is bonded to the front side 20F of the power gating device 20. Specifically, the dielectric layer 18 of the processor device 10 is bonded to the dielectric layer 28 of the power gating device 20 through dielectric-to-dielectric bonding, without using any adhesive material (e.g., die attach film), and a subset of the die connectors 16A of the processor device 10 are bonded to the die connectors 26 of the power gating device 20 through metal-to-metal bonding, without using any eutectic material (e.g., solder). The bonding may include a pre-bonding and an annealing. During the pre-bonding, a small pressing force is applied to press the power gating device 20 against the processor device 10 (e.g., the wafer 102). The pre-bonding is performed at a low temperature, and after the pre-bonding, the dielectric layers 18 and 28 are bonded to each other. The bonding strength is then improved in a subsequent annealing step, in which the dielectric layers 18 and 28 are annealed at a high temperature. After the annealing, bonds, such as fusions bonds, are formed bonding the dielectric layers 18 and 28. For example, the bonds can be covalent bonds between the material of the dielectric layer 18 and the material of the dielectric layer 28. The die connectors 16A and 26 are connected to each other with a one-to-one correspondence. The die connectors 16A and 26 may be in physical contact after the pre-bonding, or may expand to be brought into physical contact during the annealing. Further, during the annealing, the material of the die connectors 16A and 26 (e.g., copper) intermingles, so that metal-to-metal bonds are also formed. Hence, the resulting bonds between the processor device 10 and power gating device 20 are hybrid bonds that include both dielectric-to-dielectric bonds and metal-to-metal bonds.

After hybrid bonding, the processor device 10 is electrically coupled to the power gating device 20 by direct bonds, over which control signaling and power/ground signaling is performed. Specifically, the processor device 10 may send control signals to the power gating device 20 over the direct bonds, and may receive power/ground signals from the power gating device 20 over the direct bonds. The latency of signaling and the interconnection bandwidth between the processor device 10 and the power gating device 20 may be improved by the use of direct bonds. Further, the impedance and thus power consumption of the interconnections may also be reduced. As noted above, the metallization patterns of the interconnect structure 24 can form some or all of the power gating fabric. In such embodiments, the power gating fabric is thus connected to the processor device 10 by direct bonds, which may allow for simpler routing than other types of interconnections. In the embodiment shown, one power gating device 20 is bonded to the processor device 10. In another embodiment, multiple power gating devices 20 are bonded to the processor device 10.

In FIG. 3, a dielectric layer 104 is formed surrounding the power gating device 20. The dielectric layer 104 can be formed after placement of the power gating device 20 but before annealing to complete the hybrid bonding, or can be formed after annealing. The dielectric layer 104 fills gaps between the power gating device 20 and other devices in adjacent device regions (not shown) of the wafer 102, thus protecting the semiconductor devices. The dielectric layer 104 may be an oxide such as silicon oxide, PSG, BSG, BPSG, or the like; a nitride such as silicon nitride or the like; a polymer such as PBO, polyimide, a BCB-based polymer, or the like; an encapsulant such as a molding compound, epoxy, or the like; the like, or a combination thereof. In some embodiments, the dielectric layer 104 is an oxide such as silicon oxide. In some embodiments, the dielectric layer 104 is deposited using a CVD process or the like.

Conductive vias 106 are then formed to extend through the dielectric layer 104. As an example to form the conductive vias 106, openings are patterned in the dielectric layer 104. The patterning may be by an acceptable process, such as by exposing the dielectric layer 104 to light when the dielectric layer 104 is a photo-sensitive material, or by etching the dielectric layer 104 using, for example, an anisotropic etch. The openings expose a subset of the die connectors 16B of the processor device 10. A seed layer is formed on the dielectric layer 104 and on portions of the die connectors 16B exposed by the openings. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A conductive material is formed on the seed layer. The conductive material may be formed by plating, such as electroplating or electroless plating, or the like. The conductive material may comprise a metal, such as copper, titanium, tungsten, aluminum, or the like. Excess portions of the seed layer and conductive material are then removed, with the excess portions being portions overlying the dielectric layer 104. The removal may be by a planarization process. The planarization process is performed on the seed layer, conductive material, dielectric layer 104, and power gating device 20. The removal simultaneously removes excess portions of the seed layer and conductive material and exposes the conductive vias 30. The planarization process may be, for example, a CMP process, a grinding process, an etch back process, the like, or combinations thereof. The remaining portions of the seed layer and conductive material in the openings form the conductive vias 106. Top surfaces of the dielectric layer 104, conductive vias 106, semiconductor substrate 22, and conductive vias 30 are planar after the planarization process.

Figure 4:
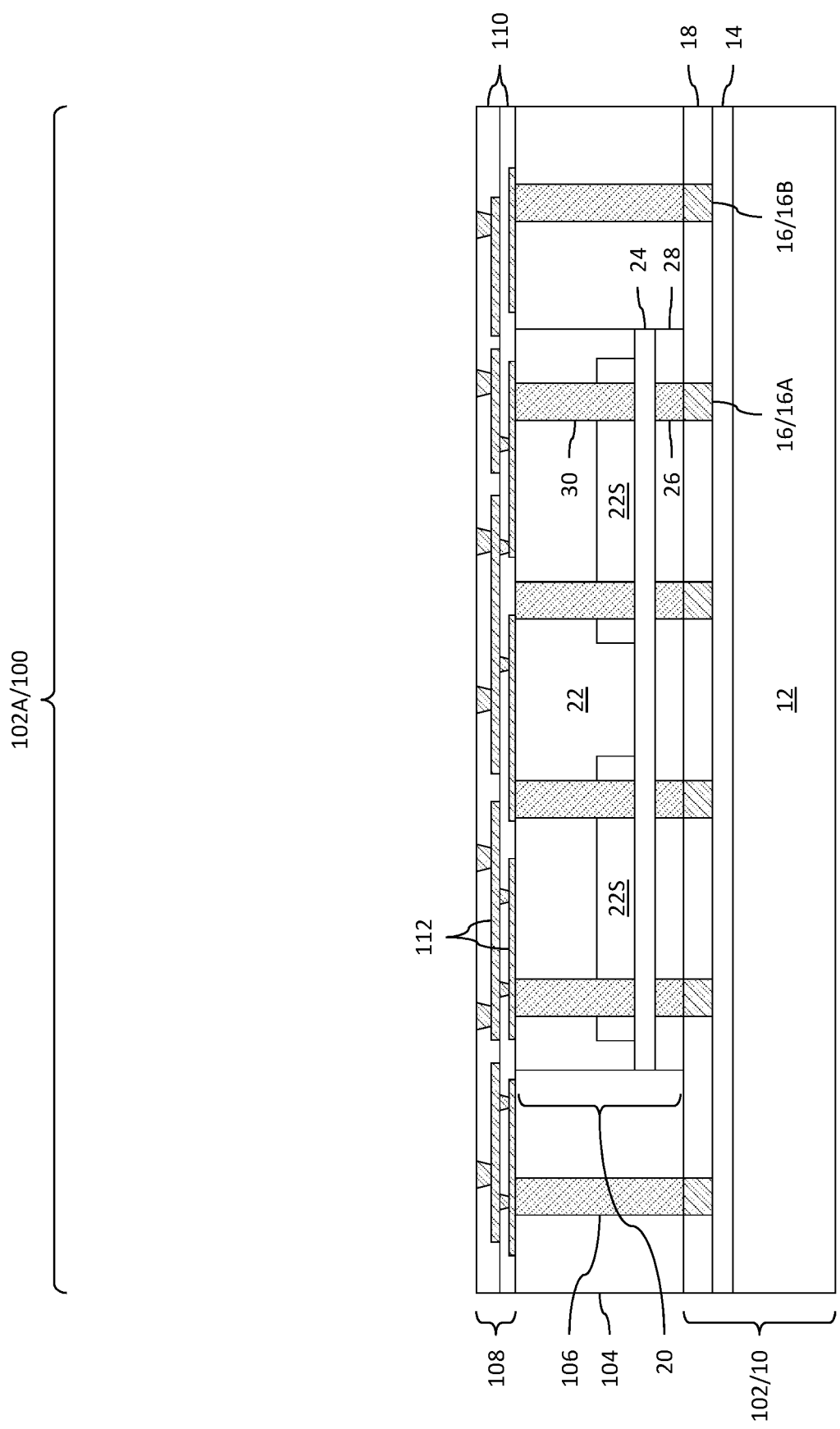
FIGS. 4, 5, and 6 are cross-sectional views of intermediate steps during a process for forming a system implementing an integrated circuit package, in accordance with some embodiments.
Figure 5:
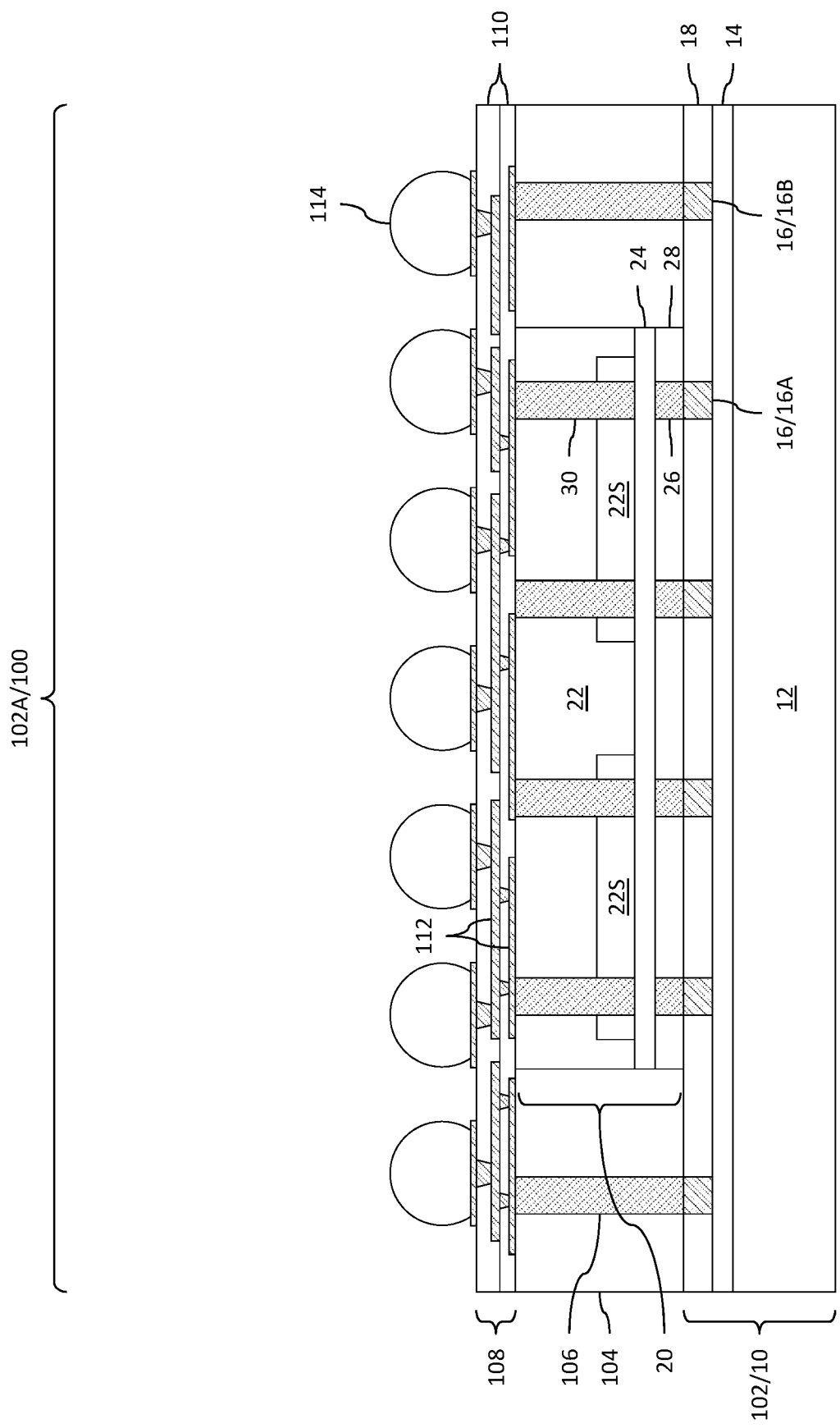
Figure 6:
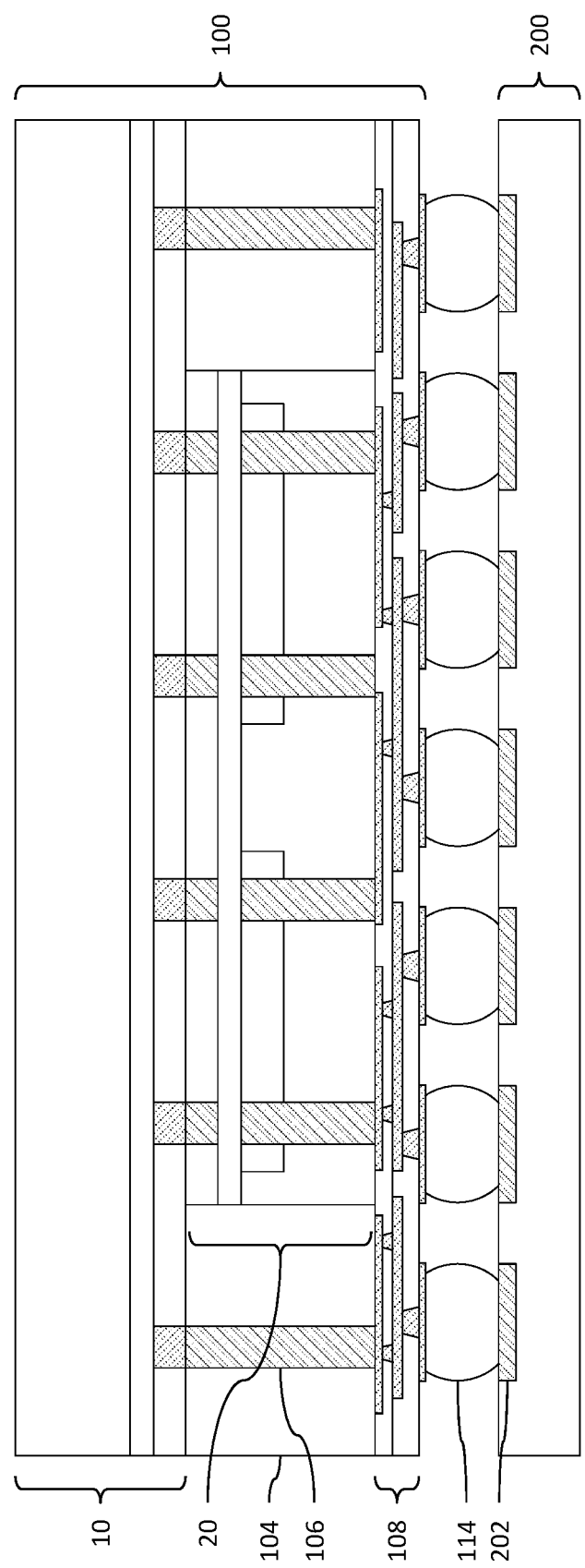

FIGS. 4, 5, and 6 are cross-sectional views of intermediate steps during a process for forming a system implementing the integrated circuit package 100, in accordance with some embodiments. In this embodiment, the integrated circuit package 100 is further processed to include a redistribution structure, and is directly mounted to a package substrate.

In FIG. 4, a redistribution structure 108 is formed on the dielectric layer 104, conductive vias 106, and power gating device 20. The redistribution structure 108 includes dielectric layers 110 and metallization patterns 112 (sometimes referred to as redistribution layers or redistribution lines) among the dielectric layers 110. For example, the redistribution structure 108 may include a plurality of metallization patterns 112 separated from each other by respective dielectric layers 110. The metallization patterns 112 of the redistribution structure 108 are connected to the conductive vias 106 and the power gating device 20 (e.g., to the conductive vias 30).

In some embodiments, the dielectric layers 110 are formed of a polymer, which may be a photo-sensitive material such as PBO, polyimide, a BCB-based polymer, or the like, may be patterned using a lithography mask. In other embodiments, the dielectric layers 110 are formed of a nitride such as silicon nitride; an oxide such as silicon oxide, PSG, BSG, BPSG; or the like. The dielectric layers 110 may be formed by spin coating, lamination, CVD, the like, or a combination thereof. After each dielectric layer 110 is formed, it is then patterned to expose underlying conductive features, such as portions of the underlying metallization patterns 112. The patterning may be by an acceptable process, such as by exposing the dielectrics layers to light when the dielectric layers 110 are a photo-sensitive material, or by etching using, for example, an anisotropic etch. If the dielectric layers 110 are photo-sensitive materials, the dielectric layers 110 can be developed after the exposure.

The metallization patterns 112 each include conductive vias and/or conductive lines. The conductive vias extend through the dielectric layers 110, and the conductive lines extend along the dielectric layers 110. As an example to form a metallization pattern, a seed layer (not illustrated) is formed over the respective underlying features. For example, the seed layer can be formed on the dielectric layer 104, conductive vias 106, semiconductor substrate 22, and conductive vias 30 when the bottommost level of the redistribution structure 108 is formed, or the seed layer can be formed on a respective dielectric layer 110 and in the openings through the respective dielectric layer 110 when the intermediate/topmost levels of the redistribution structure 108 are formed. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD or the like. A photoresist is then formed and patterned on the seed layer. The photoresist may be formed by spin coating or the like and may be exposed to light for patterning. The pattern of the photoresist corresponds to the metallization pattern. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal or a metal alloy, such as copper, titanium, tungsten, aluminum, the like, or combinations thereof. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern for one level of the redistribution structure 108.

The redistribution structure 108 is illustrated as an example. More or fewer dielectric layers 110 and metallization patterns 112 than illustrated may be formed in the redistribution structure 108 by repeating or omitting the steps described above.

The metallization patterns 112 of the redistribution structure 108 include power supply source ($V_{DD}$) lines and power supply ground ($V_{SS}$) lines. The $V_{DD}$ and $V_{SS}$ lines are connected to the conductive vias 30 and 106. The switching device regions 22S of the power gating device 20 are thus electrically coupled to the $V_{DD}$ and $V_{SS}$ lines by the conductive vias 30. A first subset of the circuit blocks of the processor device 10 are electrically coupled to the $V_{DD}$ and $V_{SS}$ lines through the power gating device 20. The first subset of the circuit blocks can thus be turned on and off by the power gating device 20. A second subset of the circuit blocks of the processor device 10 are electrically coupled to the $V_{DD}$ and $V_{SS}$ lines through the conductive vias 106, bypassing the power gating device 20. The second subset of the circuit blocks are thus permanently electrically coupled to power and ground. Circuit blocks that are permanently electrically coupled to power and ground are always turned on, and are not power gated.

The metallization patterns 112 of the redistribution structure 108 also include data signal lines, which are electrically coupled to the processor device 10 by the conductive vias 106. For example, some of the conductive vias 106 couple input/output (I/O) connections of the processor device 10 to the redistribution structure 108. The processor device 10 may thus be coupled to external devices.

In FIG. 5, conductive connectors 114 are formed connected to the metallization patterns 112 of the redistribution structure 108. The top dielectric layer 110 of the redistribution structure 108 may be patterned to expose portions of the underlying metallization patterns 112. In some embodiments, under bump metallurgies (UBMs) may be formed in the openings. The conductive connectors 114 are formed on the UBMs. The conductive connectors 114 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 114 may be formed of a metal or metal alloy, such as solder, copper, aluminum, gold, nickel, silver, palladium, tin, the like, or a combination thereof. In some embodiments, the conductive connectors 114 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 114 are metal pillars (such as a copper pillar) formed by a sputtering, printing, electro plating, electroless plating, CVD, or the like. The metal pillars may be solder free and have substantially vertical sidewalls.

In FIG. 6, a singulation process is performed by sawing along scribe line regions, e.g., around the device region 102A. The singulation process includes sawing the redistribution structure 108, dielectric layer 104, and wafer 102. The singulation process separates the device region 102A (comprising the processor device 10) from adjacent device regions (not illustrated) of the wafer 102 to form an integrated circuit package 100 comprising the processor device 10. As noted above, the power gating device 20 is directly bonded to the processor device 10 in a face-to-face manner, without the use of solder. The resulting integrated circuit package 100 is thus free from solder. After singulation, the redistribution structure 108 (e.g., the dielectric layers 110), the dielectric layer 104, and the processor device 10 are laterally coterminous.

The integrated circuit package 100 is then flipped and attached to a package substrate 200 using the conductive connectors 114. The package substrate 200 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 200 may be a SOI substrate. Generally, an SOI substrate includes a layer of a semiconductor material such as epitaxial silicon, germanium, silicon germanium, SOI, SGOI, or combinations thereof. The package substrate 200 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for package substrate 200.

The package substrate 200 may include active and passive devices (not illustrated). Devices such as transistors, capacitors, resistors, combinations of these, and the like may be used to generate the structural and functional requirements of the design for the system. The devices may be formed using any suitable methods.

The package substrate 200 may also include metallization layers and vias (not illustrated) and bond pads 202 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 200 is substantially free of active and passive devices.

The conductive connectors 114 are reflowed to attach the UBMs of the redistribution structure 108 to the bond pads 202. The conductive connectors 114 connect the package substrate 200, including metallization layers in the package substrate 200, to the integrated circuit package 100, including metallization patterns 112 of the redistribution structure 108. In some embodiments, passive devices (e.g., surface mount devices (SMDs), not illustrated) may be attached to the integrated circuit package 100 (e.g., bonded to the bond pads 202) prior to mounting on the package substrate 200. In such embodiments, the passive devices may be bonded to a same surface of the integrated circuit package 100 as the conductive connectors 114. In some embodiments, passive devices (e.g., SMDs, not illustrated) may be attached to the package substrate 200, e.g., to the bond pads 202.

The conductive connectors 114 may have an epoxy flux (not illustrated) formed thereon before they are reflowed with at least some of the epoxy portion of the epoxy flux remaining after the integrated circuit package 100 is attached to the package substrate 200. This remaining epoxy portion may act as an underfill to reduce stress and protect the joints resulting from the reflowing the conductive connectors 114. In some embodiments, an underfill (not illustrated) may be formed between the integrated circuit package 100 and the package substrate 200, surrounding the conductive connectors 114. The underfill may be formed by a capillary flow process after the integrated circuit package 100 is attached or may be formed by a suitable deposition method before the integrated circuit package 100 is attached.

Figure 7:
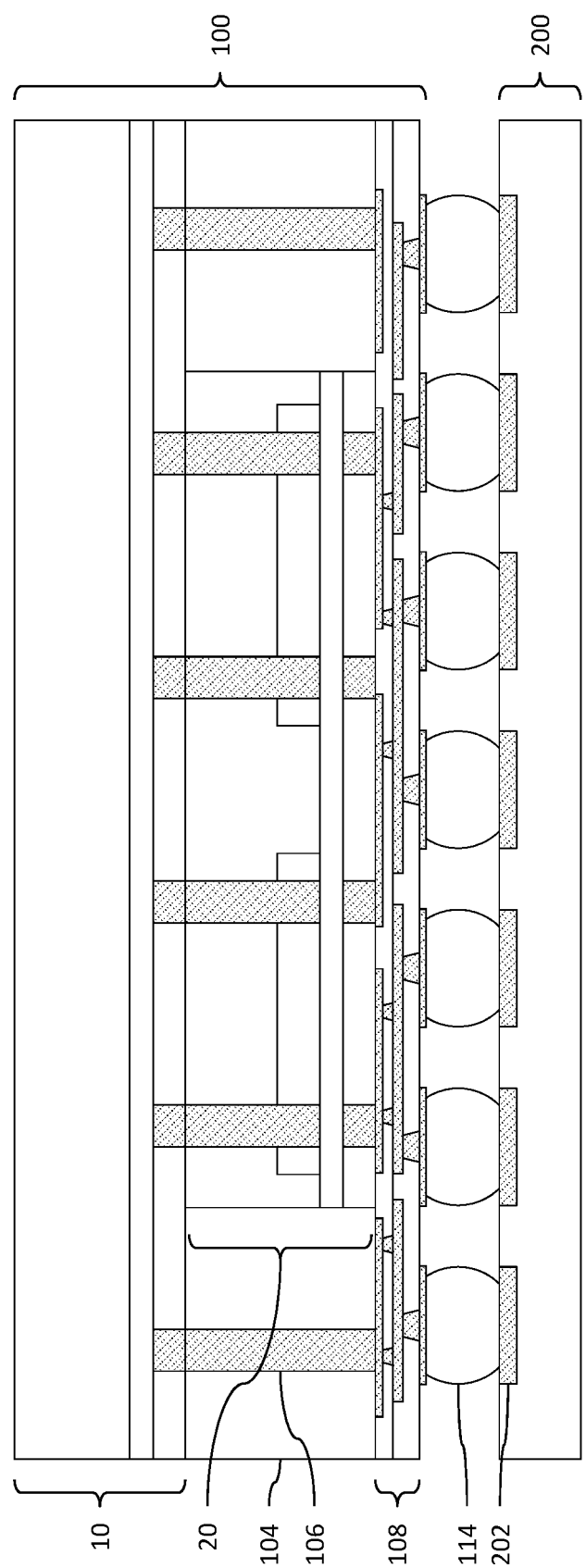
FIG. 7 is a cross-sectional view of an integrated circuit package and a system implementing the integrated circuit package, in accordance with some other embodiments.

FIG. 7 is a cross-sectional view of an integrated circuit package 100 and a system implementing the integrated circuit package 100, in accordance with some other embodiments. This embodiment is similar to the embodiment described with respect to FIG. 6, except the processor device 10 and power gating device 20 are directly bonded in a face-to-back manner. The metallization patterns 112 of the redistribution structure 108 (e.g., $V_{DD}$ and $V_{SS}$ lines) are thus connected to the die connectors 26, and are electrically coupled to the processor device 10 by the conductive vias 30.

The processor device 10 and power gating device 20 are directly bonded in a face-to-back manner by hybrid bonding, such that the front side 10F of the processor device 10 is bonded to the back side 20B of the power gating device 20. Specifically, the dielectric layer 18 of the processor device 10 is bonded to the semiconductor substrate 22 of the power gating device 20 through dielectric-to-dielectric bonding, without using any adhesive material (e.g., die attach film), and a subset of the die connectors 16A of the processor device 10 are bonded to the conductive vias 30 of the power gating device 20 through metal-to-metal bonding, without using any eutectic material (e.g., solder). The bonding may include a pre-bonding and an annealing. During the pre-bonding, a small pressing force is applied to press the power gating device 20 against the processor device 10. The pre-bonding is performed at a low temperature, and after the pre-bonding, the dielectric layer 18 and semiconductor substrate 22 are bonded to each other. In some embodiments, an oxide, such as a native oxide, a thermal oxide, or the like is formed at the back side 20B of the power gating device 20, such as on the semiconductor substrate 22, and is used for the bonding. The bonding strength is then improved in a subsequent annealing step, in which the dielectric layer 18 and semiconductor substrate 22 are annealed at a high temperature. After the annealing, bonds, such as fusions bonds, are formed bonding the dielectric layer 18 and semiconductor substrate 22. For example, the bonds can be covalent bonds between the material of the dielectric layer 18 and the material of the semiconductor substrate 22. The die connectors 16A and conductive vias 30 are connected to each other with a one-to-one correspondence. The die connectors 16A and conductive vias 30 may be in physical contact after the pre-bonding, or may expand to be brought into physical contact during the annealing. Further, during the annealing, the material of the die connectors 16A and conductive vias 30 (e.g., copper) intermingles, so that metal-to-metal bonds are also formed. Hence, the resulting bonds between the processor device 10 and power gating device 20 are hybrid bonds that include both dielectric-to-dielectric bonds and metal-to-metal bonds.

FIGS. 8, 9, 10, 11, 12, 13, 14, 15, and 16 are cross-sectional views of intermediate steps during a process for forming a system implementing the integrated circuit package 100, in accordance with some other embodiments. In this embodiment, the integrated circuit package 100 is singulated and included in a package component. Packaging of devices in one package region 302A is illustrated, but it should be appreciated that any number of package regions may be simultaneously formed. The package region 302A will be singulated in subsequent processing. The singulated package component may be a fan-out package, such as an integrated fan-out (InFO) package. The fan-out package is then mounted to a package substrate.

Figure 8:
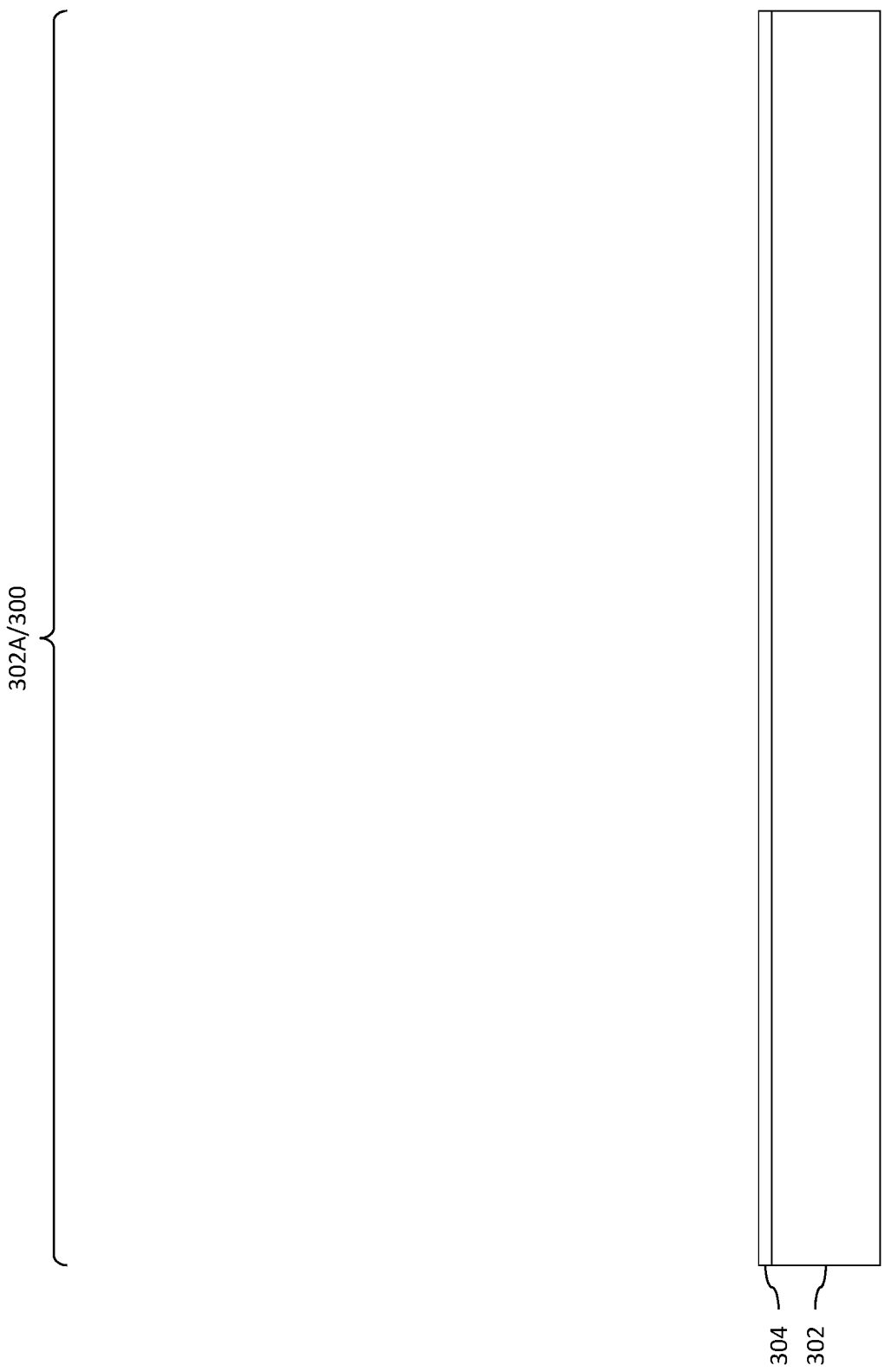
FIGS. 8, 9, 10, 11, 12, 13, 14, 15, and 16 are cross-sectional views of intermediate steps during a process for forming a system implementing an integrated circuit package, in accordance with some embodiments.

In FIG. 8, a carrier substrate 302 is provided, and a release layer 304 is formed on the carrier substrate 302. The carrier substrate 302 may be a glass carrier substrate, a ceramic carrier substrate, or the like. The carrier substrate 302 may be a wafer, such that multiple packages can be formed on the carrier substrate 302 simultaneously. The release layer 304 may be formed of a polymer-based material, which may be removed along with the carrier substrate 302 from the overlying structures that will be formed in subsequent steps. In some embodiments, the release layer 304 is an epoxy-based thermal-release material, which loses its adhesive property when heated, such as a light-to-heat-conversion (LTHC) release coating. In other embodiments, the release layer 304 may be an ultra-violet (UV) glue, which loses its adhesive property when exposed to UV lights. The release layer 304 may be dispensed as a liquid and cured, may be a laminate film laminated onto the carrier substrate 302, or may be the like. The top surface of the release layer 304 may be leveled and may have a high degree of planarity.

Figure 9:
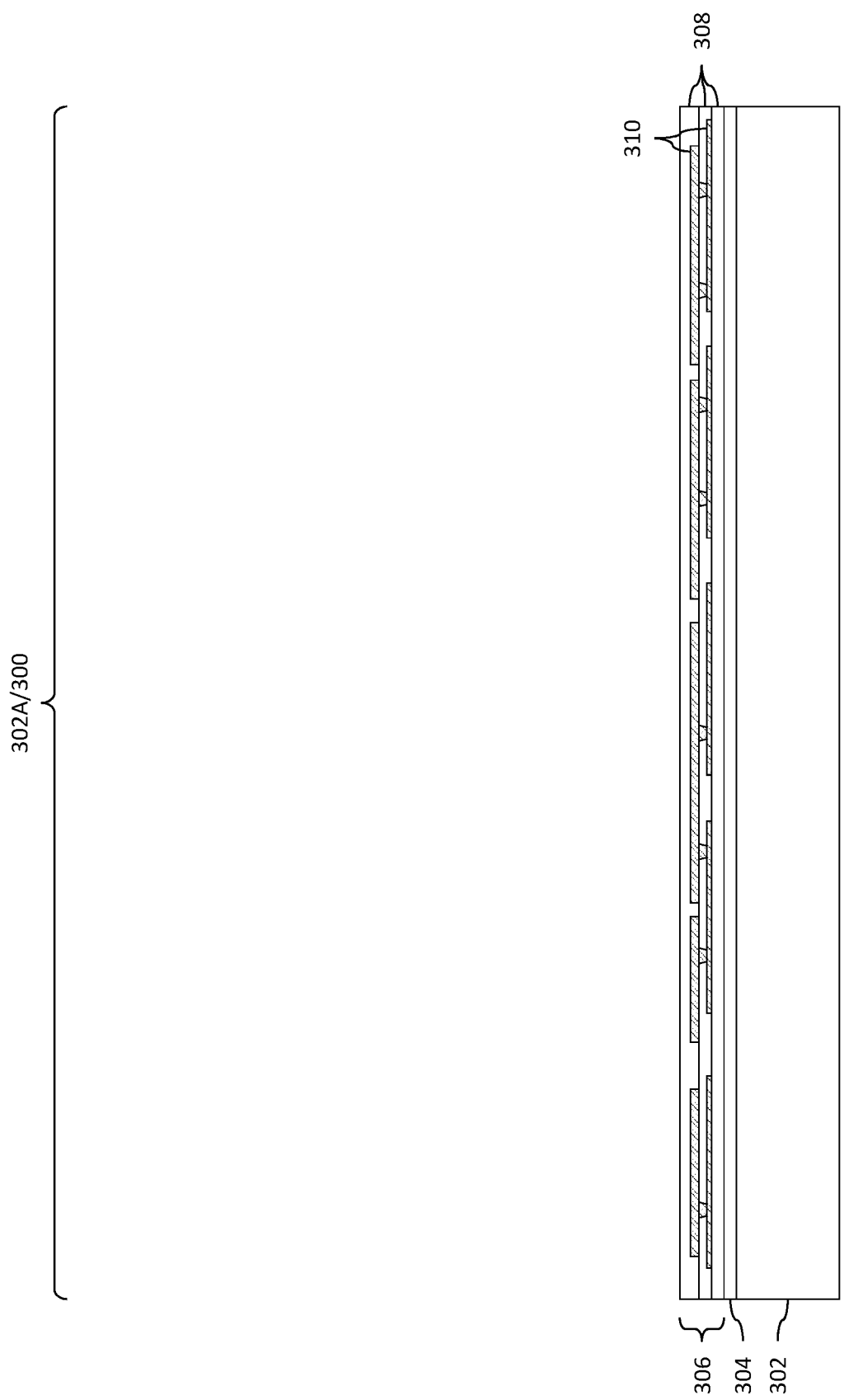

In FIG. 9, a redistribution structure 306 may be formed on the release layer 304. The redistribution structure 306 can be formed in a similar manner and of similar materials as the redistribution structure 108 described with respect to FIG. 4. The redistribution structure 306 includes dielectric layers 308 and metallization patterns 310 (sometimes referred to as redistribution layers or redistribution lines). More or fewer dielectric layers 308 and metallization patterns 310 than illustrated may be formed in the redistribution structure 306. The redistribution structure 306 is optional. In some embodiments, a dielectric layer without metallization patterns is formed on the release layer 304 in lieu of the redistribution structure 306.

Figure 10:
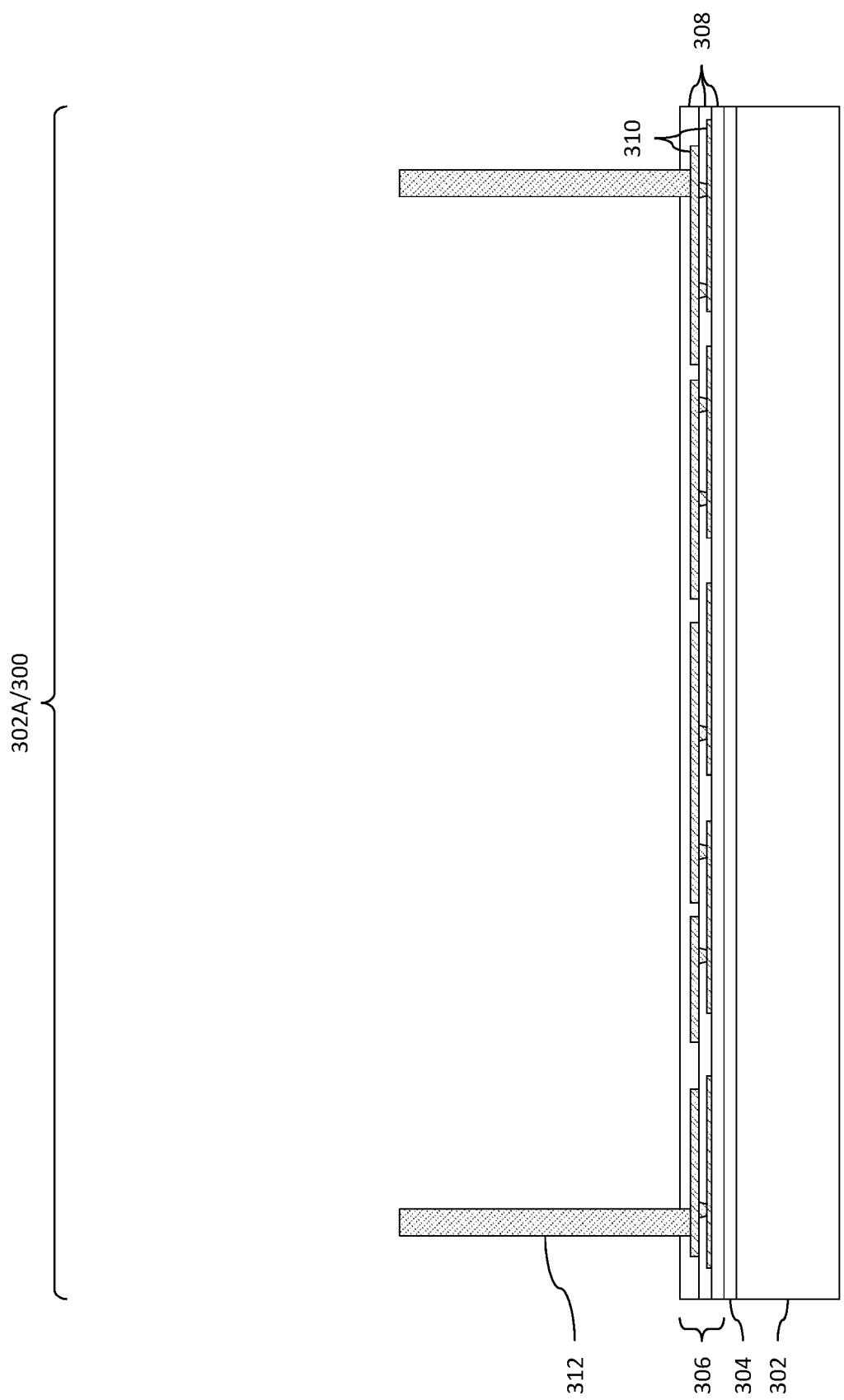

In FIG. 10, conductive vias 312 are formed extending through the topmost dielectric layer 308 of the redistribution structure 306. Thus, the conductive vias 312 are connected to the metallization patterns 310 of the redistribution structure 306. The conductive vias 312 are optional, and may be omitted. For example, the conductive vias 312 may (or may not) be omitted in embodiments where the redistribution structure 306 is omitted.

As an example to form the conductive vias 312, openings can be formed in the topmost dielectric layer 308 of the redistribution structure 306. A seed layer is then formed over the redistribution structure 306, e.g., on the topmost dielectric layer 308 and portions of the metallization pattern 310 exposed by the openings in the topmost dielectric layer 308. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive vias 312.

Figure 11:
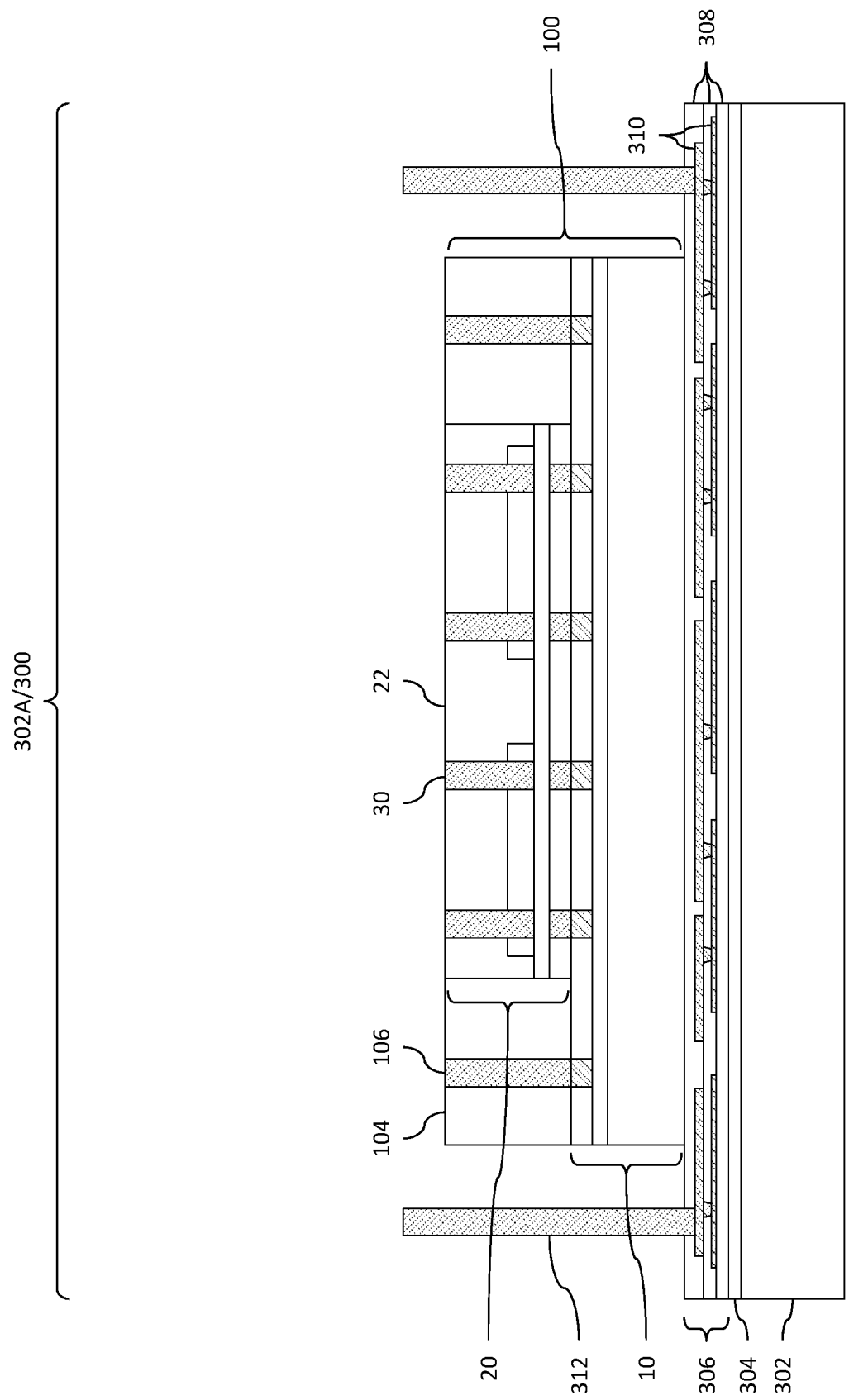

In FIG. 11, a singulated integrated circuit package 100 is placed on the redistribution structure 306 (e.g., the topmost dielectric layer 308). To form the singulated integrated circuit package 100, an intermediate structure similar to that described with respect to FIG. 3 is obtained. A singulation process is performed by sawing along scribe line regions, e.g., around the device region 102A (see FIG. 3). The singulation process includes sawing the dielectric layer 104 and wafer 102. The singulation process separates the device region 102A (comprising the processor device 10) from adjacent device regions (not illustrated) of the wafer 102 to form an integrated circuit package 100 comprising the processor device 10. As noted above, the power gating device 20 is directly bonded to the processor device 10 in a face-to-face manner, without the use of solder. The resulting integrated circuit package 100 is thus free from solder. After singulation, the dielectric layer 104 and processor device 10 are laterally coterminous.

Figure 12:
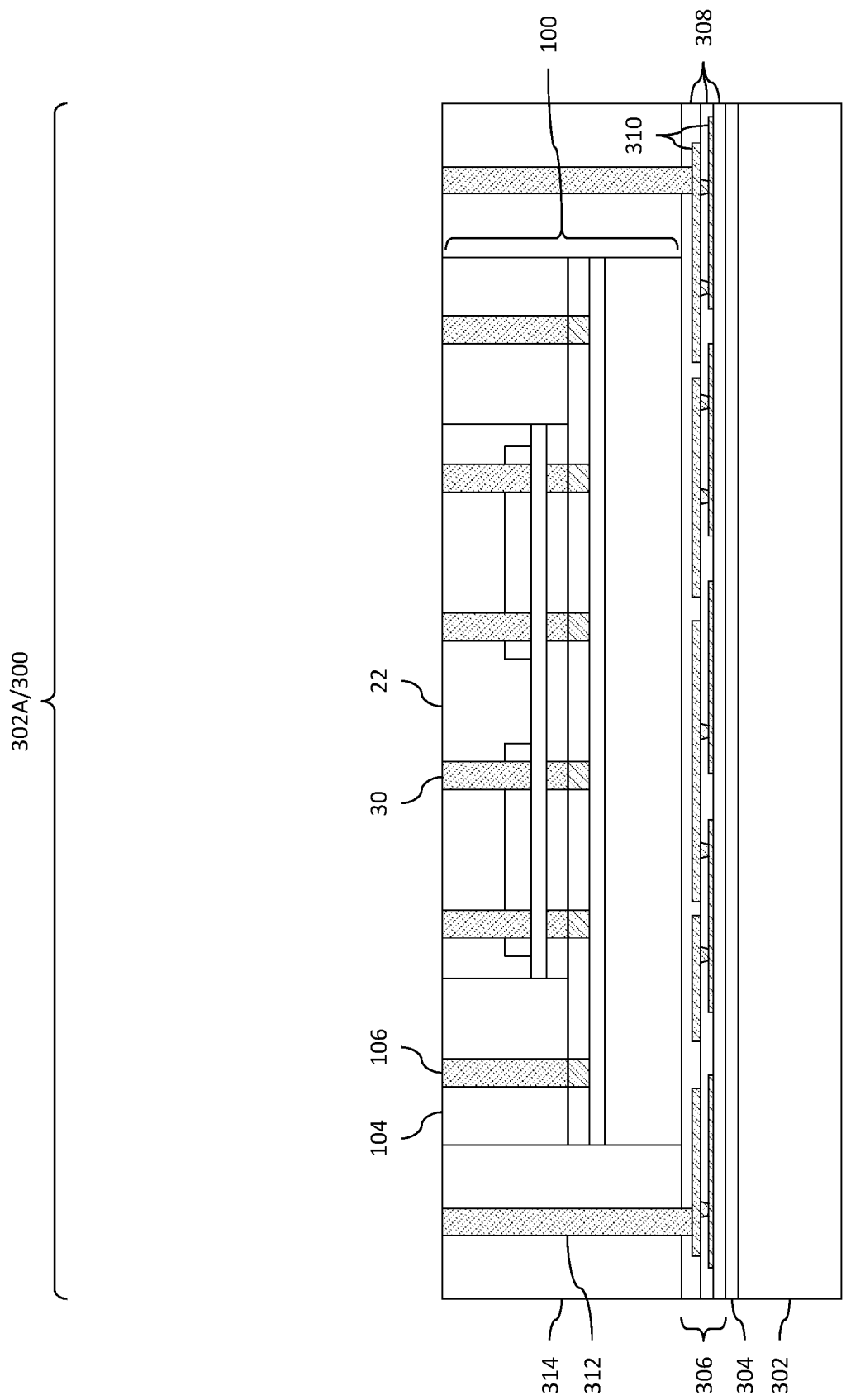

In FIG. 12, an encapsulant 314 is formed on and around the conductive vias 312 and integrated circuit package 100. After formation, the encapsulant 314 encapsulates the conductive vias 312 and integrated circuit package 100. The encapsulant 314 may be a molding compound, epoxy, or the like. The encapsulant 314 may be applied by compression molding, transfer molding, or the like, and may be formed over the carrier substrate 302 such that the integrated circuit package 100 and/or the conductive vias 312 are buried or covered. The encapsulant 314 may be applied in liquid or semi-liquid form and then subsequently cured. In some embodiments, the encapsulant 314 is different from and comprises a different material than the dielectric layer 104. A planarization process can then be performed on the encapsulant 314 to expose the conductive vias 312 and the integrated circuit package 100. The planarization process may remove material of the conductive vias 312, encapsulant 314, dielectric layer 104, conductive vias 106, semiconductor substrate 22, and/or conductive vias 30 until the conductive vias 30, 106, 312 are exposed. Top surfaces of the planarized components are coplanar after the planarization process. The planarization process may be, for example, a chemical-mechanical polish (CMP), a grinding process, an etch-back, or the like. In some embodiments, the planarization may be omitted, for example, if the conductive vias 30, 106, 312 are already exposed.

Figure 13:
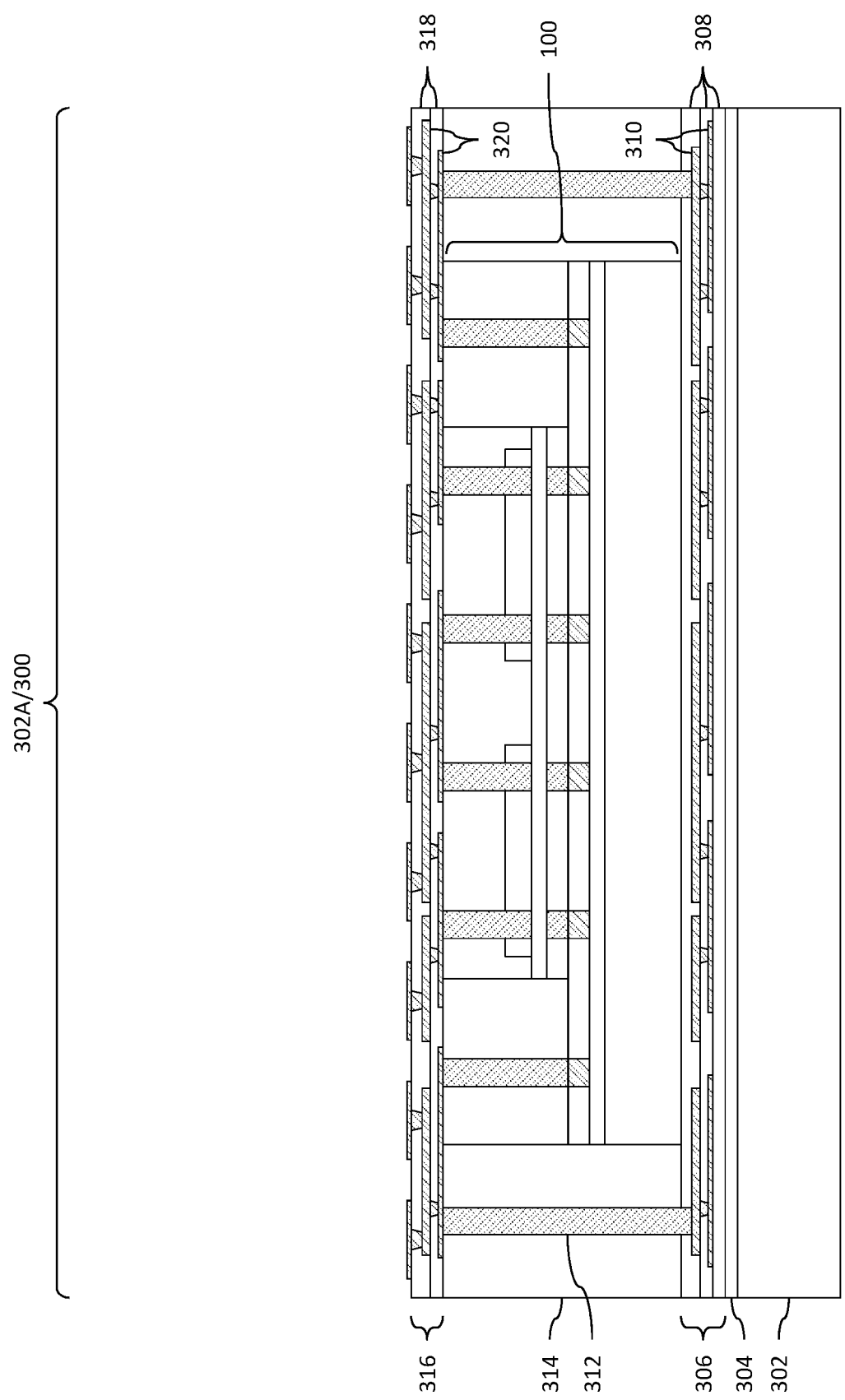

In FIG. 13, a redistribution structure 316 is formed on the encapsulant 314, conductive vias 312, and integrated circuit package 100. The redistribution structure 316 can be formed in a similar manner and of similar materials as the redistribution structure 108 described with respect to FIG. 4. The redistribution structure 316 includes dielectric layers 318 and metallization patterns 320 (sometimes referred to as redistribution layers or redistribution lines). More or fewer dielectric layers 318 and metallization patterns 320 than illustrated may be formed in the redistribution structure 316.

The metallization patterns 320 of the redistribution structure 316 are connected to the conductive vias 30, 106, 312. The metallization patterns 320 of the redistribution structure 316 include power supply source ($V_{DD}$) lines, power supply ground ($V_{SS}$) lines, and data signal lines, which are electrically coupled to the processor device 10 and power gating device 20 in a similar manner as that described with respect to FIG. 4.

Figure 14:
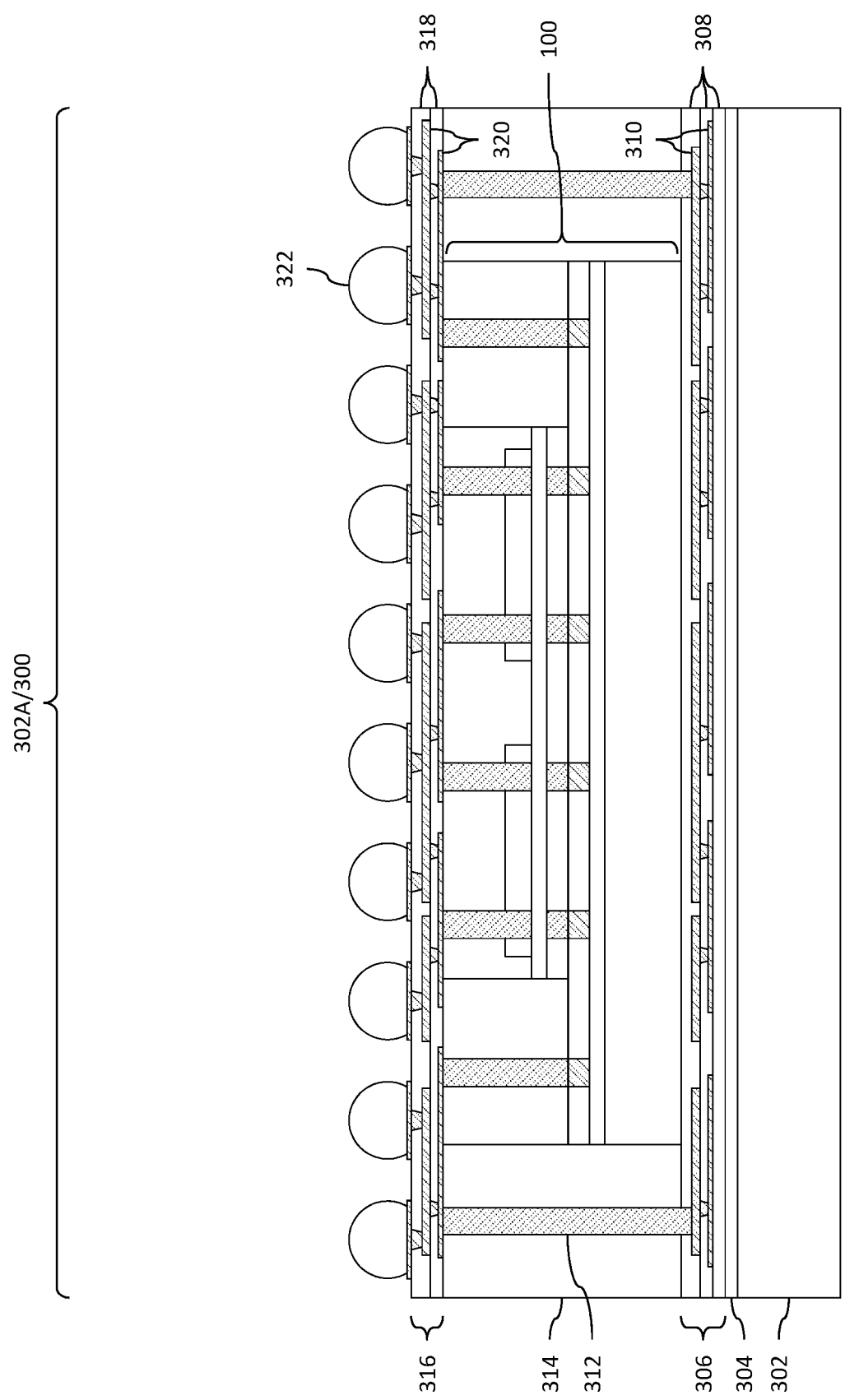

In FIG. 14, conductive connectors 322 are formed connected to the metallization patterns 320 of the redistribution structure 316. The conductive connectors 322 can be formed in a similar manner and of similar materials as the conductive connectors 114 described with respect to FIG. 5. For example, the conductive connectors 322 can be formed on UBMs of the redistribution structure 316.

Figure 15:
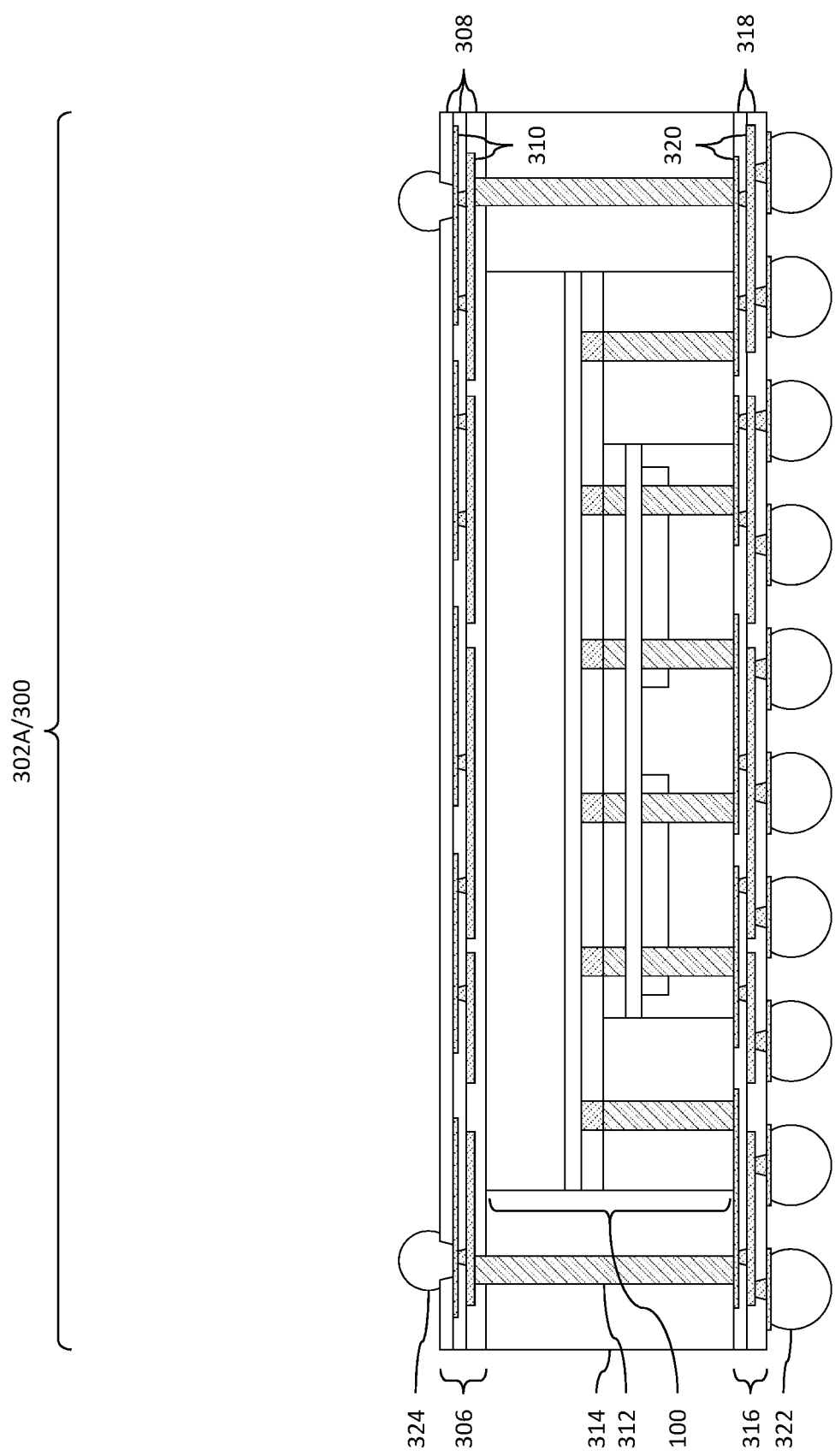

In FIG. 15, a carrier substrate debonding is performed to detach (de-bond) the carrier substrate 302 from the redistribution structure 306, e.g., the bottommost dielectric layer 308. In accordance with some embodiments, the de-bonding includes projecting a light such as a laser light or an UV light on the release layer 304 so that the release layer 304 decomposes under the heat of the light and the carrier substrate 302 can be removed. The structure can then be flipped over and placed on, e.g., a tape.

Further, conductive connectors 324 are formed through the bottommost dielectric layer 308 of the redistribution structure 306. Openings can be formed through the bottommost dielectric layer 308 of the redistribution structure 306, exposing portions of the metallization patterns 310. The openings may be formed, for example, using laser drilling, etching, or the like. The conductive connectors 324 are formed in the openings, and are connected to exposed portions of the metallization patterns 310. The conductive connectors 324 can be formed in a similar manner and of similar materials as the conductive connectors 114 described with respect to FIG. 5.

Figure 16:
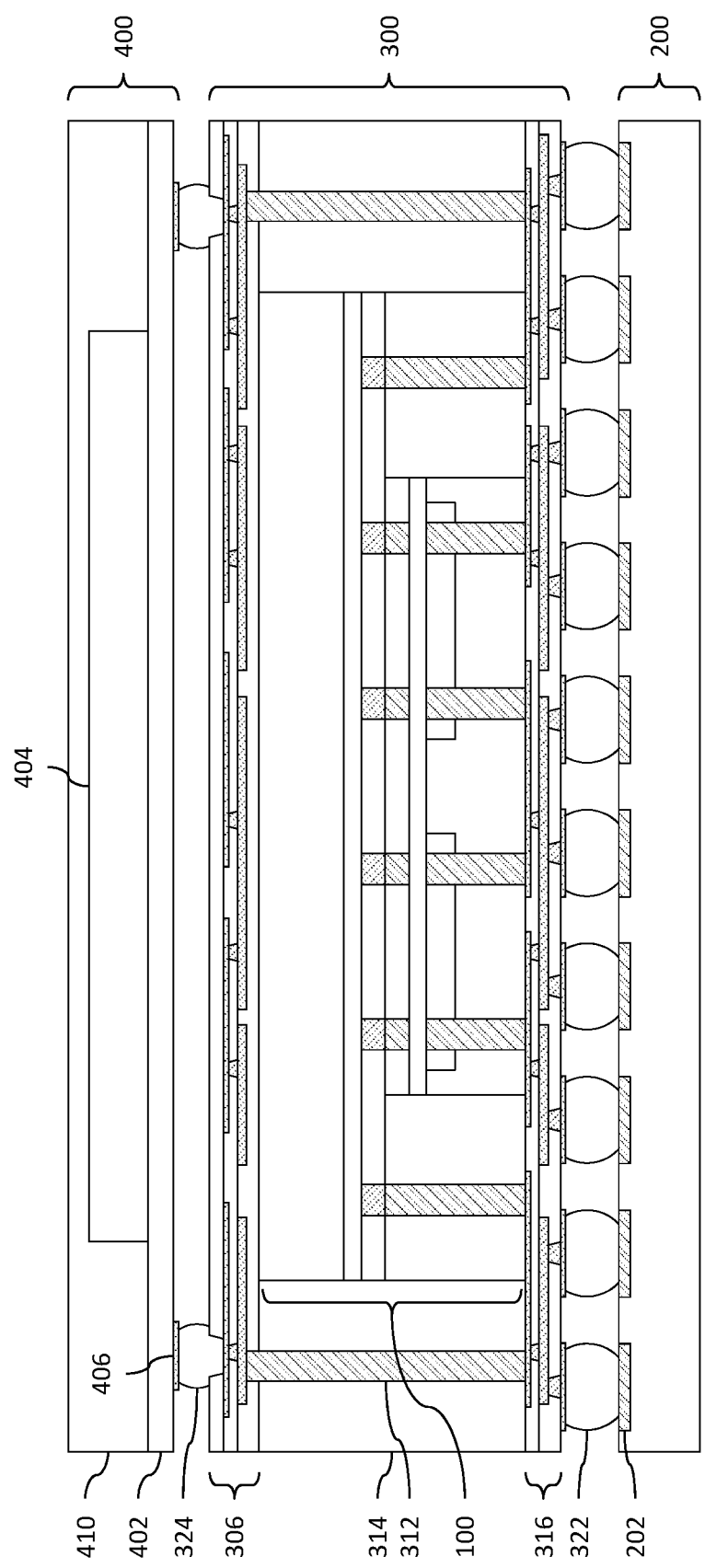

In FIG. 16, a singulation process is performed by sawing along scribe line regions, e.g., around the package region 302A. The singulation process includes sawing the redistribution structures 306, 316 and encapsulant 314. The singulation process separates the package region 302A from adjacent package regions (not illustrated) to form an integrated circuit package 300. After singulation, the redistribution structures 306, 316 (e.g., the dielectric layers 308, 318) and the encapsulant 314 are laterally coterminous.

Another integrated circuit package 400 can be attached to the integrated circuit package 300 to form a package-on-package structure. The integrated circuit package 400 may be a memory package. The integrated circuit package 400 can be attached to the integrated circuit package 300 before or after the integrated circuit package 300 is singulated. The integrated circuit package 400 includes a substrate 402 and one or more dies 404 connected to the substrate 402. In some embodiments (not shown) one or more stacks of dies 404 are connected to the substrate 402. The substrate 402 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 402 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 402 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 402.

The substrate 402 may include active and passive devices (not shown). As one of ordinary skill in the art will recognize, a wide variety of devices such as transistors, capacitors, resistors, combinations of these, and the like may be used to generate the structural and functional requirements of the design for the integrated circuit package 400. The devices may be formed using any suitable methods. The substrate 402 may also include metallization layers (not shown) and through vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 402 is substantially free of active and passive devices.

The substrate 402 may have bond pads 406 on a side of the substrate 402, to connect to the conductive connectors 324. In some embodiments, the bond pads 406 are formed by forming recesses (not shown) into dielectric layers (not shown) on the side of the substrate 402. The recesses may be formed to allow the bond pads 406 to be embedded into the dielectric layers. In other embodiments, the recesses are omitted as the bond pads 406 may be formed on the dielectric layer. In some embodiments, the bond pads 406 include a thin seed layer (not shown) made of copper, titanium, nickel, gold, palladium, the like, or a combination thereof. The conductive material of the bond pads 406 may be deposited over the thin seed layer. The conductive material may be formed by an electro-chemical plating process, an electroless plating process, CVD, ALD, PVD, the like, or a combination thereof. In an embodiment, the conductive material of the bond pads 406 is copper, tungsten, aluminum, silver, gold, the like, or a combination thereof.

In an embodiment, the bond pads 406 are UBMs that include three layers of conductive materials, such as a layer of titanium, a layer of copper, and a layer of nickel. For example, the bond pads 406 may be formed from copper, may be formed on a layer of titanium (not shown), and have a nickel finish, which may improve the shelf life of the integrated circuit package 400, which may be particularly advantageous when the integrated circuit package 400 is a memory device such as a DRAM module. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the bond pads 406. Any suitable materials or layers of material that may be used for the bond pads 406 are fully intended to be included within the scope of the current application.

In the illustrated embodiment, the dies 404 are connected to the substrate 402 by conductive bumps, although other connections may be used, such as wire bonds. In an embodiment, the dies 404 are stacked memory dies. For example, the dies 404 may be memory dies such as low-power (LP) double data rate (DDR) memory modules, such as LPDDR1, LPDDR2, LPDDR3, LPDDR4, or the like.

The dies 404 and the wire bonds (when present) may be encapsulated by a molding material 410. The molding material 410 may be molded on the dies 404 and the wire bonds, for example, using compression molding. In some embodiments, the molding material 410 is a molding compound, a polymer, an epoxy, silicon oxide filler material, the like, or a combination thereof. A curing process may be performed to cure the molding material 410; the curing process may be a thermal curing, a UV curing, the like, or a combination thereof. In some embodiments, the dies 404 are buried in the molding material 410, and after the curing of the molding material 410, a planarization step, such as a grinding, is performed to remove excess portions of the molding material 410 and provide a substantially planar surface for the integrated circuit package 400.

After the integrated circuit package 400 is formed, the integrated circuit package 400 is attached to the integrated circuit package 300 by way of the conductive connectors 324. The conductive connectors 324 can be connected to the bond pads 406 by reflowing the conductive connectors 324. The dies 404 may thus be electrically coupled to the integrated circuit package 100 through the conductive connectors 324, the conductive vias 312, and the redistribution structures 306, 316.

In some embodiments, a solder resist (not shown) is formed on the side of the substrate 402 opposing the dies 404. The conductive connectors 324 may be disposed in openings in the solder resist to be connected to conductive features (e.g., the bond pads 406) in the substrate 402. The solder resist may be used to protect areas of the substrate 402 from external damage.

In some embodiments, the conductive connectors 324 have an epoxy flux (not shown) formed thereon before they are reflowed with at least some of the epoxy portion of the epoxy flux remaining after the integrated circuit package 400 is attached to the redistribution structure 306.

In some embodiments, an underfill (not shown) is formed between the redistribution structure 306 and the substrate 402, and surrounding the conductive connectors 324. The underfill may reduce stress and protect the joints resulting from the reflowing of the conductive connectors 324. The underfill may be formed by a capillary flow process after the integrated circuit package 400 is attached or may be formed by a suitable deposition method before the integrated circuit package 400 is attached. In embodiments where the epoxy flux is formed, it may act as the underfill.

The package-on-package structure is then flipped and attached to a package substrate 200 using the conductive connectors 322. The package substrate 200 may be similar to the package substrate 200 described with respect to FIG. 6. For example, the package substrate 200 can include bond pads 202, which are connected to the conductive connectors 322.

Figure 17:
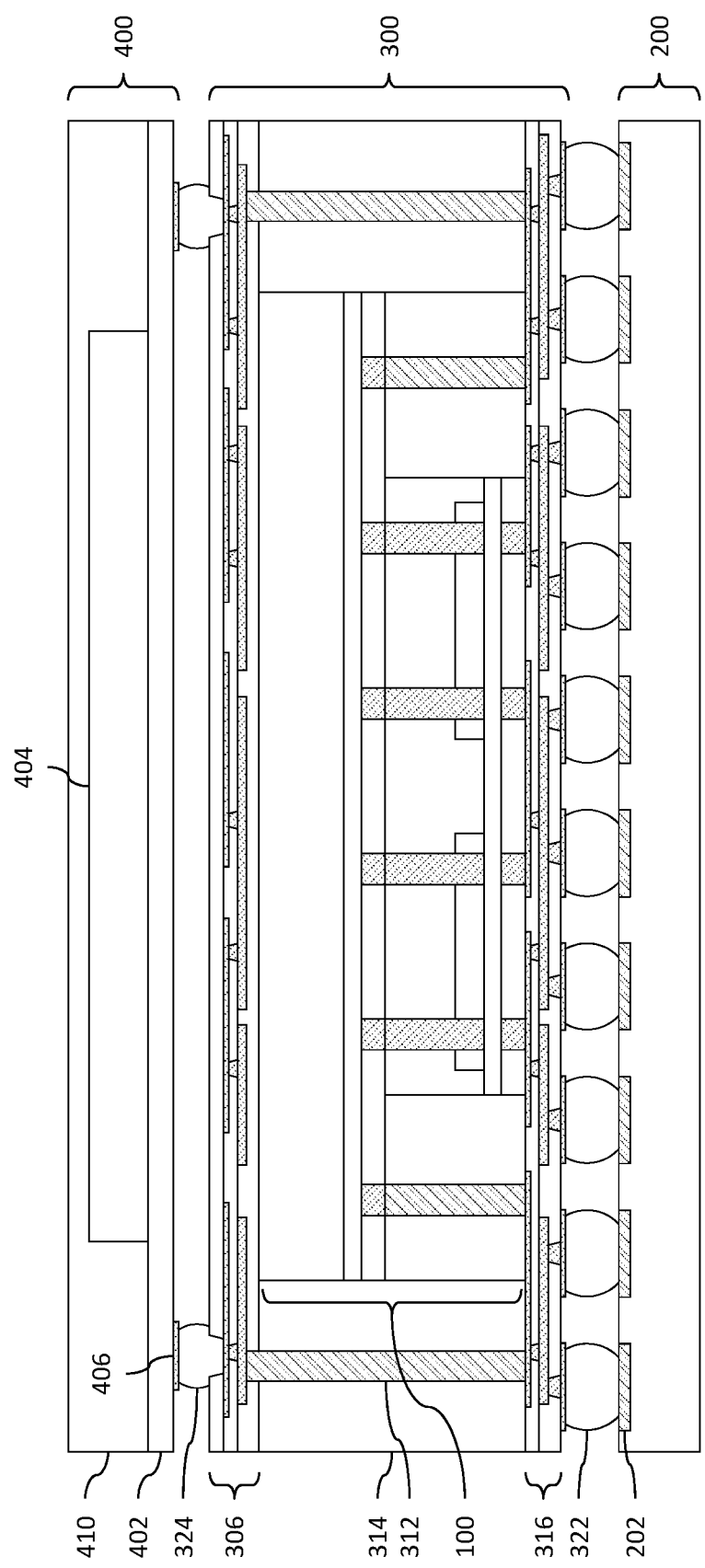
FIG. 17 is a cross-sectional view of an integrated circuit package and a system implementing the integrated circuit package, in accordance with some other embodiments.

FIG. 17 is a cross-sectional view of an integrated circuit package 100 and a system implementing the integrated circuit package 100, in accordance with some other embodiments. This embodiment is similar to the embodiment described with respect to FIG. 16, except the processor device 10 and power gating device 20 are directly bonded in a face-to-back manner, similar to the hybrid bonding described with respect to FIG. 7. The metallization patterns 320 of the redistribution structure 316 (e.g., $V_{DD}$ and $V_{SS}$ lines) are thus connected to the die connectors 26, and are electrically coupled to the processor device 10 by the conductive vias 30.

Figure 18:
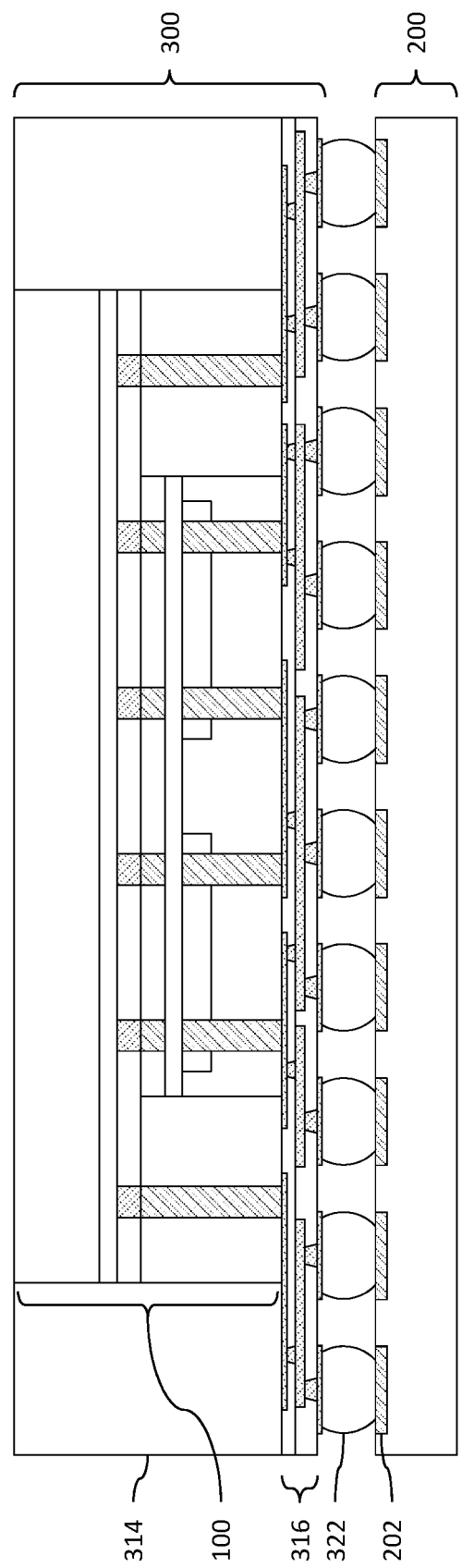
FIG. 18 is a cross-sectional view of an integrated circuit package and a system implementing the integrated circuit package, in accordance with some other embodiments.

FIG. 18 is a cross-sectional view of an integrated circuit package 100 and a system implementing the integrated circuit package 100, in accordance with some other embodiments. This embodiment is similar to the embodiment described with respect to FIG. 16, except the redistribution structure 306, the conductive vias 312, and the integrated circuit package 400 are omitted.

Figure 19:
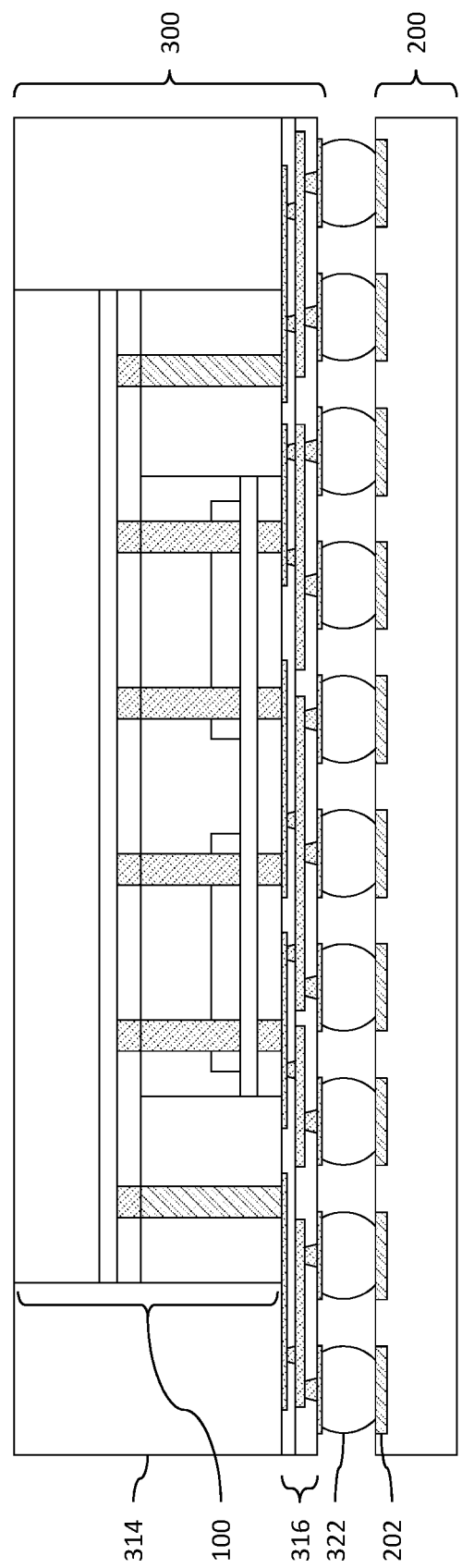
FIG. 19 is a cross-sectional view of an integrated circuit package and a system implementing the integrated circuit package, in accordance with some other embodiments.

FIG. 19 is a cross-sectional view of an integrated circuit package 100 and a system implementing the integrated circuit package 100, in accordance with some other embodiments. This embodiment is similar to the embodiment described with respect to FIG. 17, except the redistribution structure 306, the conductive vias 312, and the integrated circuit package 400 are omitted.

FIGS. 20, 21, 22, 23, and 24 are cross-sectional views of intermediate steps during a process for forming an integrated circuit package 500, in accordance with some embodiments. The integrated circuit package 500 is formed by stacking multiple levels of semiconductor device, each encapsulated in an encapsulating material. Packaging of devices in one package region 502A is illustrated, but it should be appreciated that any number of package regions may be simultaneously formed. The package region 502A will be singulated in subsequent processing. The singulated package component may be a multi-stacked (MUST) package. The MUST package is then mounted to a package substrate.

Figure 20:
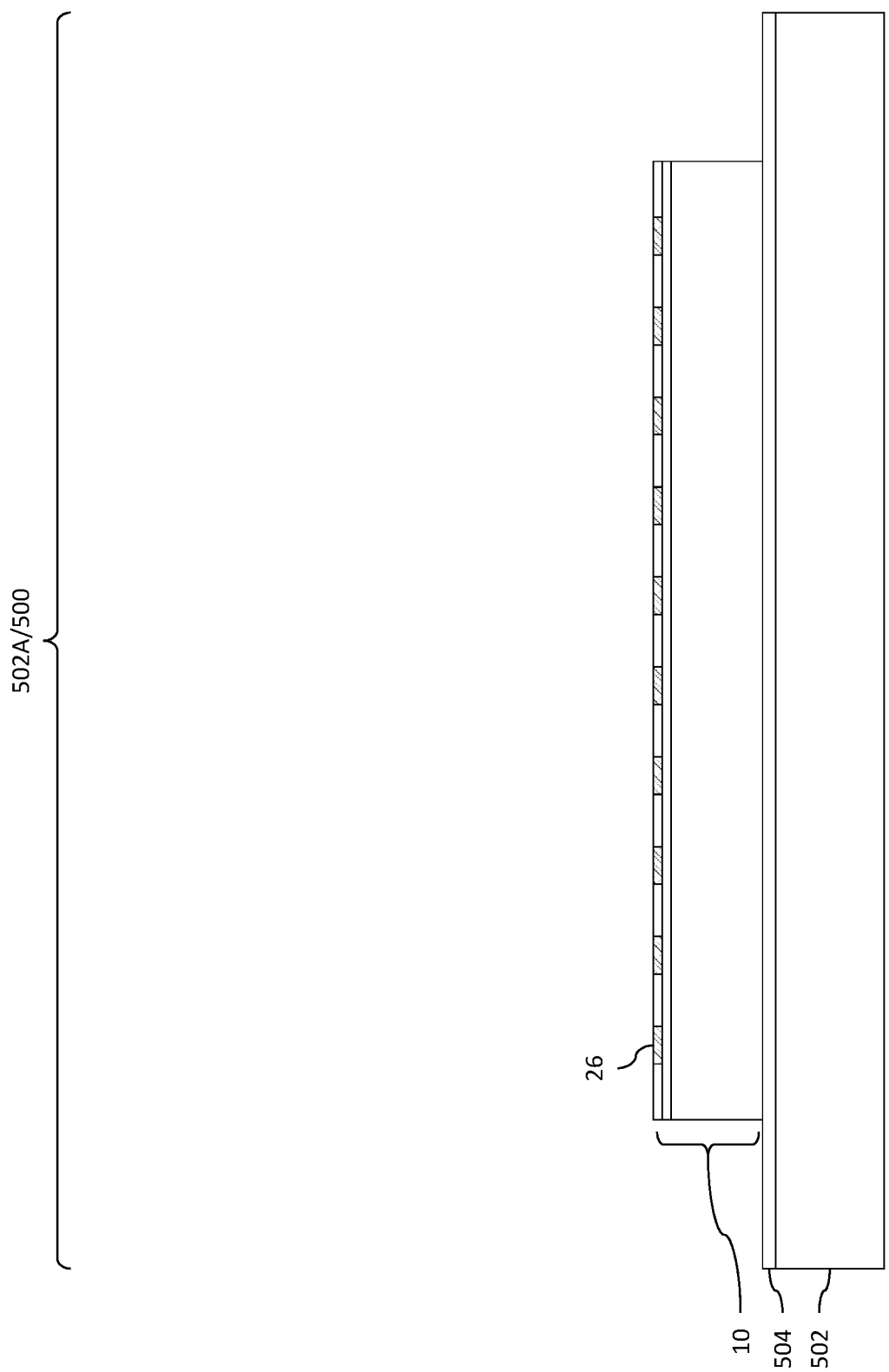
FIGS. 20, 21, 22, 23, and 24 are cross-sectional views of intermediate steps during a process for forming an integrated circuit package, in accordance with some embodiments.

In FIG. 20, a carrier substrate 502 is provided, and a release layer 504 is formed on the carrier substrate 502. The carrier substrate 502 can be formed in a similar manner and of similar materials as the carrier substrate 302 described with respect to FIG. 8. The release layer 504 can be formed in a similar manner and of similar materials as the release layer 304 described with respect to FIG. 8. A processor device 10 similar to that described with respect to FIG. 1 (e.g., comprising a semiconductor substrate 12, interconnect structure 14, die connectors 16, and dielectric layer 18) is then placed on the release layer 504.

Figure 21:
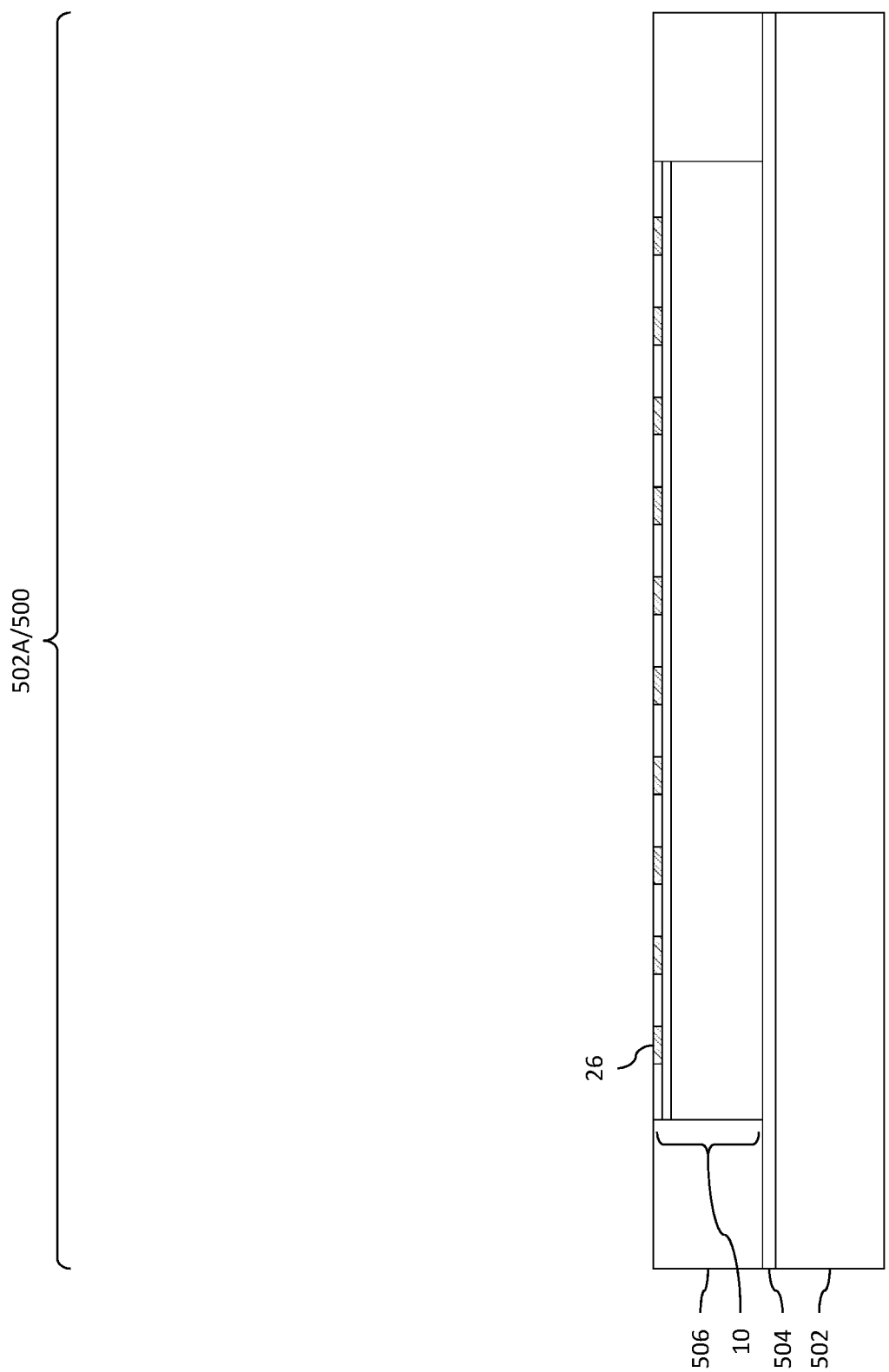

In FIG. 21, an encapsulant 506 is formed on and around the processor device 10. The encapsulant 506 can be formed in a similar manner and of similar materials as the encapsulant 314 described with respect to FIG. 12. A planarization process can be performed on the encapsulant 506, if needed, to expose the die connectors 16.

Figure 22:
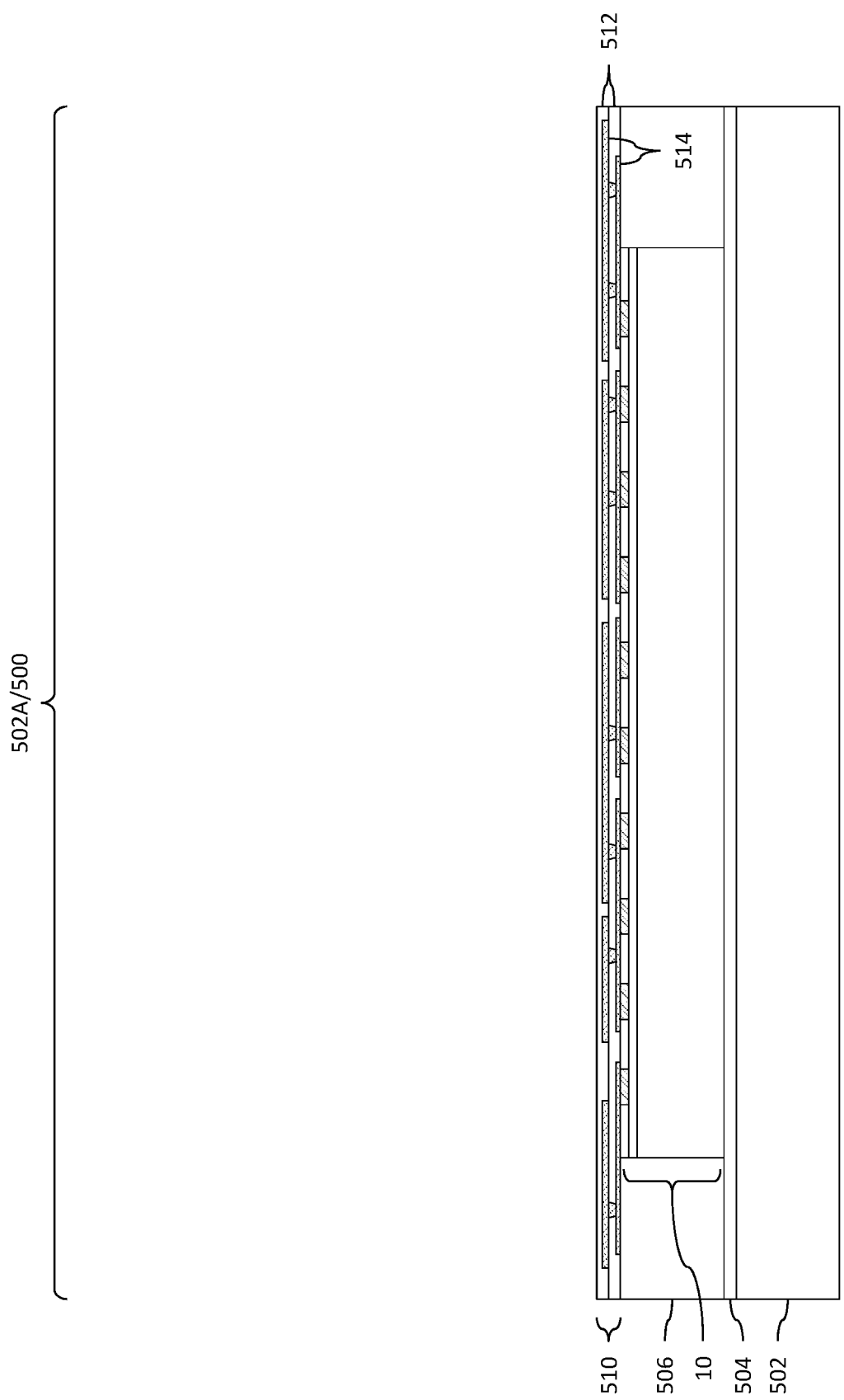

In FIG. 22, a redistribution structure 510 is formed on the encapsulant 506 and processor device 10. The redistribution structure 510 can be formed in a similar manner and of similar materials as the redistribution structure 108 described with respect to FIG. 4. The redistribution structure 510 includes dielectric layers 512 and metallization patterns 514 (sometimes referred to as redistribution layers or redistribution lines). More or fewer dielectric layers 512 and metallization patterns 514 than illustrated may be formed in the redistribution structure 510. The metallization patterns 514 of the redistribution structure 510 are connected to the die connectors 16 of the processor device 10.

Figure 23:
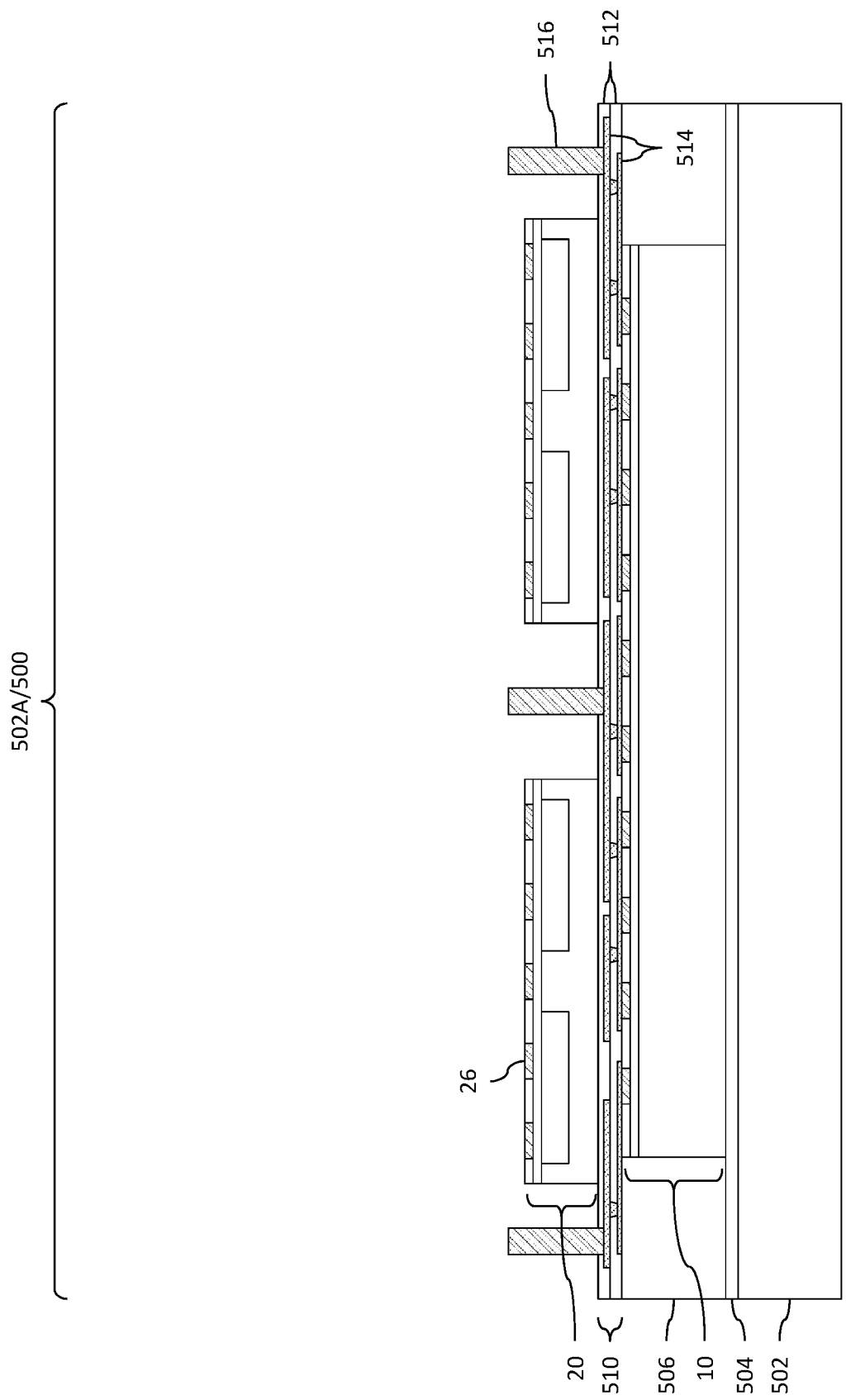

In FIG. 23, conductive vias 516 are formed extending through the topmost dielectric layer 512 of the redistribution structure 510. The conductive vias 516 can be formed in a similar manner and of similar materials as the conductive vias 312 described with respect to FIG. 10.

One or more power gating devices 20 are placed on the redistribution structure 510 (e.g., the topmost dielectric layer 512). Each power gating device 20 can be similar to that described with respect to FIG. 1 (e.g., comprising a semiconductor substrate 22, an interconnect structure 24, die connectors 26, and a dielectric layer 28) The power gating devices 20 will be electrically coupled to the processor device 10 through the redistribution structures of the MUST package, and so the formation of the conductive vias 30 (see FIG. 1) is unnecessary. Manufacturing costs of the power gating devices 20 may thus be reduced.

Figure 24:
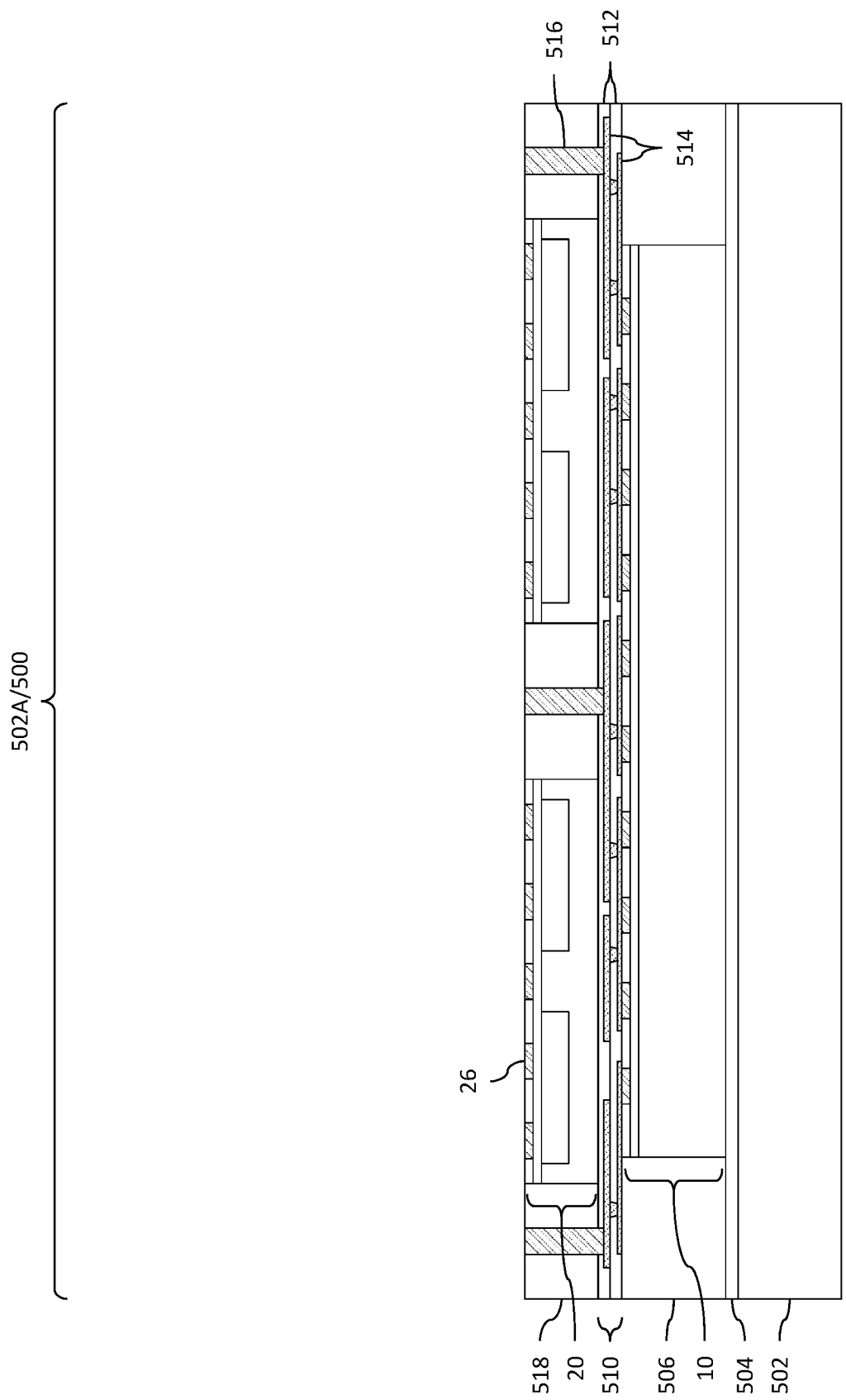

In FIG. 24, an encapsulant 518 is formed on and around the power gating devices 20 and conductive vias 516. The encapsulant 518 can be formed in a similar manner and of similar materials as the encapsulant 314 described with respect to FIG. 12. A planarization process can be performed on the encapsulant 518, if needed, to expose the conductive vias 516 and die connectors 26.

FIGS. 25, 26, 27, and 28 are cross-sectional views of intermediate steps during a process for forming a system implementing the integrated circuit package 500, in accordance with some embodiments. In this embodiment, the integrated circuit package 500 is further processed to include a redistribution structure, and is directly mounted to a package substrate.

Figure 25:
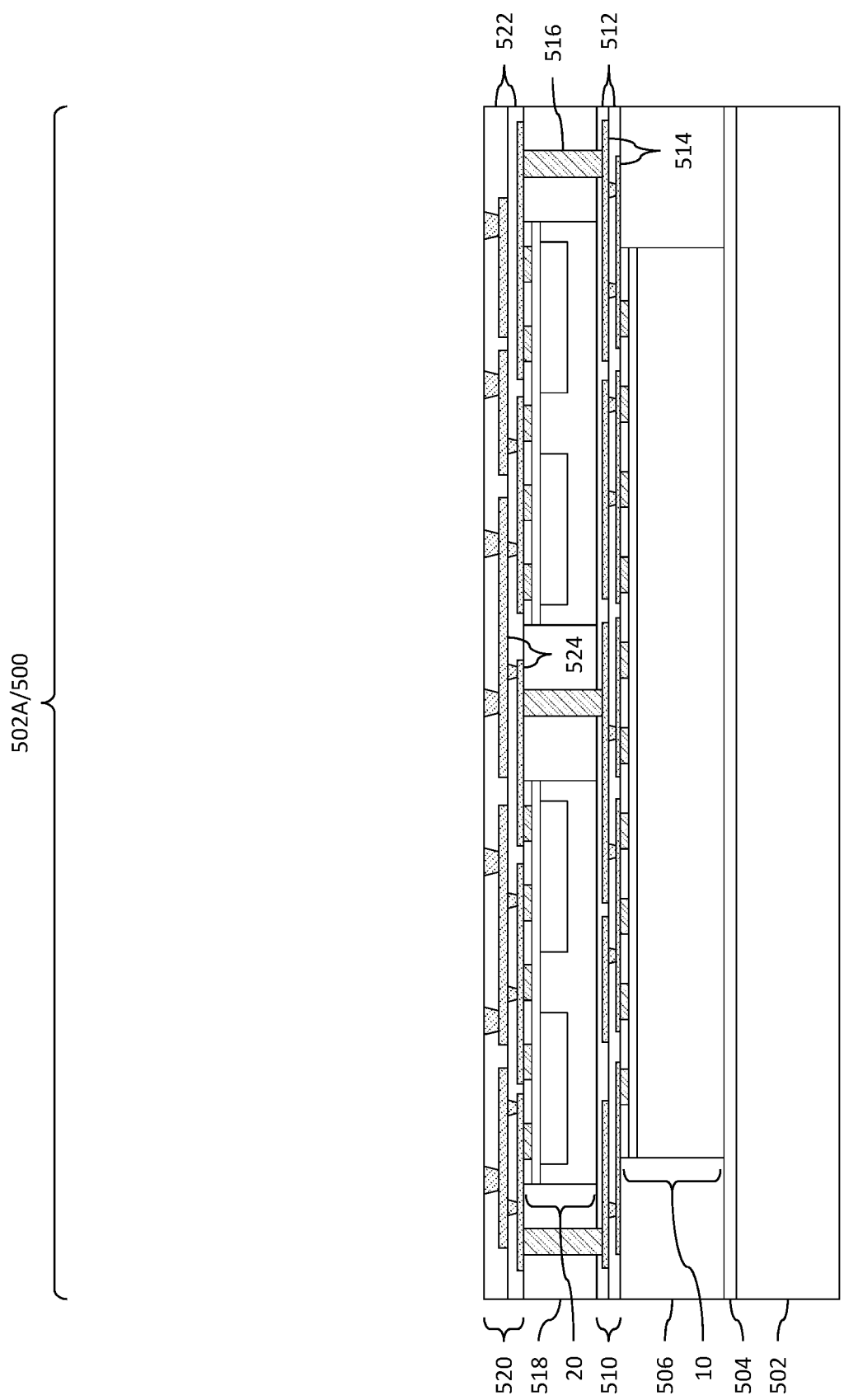
FIGS. 25, 26, 27, and 28 are cross-sectional views of intermediate steps during a process for forming a system implementing the integrated circuit package, in accordance with some embodiments.

In FIG. 25, a redistribution structure 520 is formed on the encapsulant 518 and power gating devices 20. The redistribution structure 520 can be formed in a similar manner and of similar materials as the redistribution structure 108 described with respect to FIG. 4. The redistribution structure 520 includes dielectric layers 522 and metallization patterns 524 (sometimes referred to as redistribution layers or redistribution lines). More or fewer dielectric layers 522 and metallization patterns 524 than illustrated may be formed in the redistribution structure 520. The metallization patterns 524 of the redistribution structure 520 are connected to the conductive vias 516 and the die connectors 26 of the power gating devices 20. Thus, the processor device 10 is electrically coupled to the metallization patterns 524 of the redistribution structure 520 through the conductive vias 516 and the metallization patterns 514 of the redistribution structure 510.

The metallization patterns 524 of the redistribution structure 520 include power supply source ($V_{DD}$) lines, power supply ground ($V_{SS}$) lines, and data signal lines, which are electrically coupled to input terminals of the power gating devices 20. The metallization patterns 524 of the redistribution structure 520 also include lines that electrically couple the conductive vias 516 to output terminals of the power gating devices 20. Thus, a first subset of the circuit blocks of the processor device 10 are electrically coupled to the $V_{DD}$ and $V_{SS}$ lines through the power gating device 20 and conductive vias 516. The first subset of the circuit blocks can thus be turned on and off by the power gating device 20. A second subset of the circuit blocks of the processor device 10 are electrically coupled to the $V_{DD}$ and $V_{SS}$ lines through the conductive vias 516, bypassing the power gating device 20. The second subset of the circuit blocks are thus permanently electrically coupled to power and ground. The second subset of the circuit blocks may be essential circuit blocks that are always turned on. The data signal lines are electrically coupled to the processor device 10 and power gating device 20. The processor device 10 may send control signals to the power gating device 20 over the data signal lines, and may receive power/ground signals from the power gating device 20 over the data signal lines.

Figure 26:
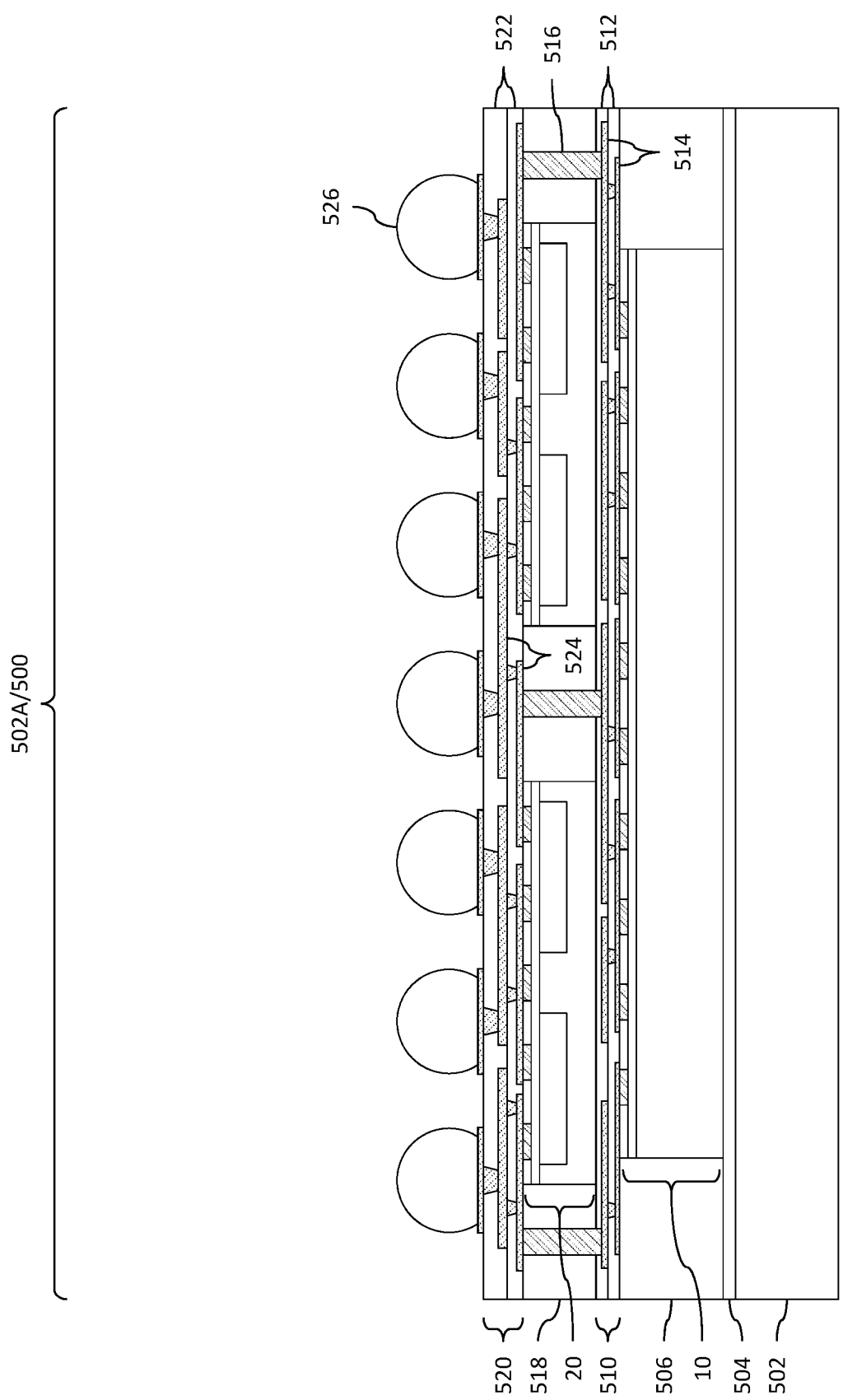

In FIG. 26, conductive connectors 526 are formed connected to the metallization patterns 524 of the redistribution structure 520. The conductive connectors 526 can be formed in a similar manner and of similar materials as the conductive connectors 114 described with respect to FIG. 5.

Figure 27:
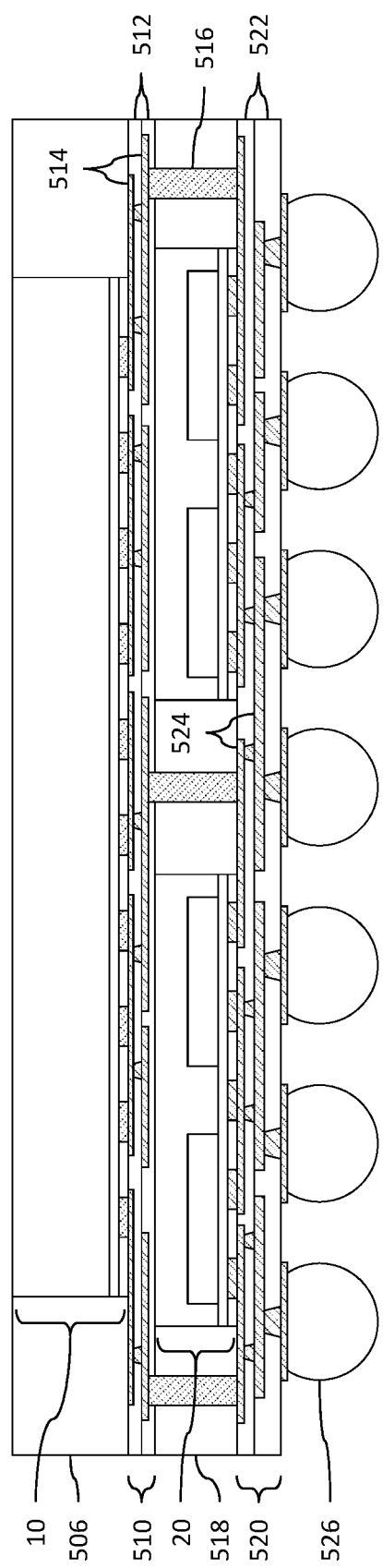

In FIG. 27, a carrier substrate debonding is performed to detach (de-bond) the carrier substrate 502 from the redistribution structure 510, e.g., the bottommost dielectric layer 512. In accordance with some embodiments, the de-bonding includes projecting a light such as a laser light or an UV light on the release layer 504 so that the release layer 504 decomposes under the heat of the light and the carrier substrate 502 can be removed. The structure can then be flipped over and placed on, e.g., a tape.

Figure 28:
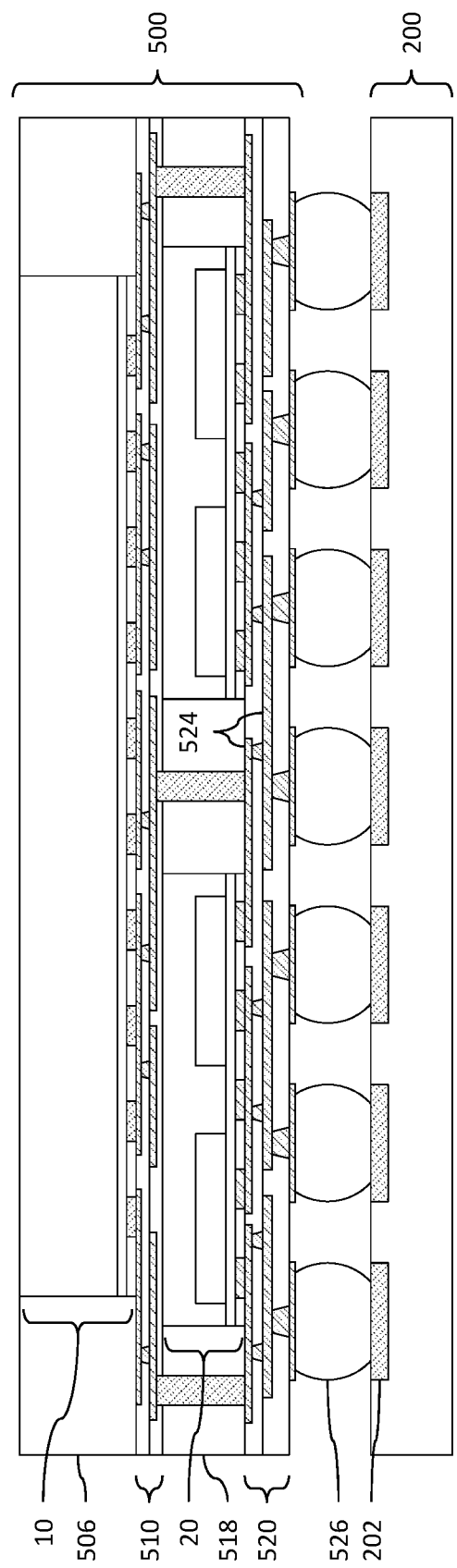

In FIG. 28, a singulation process is performed by sawing along scribe line regions, e.g., around the package region 502A. The singulation process includes sawing the redistribution structures 510, 520 and encapsulants 506, 518. The singulation process separates the package region 502A from adjacent package regions (not illustrated) to form an integrated circuit package 500. After singulation, the redistribution structures 510, 520 (e.g., the dielectric layers 512, 522) and the encapsulants 506, 518 are laterally coterminous.

The integrated circuit package 500 is then attached to a package substrate 200 using the conductive connectors 526. The package substrate 200 may be similar to the package substrate 200 described with respect to FIG. 6. For example, the package substrate 200 can include bond pads 202, which are connected to the conductive connectors 526.

FIGS. 29, 30, 31, 32, 33, and 34 are cross-sectional views of intermediate steps during a process for forming a system implementing the integrated circuit package 500, in accordance with some embodiments. In this embodiment, the integrated circuit package 500 is singulated and included in a package component. Packaging of devices in one package region 602A is illustrated, but it should be appreciated that any number of package regions may be simultaneously formed. The package region 602A will be singulated in subsequent processing. The singulated package component may be a fan-out package, such as an integrated fan-out (InFO) package. The fan-out package is then mounted to a package substrate.

Figure 29:
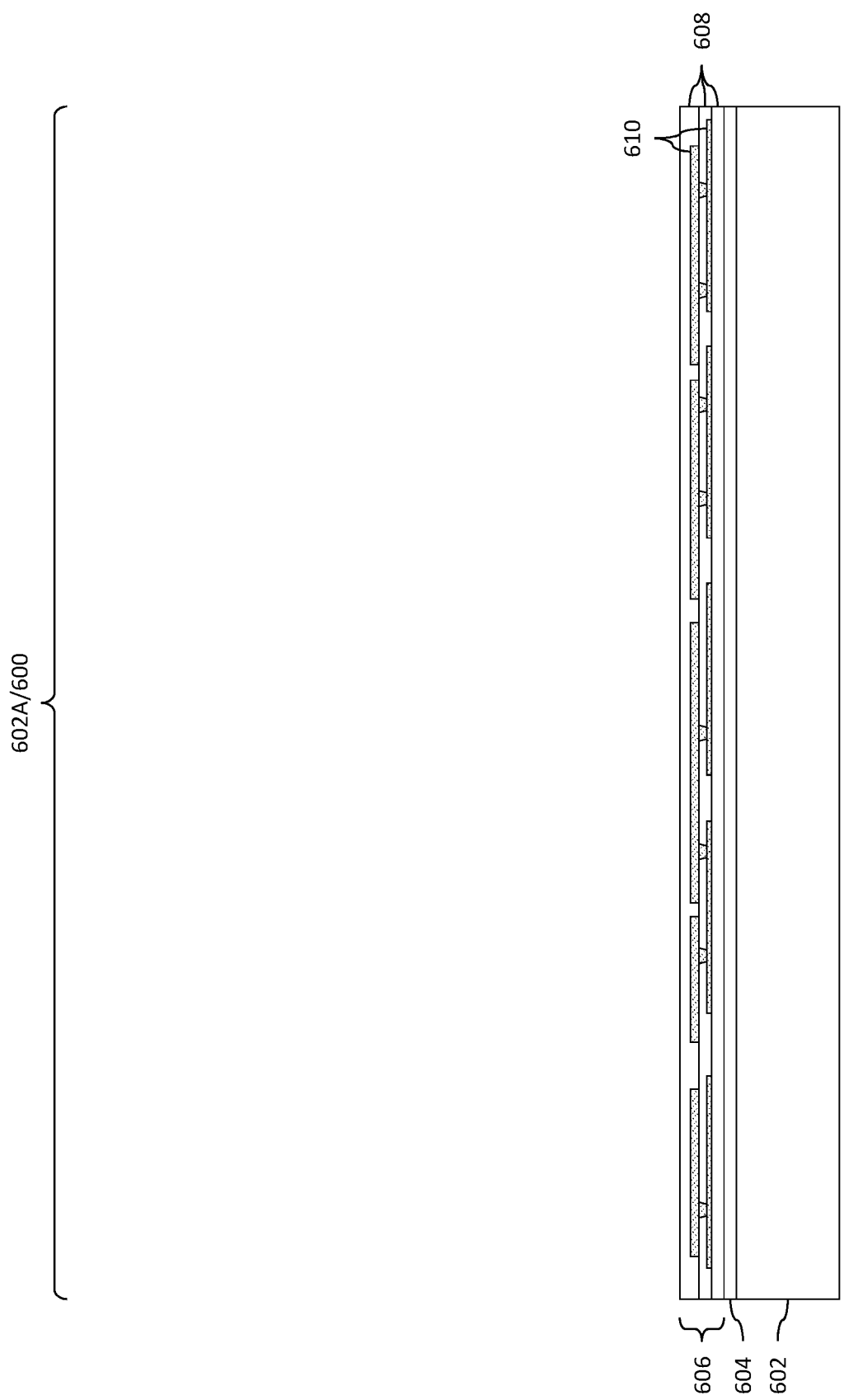
FIGS. 29, 30, 31, 32, 33, and 34 are cross-sectional views of intermediate steps during a process for forming a system implementing the integrated circuit package, in accordance with some other embodiments.

In FIG. 29, a carrier substrate 602 is provided, and a release layer 604 is formed on the carrier substrate 602. The carrier substrate 602 can be formed in a similar manner and of similar materials as the carrier substrate 302 described with respect to FIG. 8. The release layer 604 can be formed in a similar manner and of similar materials as the release layer 304 described with respect to FIG. 8.

A redistribution structure 606 may be formed on the release layer 604. The redistribution structure 606 can be formed in a similar manner and of similar materials as the redistribution structure 108 described with respect to FIG. 4. The redistribution structure 606 includes dielectric layers 608 and metallization patterns 610 (sometimes referred to as redistribution layers or redistribution lines). More or fewer dielectric layers 608 and metallization patterns 610 than illustrated may be formed in the redistribution structure 606. The redistribution structure 606 is optional. In some embodiments, a dielectric layer without metallization patterns is formed on the release layer 604 in lieu of the redistribution structure 606.

Figure 30:
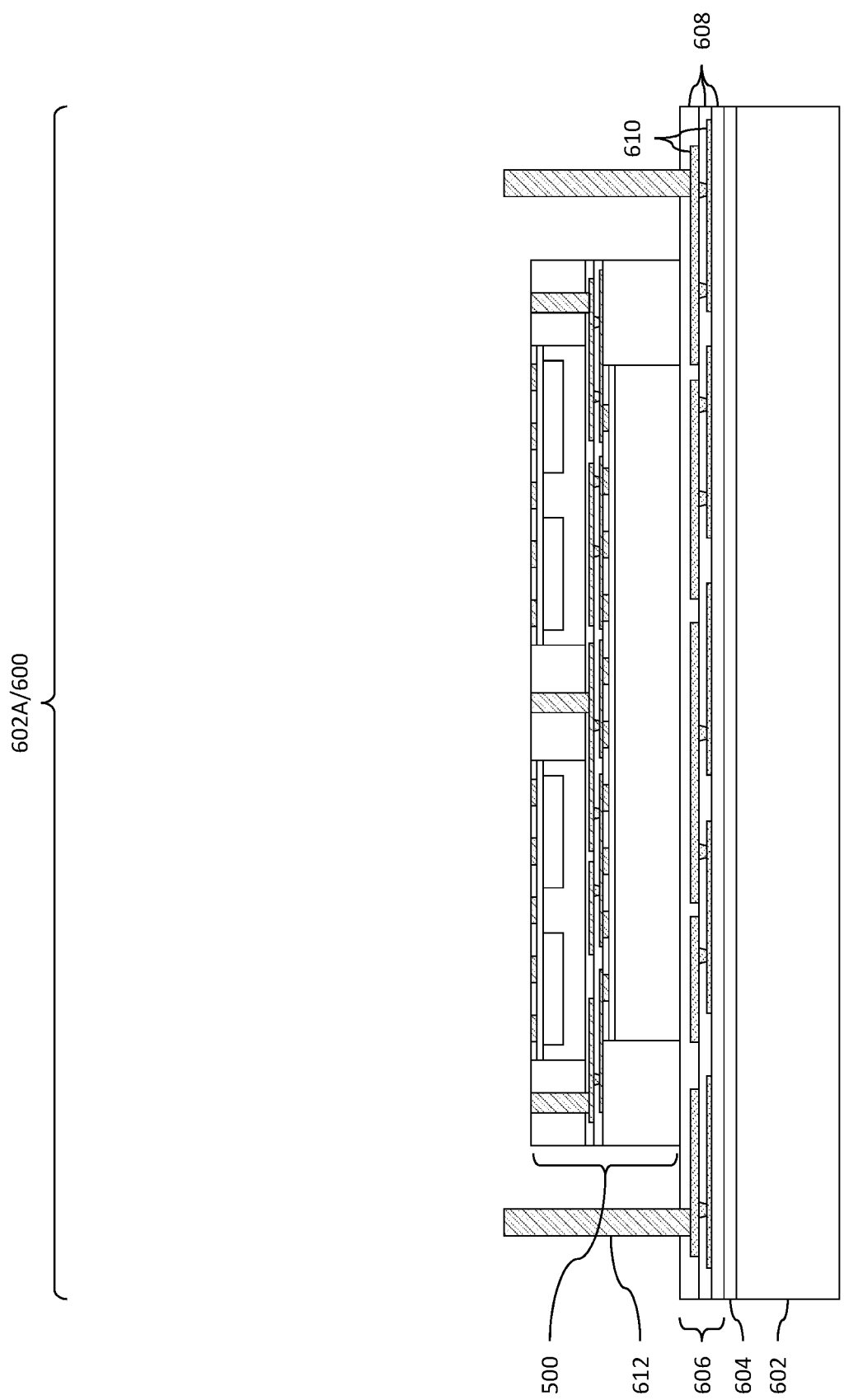

In FIG. 30, conductive vias 612 are formed extending through the topmost dielectric layer 608 of the redistribution structure 606. Thus, the conductive vias 612 are connected to the metallization patterns 610 of the redistribution structure 606. The conductive vias 612 can be formed in a similar manner and of similar materials as the conductive vias 312 described with respect to FIG. 10. The conductive vias 612 are optional, and may be omitted. For example, the conductive vias 612 may (or may not) be omitted in embodiments where the redistribution structure 606 is omitted.

A singulated integrated circuit package 500 is placed on the redistribution structure 606 (e.g., the topmost dielectric layer 608), adjacent the conductive vias 612. To form the singulated integrated circuit package 500, an intermediate structure similar to that described with respect to FIG. 24 is obtained. A carrier substrate debonding is performed to detach (de-bond) the intermediate structure from the carrier substrate 502 (see FIG. 24). A singulation process is then performed by sawing along scribe line regions, e.g., around the package region 502A (see FIG. 24). The singulation process includes sawing the redistribution structure 510 and encapsulants 506, 518. The singulation process separates the package region 502A from adjacent package regions (not illustrated) to form an integrated circuit package 500. After singulation, the redistribution structure 510 (e.g., the dielectric layers 512) and the encapsulants 506, 518 are laterally coterminous.

Figure 31:
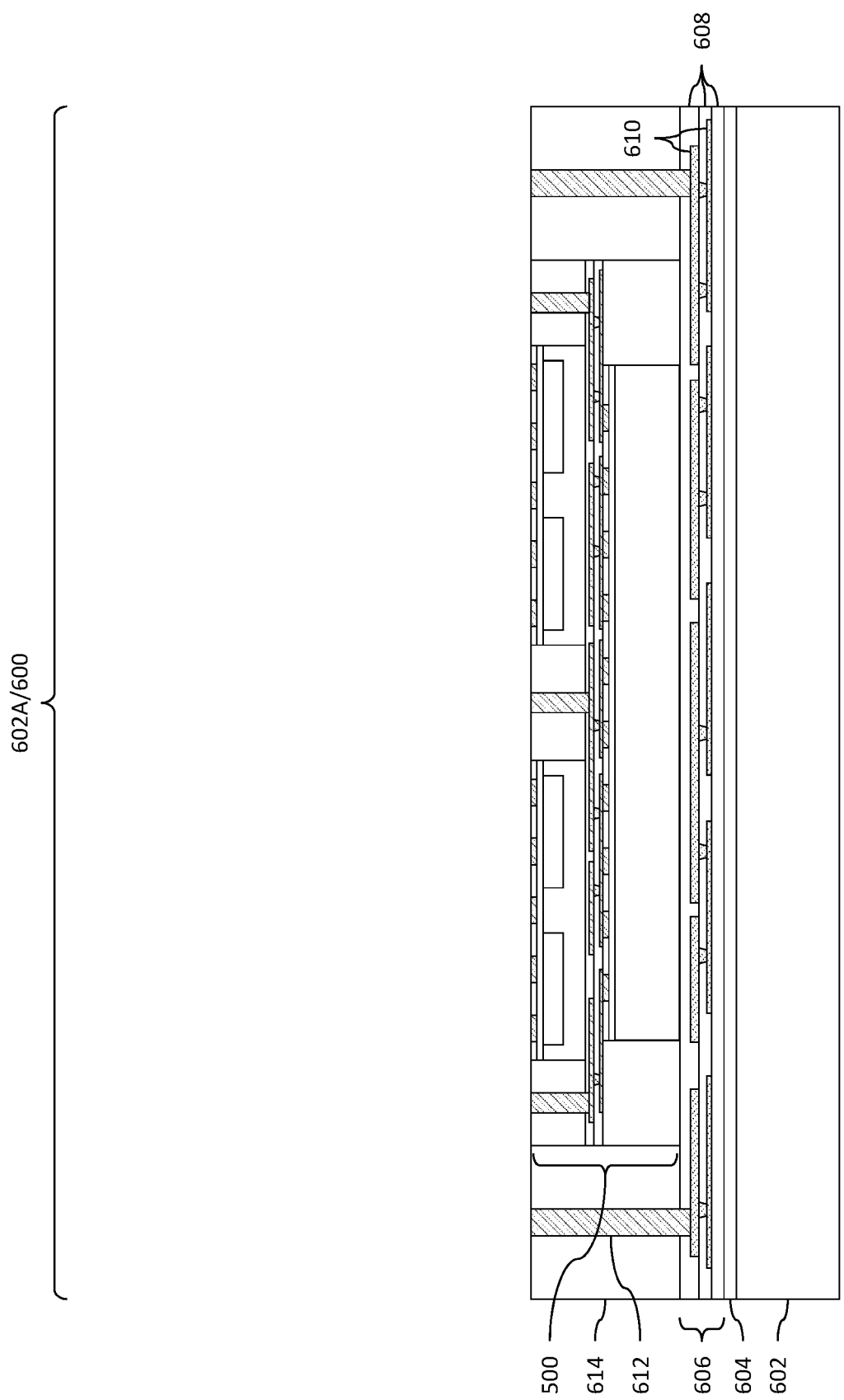

In FIG. 31, an encapsulant 614 is formed on and around the conductive vias 612 and integrated circuit package 500. The encapsulant 614 can be formed in a similar manner and of similar materials as the encapsulant 314 described with respect to FIG. 12. In some embodiments, the encapsulant 614 is different from and comprises a different material than the encapsulants 506, 518. A planarization process can be performed on the encapsulant 614, if needed, to expose the die connectors 26 and conductive vias 516, 612.

Figure 32:
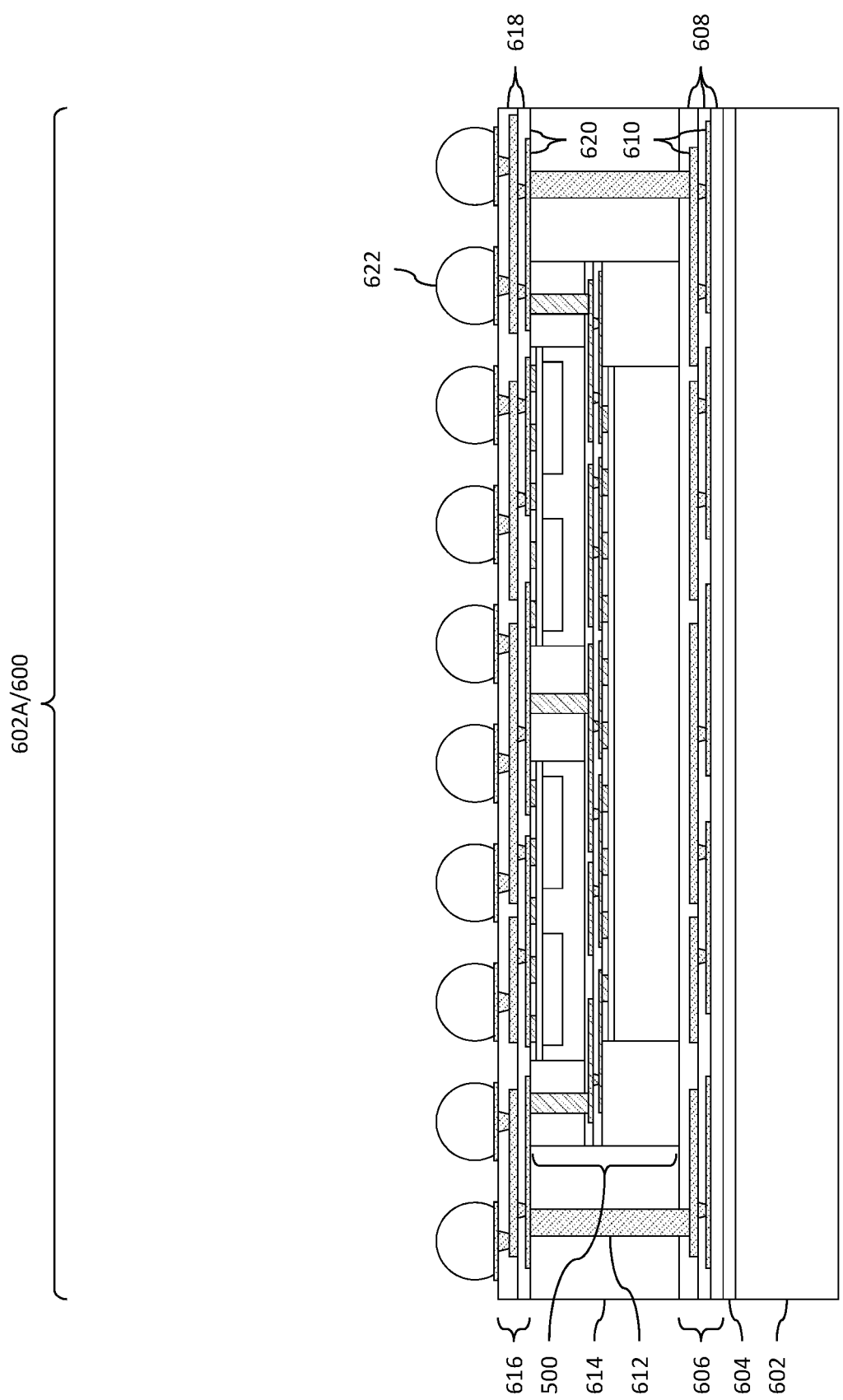

In FIG. 32, a redistribution structure 616 is formed on the encapsulant 614, conductive vias 612, and integrated circuit package 500. The redistribution structure 616 can be formed in a similar manner and of similar materials as the redistribution structure 108 described with respect to FIG. 4. The redistribution structure 616 includes dielectric layers 618 and metallization patterns 620 (sometimes referred to as redistribution layers or redistribution lines). More or fewer dielectric layers 618 and metallization patterns 620 than illustrated may be formed in the redistribution structure 616. The metallization patterns 620 of the redistribution structure 616 are connected to the die connectors 26 and conductive vias 516, 612. The metallization patterns 620 of the redistribution structure 616 include power supply source ($V_{DD}$) lines, power supply ground ($V_{SS}$) lines, and data signal lines, which are electrically coupled to the processor device 10 and power gating device 20 in a similar manner as that described with respect to FIG. 4.

Conductive connectors 622 are formed connected to the metallization patterns 620 of the redistribution structure 616. The conductive connectors 622 can be formed in a similar manner and of similar materials as the conductive connectors 114 described with respect to FIG. 5. For example, the conductive connectors 622 can be formed on UBMs of the redistribution structure 616.

Figure 33:
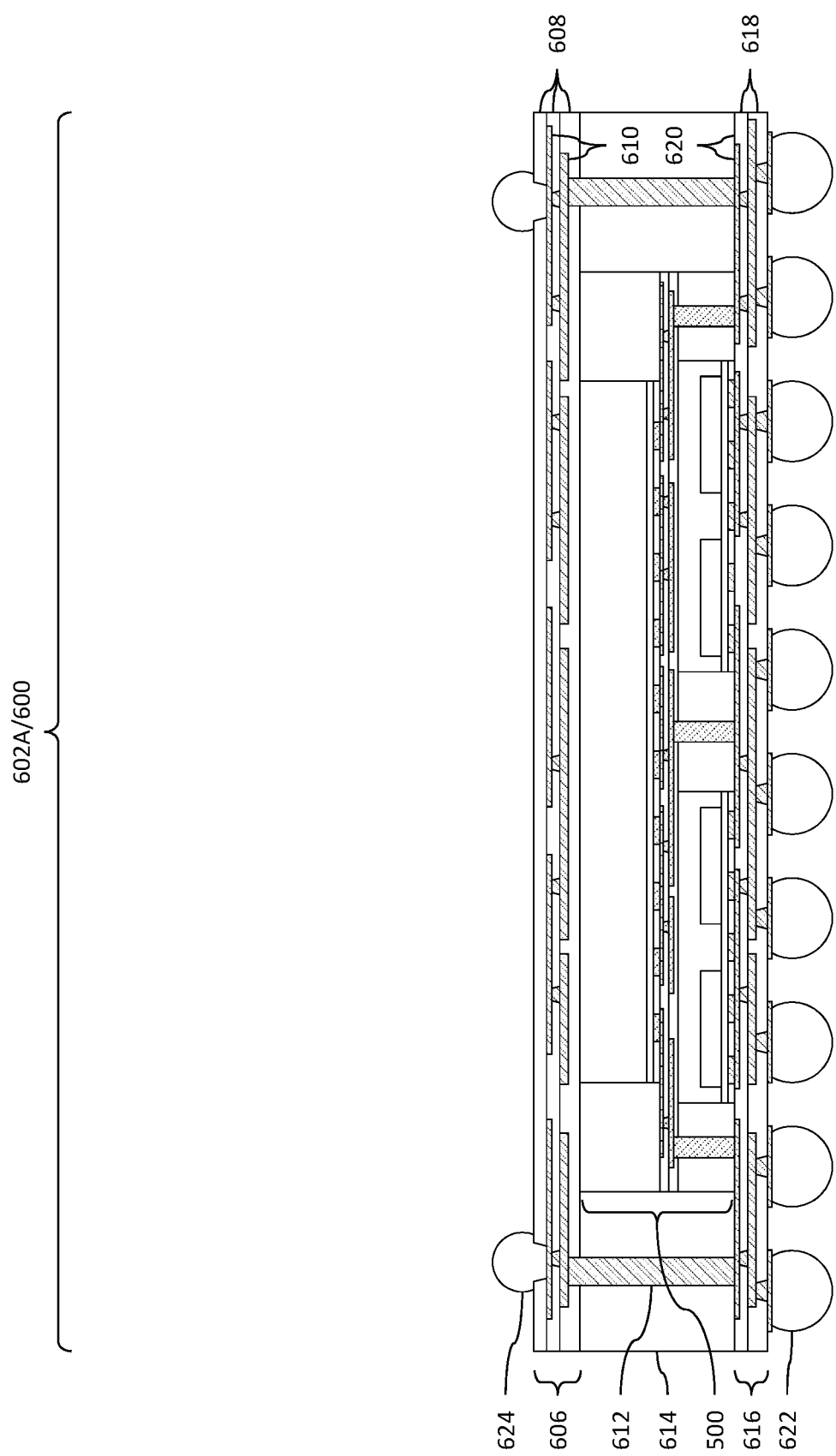

In FIG. 33, a carrier substrate debonding is performed to detach (de-bond) the carrier substrate 602 from the redistribution structure 606, e.g., the bottommost dielectric layer 608. In accordance with some embodiments, the de-bonding includes projecting a light such as a laser light or an UV light on the release layer 604 so that the release layer 604 decomposes under the heat of the light and the carrier substrate 602 can be removed. The structure can then be flipped over and placed on, e.g., a tape.

Further, conductive connectors 624 are formed through the bottommost dielectric layer 608 of the redistribution structure 606. Openings can be formed through the bottommost dielectric layer 608 of the redistribution structure 606, exposing portions of the metallization patterns 610. The openings may be formed, for example, using laser drilling, etching, or the like. The conductive connectors 624 are formed in the openings, and are connected to exposed portions of the metallization patterns 610. The conductive connectors 624 can be formed in a similar manner and of similar materials as the conductive connectors 114 described with respect to FIG. 5.

Figure 34:
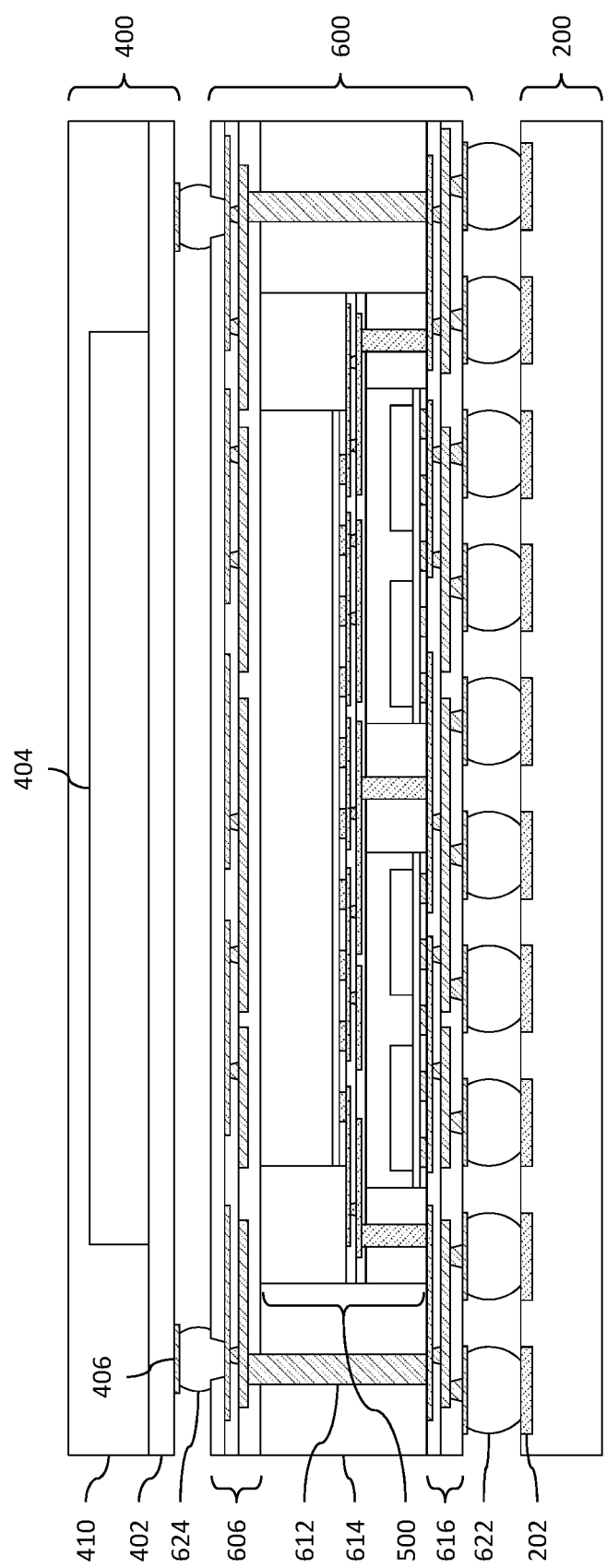

In FIG. 34, a singulation process is performed by sawing along scribe line regions, e.g., around the package region 602A. The singulation process includes sawing the redistribution structures 606, 616 and encapsulant 614. The singulation process separates the package region 602A from adjacent package regions (not illustrated) to form an integrated circuit package 600. After singulation, the redistribution structures 606, 616 (e.g., the dielectric layers 608, 618) and the encapsulant 614 are laterally coterminous.

Another integrated circuit package 400 can be attached to the integrated circuit package 600 to form a package-on-package structure. The integrated circuit package 400 can be attached to the integrated circuit package 600 before or after the integrated circuit package 600 is singulated. The integrated circuit package 400 may be similar to the integrated circuit package 400 described with respect to FIG. 16. For example, the integrated circuit package 400 can include bond pads 406, which are connected to the conductive connectors 624.

The package-on-package structure is then flipped and attached to a package substrate 200 using the conductive connectors 622. The package substrate 200 may be similar to the package substrate 200 described with respect to FIG. 6. For example, the package substrate 200 can include bond pads 202, which are connected to the conductive connectors 622.

FIGS. 35, 36, 37, 38, 39, and 40 are cross-sectional views of intermediate steps during a process for forming an integrated circuit package 700, in accordance with some other embodiments. The integrated circuit package 700 is formed by singulating processor devices 10 and power gating devices 20, and including them in a package component. Packaging of devices in one package region 702A is illustrated, but it should be appreciated that any number of package regions may be simultaneously formed. The package region 702A will be singulated in subsequent processing. The singulated package component may be a fan-out package, such as an integrated fan-out (InFO) package. The fan-out package is then mounted to a package substrate.

Figure 35:
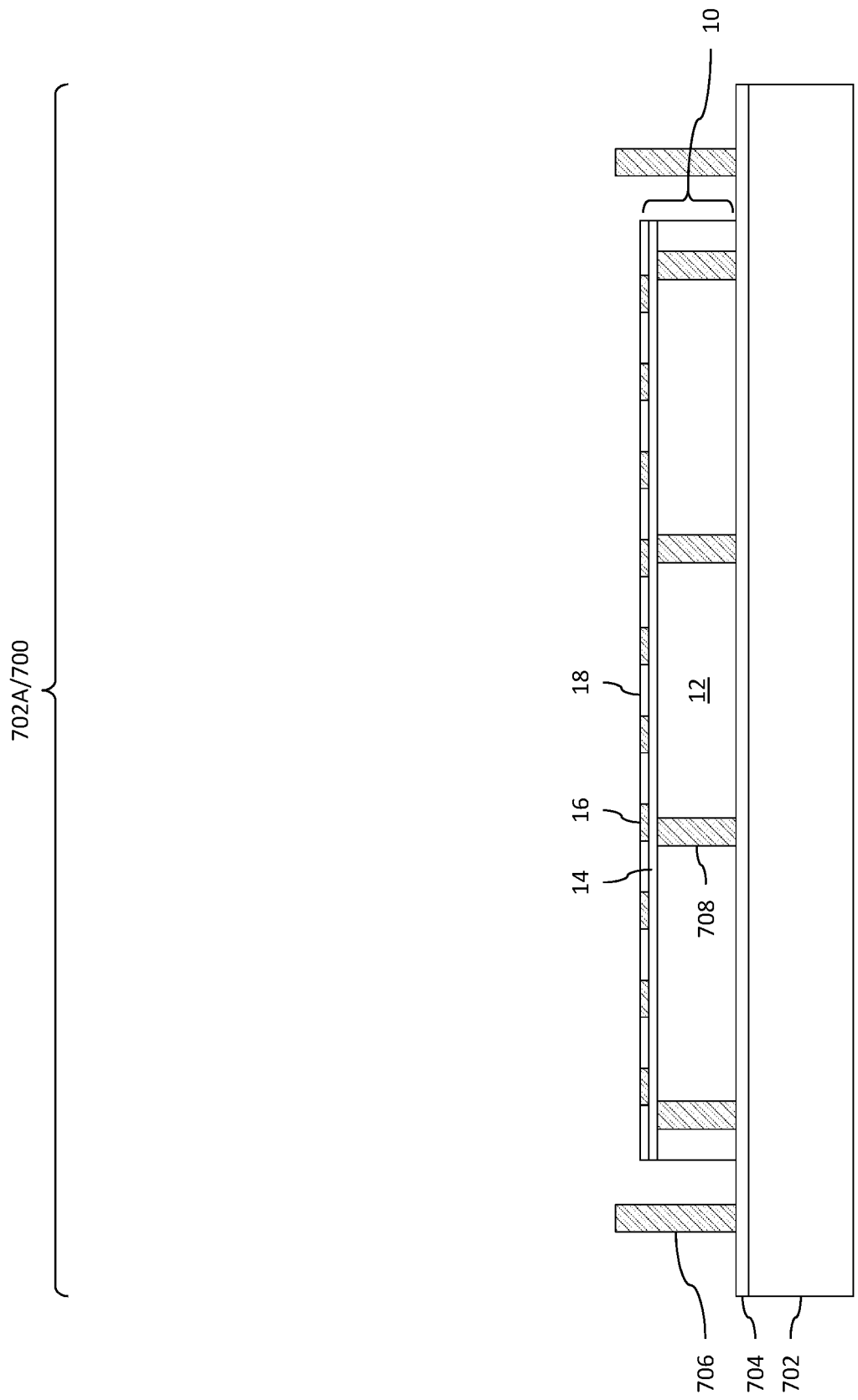
FIGS. 35, 36, 37, 38, 39, and 40 are cross-sectional views of intermediate steps during a process for forming an integrated circuit package, in accordance with some other embodiments.

In FIG. 35, a carrier substrate 702 is provided, and a release layer 704 is formed on the carrier substrate 702. The carrier substrate 702 can be formed in a similar manner and of similar materials as the carrier substrate 302 described with respect to FIG. 8. The release layer 704 can be formed in a similar manner and of similar materials as the release layer 304 described with respect to FIG. 8. Conductive vias 706 are then formed on and extending away from the release layer 704. The conductive vias 706 can be formed in a similar manner and of similar materials as the conductive vias 312 described with respect to FIG. 10.

A processor device 10 similar to that described with respect to FIG. 1 (e.g., comprising a semiconductor substrate 12, interconnect structure 14, die connectors 16, and dielectric layer 18) is then placed on the release layer 704, adjacent the conductive vias 706. In this embodiment, the processor device 10 further includes conductive vias 708, which are formed extending through the semiconductor substrate 12. The conductive vias 708 are electrically coupled to metallization patterns of the interconnect structure 14.

Figure 36:
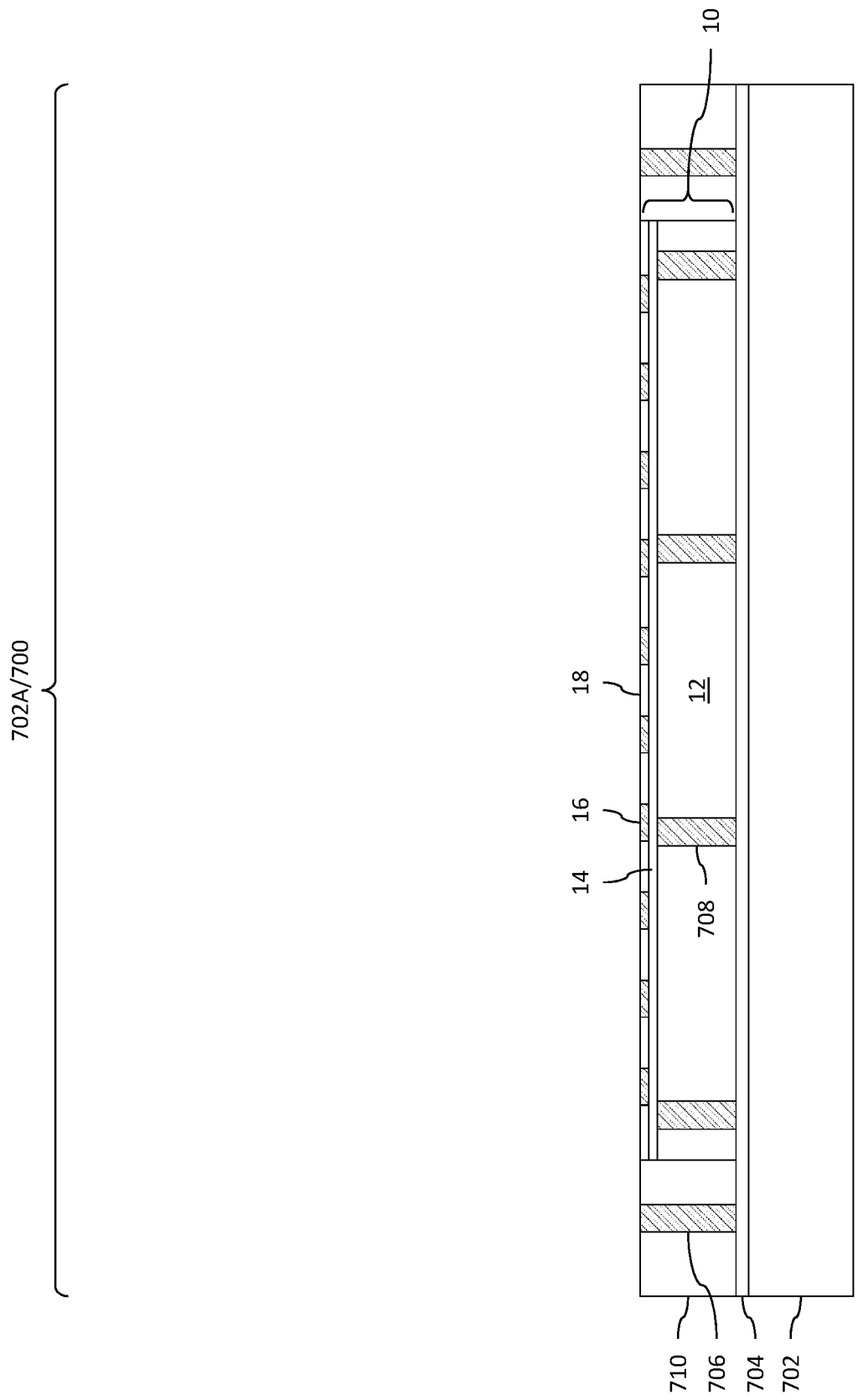

In FIG. 36, an encapsulant 710 is formed on and around the conductive vias 706 and processor device 10. The encapsulant 710 can be formed in a similar manner and of similar materials as the encapsulant 314 described with respect to FIG. 12. A planarization process can be performed on the encapsulant 710, if needed, to expose the die connectors 16 and conductive vias 706.

Figure 37:
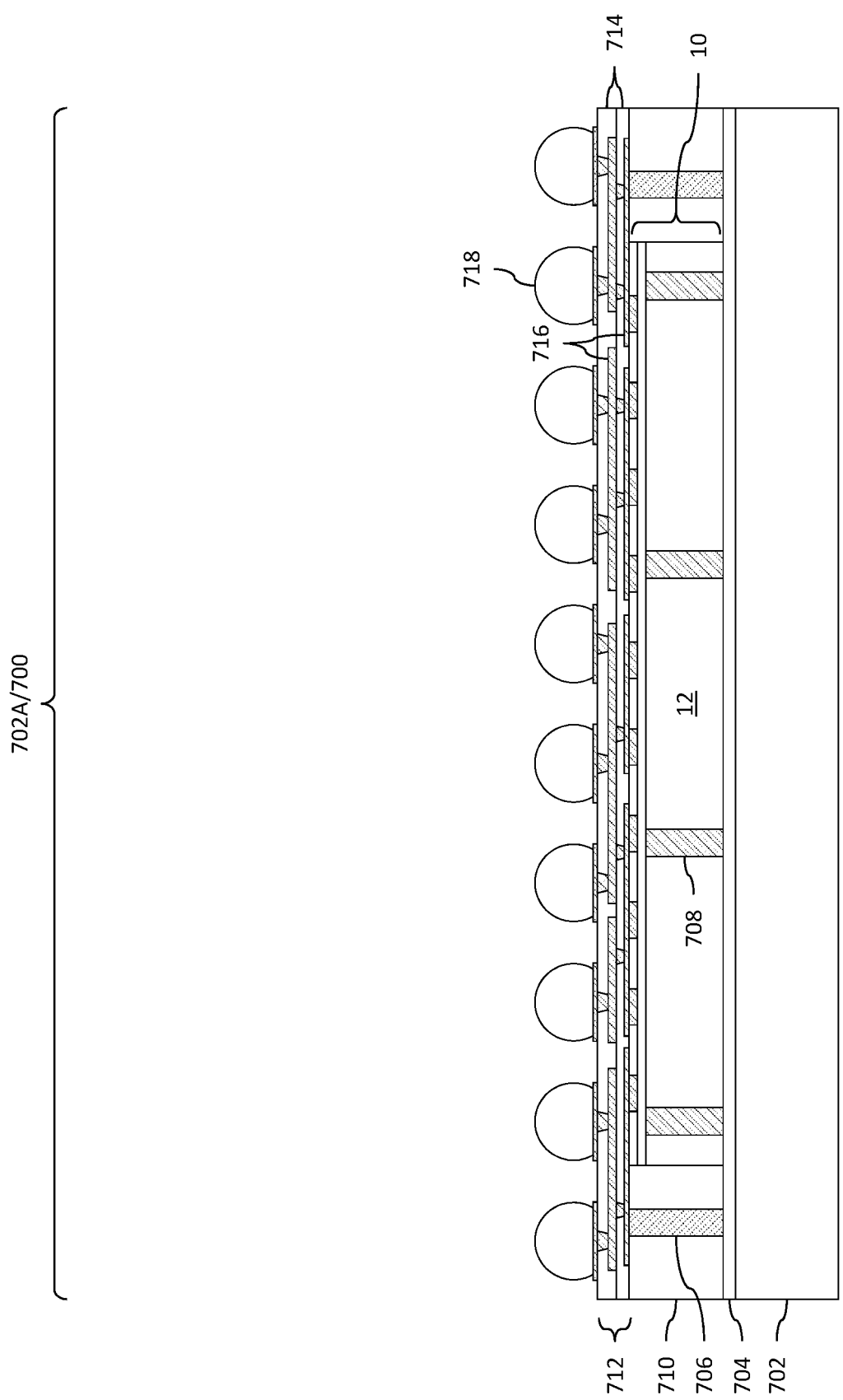

In FIG. 37, a redistribution structure 712 is formed on the encapsulant 710, conductive vias 706, and processor device 10. The redistribution structure 712 can be formed in a similar manner and of similar materials as the redistribution structure 108 described with respect to FIG. 4. The redistribution structure 712 includes dielectric layers 714 and metallization patterns 716 (sometimes referred to as redistribution layers or redistribution lines). More or fewer dielectric layers 714 and metallization patterns 716 than illustrated may be formed in the redistribution structure 712. The metallization patterns 716 of the redistribution structure 712 are connected to the die connectors 16 and conductive vias 706.

Conductive connectors 718 are formed connected to the metallization patterns 716 of the redistribution structure 712. The conductive connectors 718 can be formed in a similar manner and of similar materials as the conductive connectors 114 described with respect to FIG. 5. For example, the conductive connectors 718 can be formed on UBMs of the redistribution structure 712.

Figure 38:
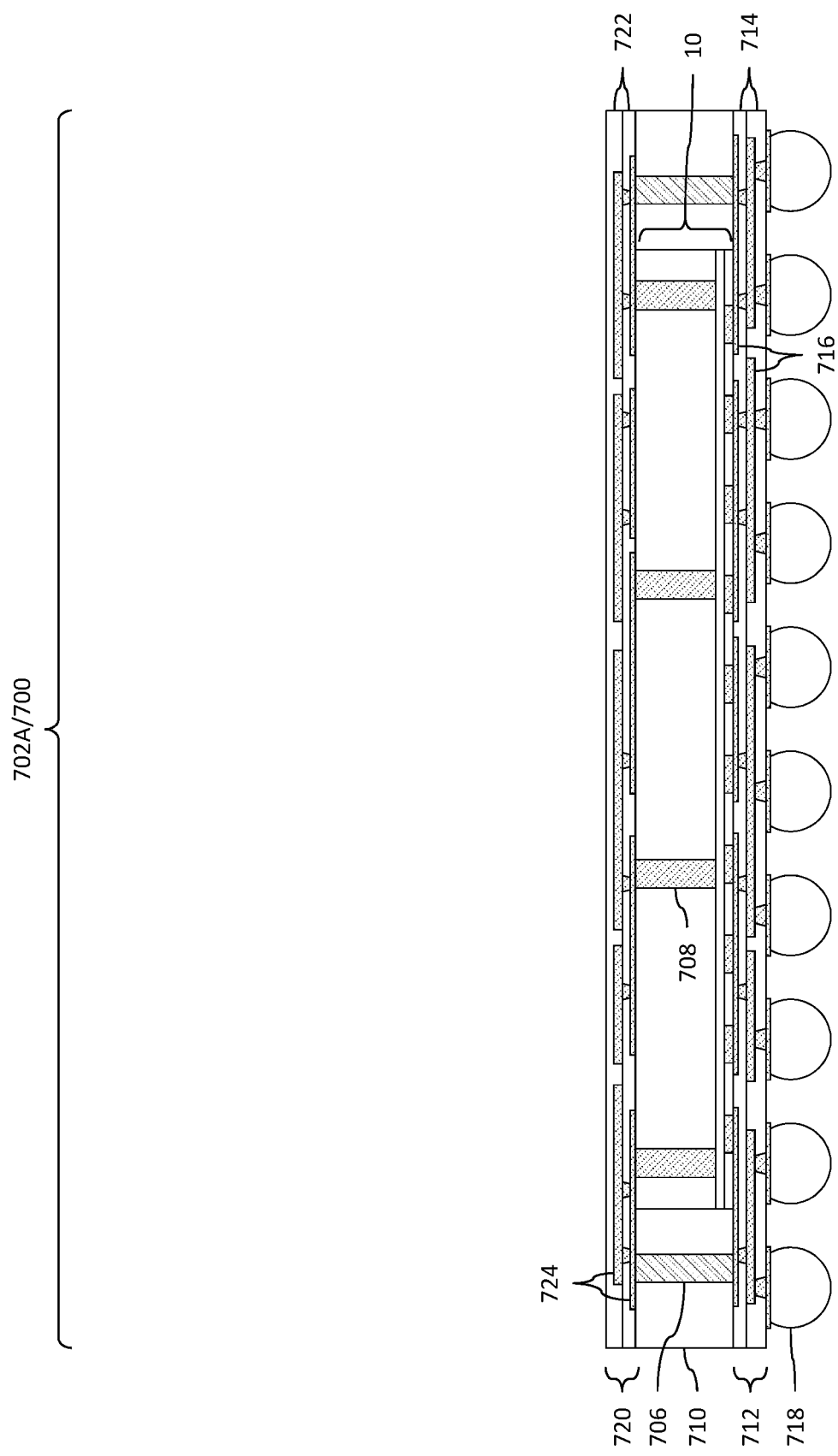

In FIG. 38, a carrier substrate debonding is performed to detach (de-bond) the carrier substrate 702 from the processor device 10. In accordance with some embodiments, the de-bonding includes projecting a light such as a laser light or an UV light on the release layer 704 so that the release layer 704 decomposes under the heat of the light and the carrier substrate 702 can be removed. The structure can then be flipped over and placed on, e.g., a tape.

A redistribution structure 720 is formed on the encapsulant 710, conductive vias 706, and processor device 10. The redistribution structure 720 can be formed in a similar manner and of similar materials as the redistribution structure 108 described with respect to FIG. 4. The redistribution structure 720 includes dielectric layers 722 and metallization patterns 724 (sometimes referred to as redistribution layers or redistribution lines). More or fewer dielectric layers 722 and metallization patterns 724 than illustrated may be formed in the redistribution structure 720. The metallization patterns 724 of the redistribution structure 720 are connected to the conductive vias 706, 708.

Figure 39:
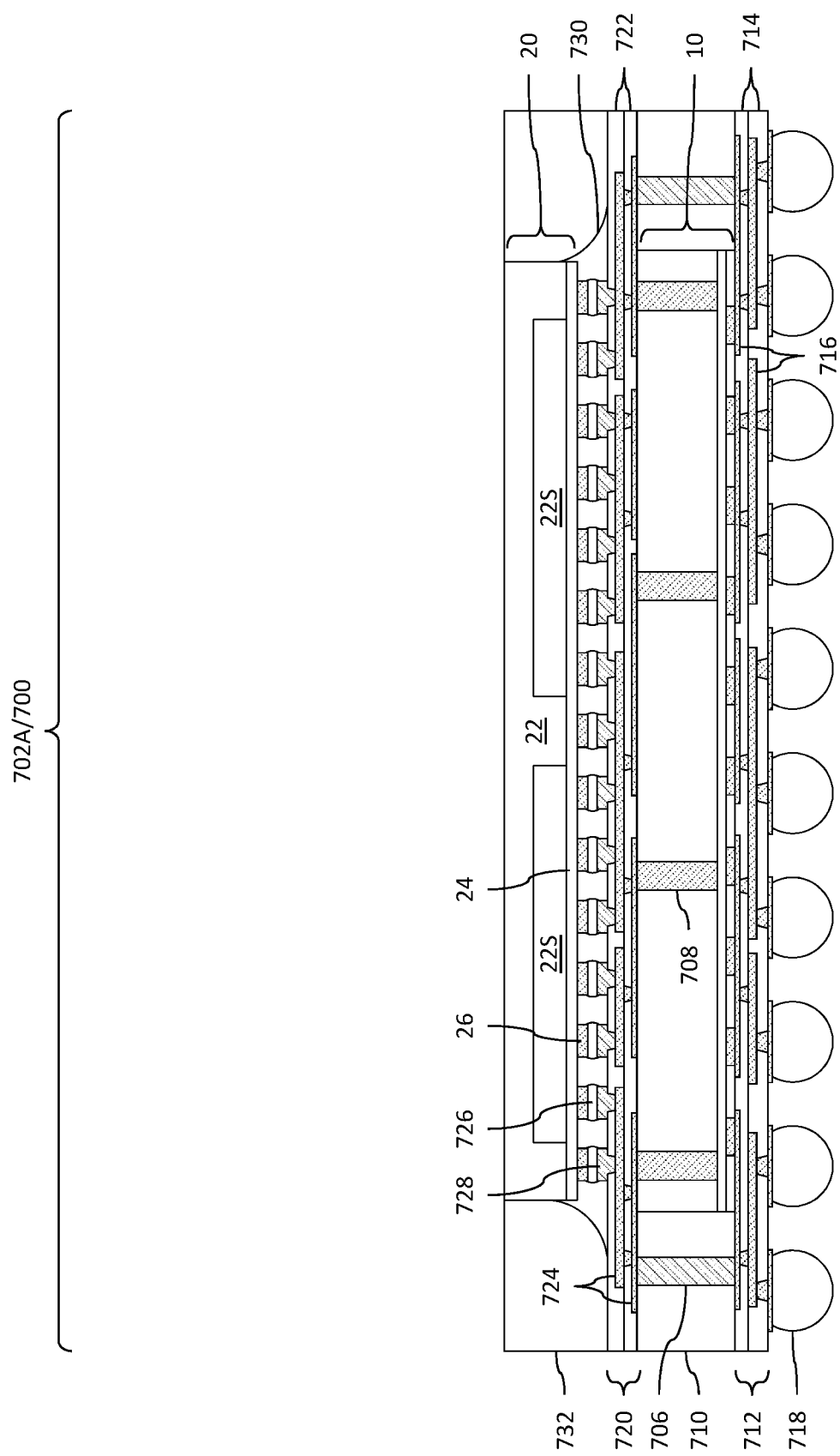

In FIG. 39, a power gating device 20 similar to that described with respect to FIG. 1 (e.g., comprising a semiconductor substrate 22, interconnect structure 24, and die connectors 26) is attached to the redistribution structure 720 with conductive connectors 726. The power gating device 20 will be electrically coupled to the processor device 10 through the redistribution structures 712, 720 (e.g., the metallization patterns 716, 724), and so the formation of the conductive vias 30 (see FIG. 1) is unnecessary. Further, the dielectric layer 28 (see FIG. 1) can also be omitted from the power gating device 20. Manufacturing costs of the power gating device 20 may thus be reduced.

In some embodiments, the power gating device 20 is attached to conductive bumps, such as micro bumps. For example, die connectors 728 can be formed extending through the bottommost dielectric layer 722 of the redistribution structure 720. As an example to form the die connectors 728, openings can be formed through the bottommost dielectric layer 722 of the redistribution structure 720, exposing portions of the metallization patterns 724. The openings may be formed, for example, using laser drilling, etching, or the like. The die connectors 728 can be plated or deposited in the openings, and are connected to exposed portions of the metallization patterns 724. Conductive connectors 726 are formed connecting respective pairs of the die connectors 26, 728. The conductive connectors 726 can be formed in a similar manner and of similar materials as the conductive connectors 114 described with respect to FIG. 5. In this embodiment, the back side of the processor device 10 faces the front side of the power gating device 20.

The metallization patterns 716 of the redistribution structure 712 include power supply source ($V_{DD}$) lines, power supply ground ($V_{SS}$) lines, and data signal lines. A first subset of the $V_{DD}$ and $V_{SS}$ lines are connected to the die connectors 16 of the processor device 10. Thus, a first subset of the circuit blocks of the processor device 10 are electrically connected to the $V_{DD}$ and $V_{SS}$ lines of the redistribution structure 712, bypassing the power gating device 20. The first subset of the circuit blocks are thus permanently electrically coupled to power and ground. The first subset of the circuit blocks may be essential circuit blocks that are always turned on. A second subset of the $V_{DD}$ and $V_{SS}$ lines are electrically coupled to input terminals of the power gating device 20 through the conductive vias 706 and the metallization patterns 724 of the redistribution structure 720. The metallization patterns 724 of the redistribution structure 720 also include lines that electrically couple the processor device 10 to output terminals of the power gating device 20. Thus, a second subset of the circuit blocks of the processor device 10 are electrically coupled to the $V_{DD}$ and $V_{SS}$ lines through the power gating device 20, redistribution structure 720, and conductive vias 706, 708. The second subset of the circuit blocks can thus be turned on and off by the power gating device 20. In some embodiments, some of the conductive vias 708 are connected to data signal lines of the redistribution structure 720. The data signal lines are electrically coupled to the processor device 10 and power gating device 20. The processor device 10 may send control signals to the power gating device 20 over the data signal lines, and may receive power/ground signals from the power gating device 20 over the data signal lines.

An underfill 730 is then formed between the power gating device 20 and the redistribution structure 720, surrounding the conductive connectors 726. The underfill 730 may be formed by a capillary flow process after the power gating device 20 is attached or may be formed by a suitable deposition method before the power gating device 20 is attached.

An encapsulant 732 is formed on and around the power gating device 20 and the underfill 730. The encapsulant 732 can be formed in a similar manner and of similar materials as the encapsulant 314 described with respect to FIG. 12. A planarization process can be performed on the encapsulant 710, if needed, to expose the power gating device 20.

Figure 40:
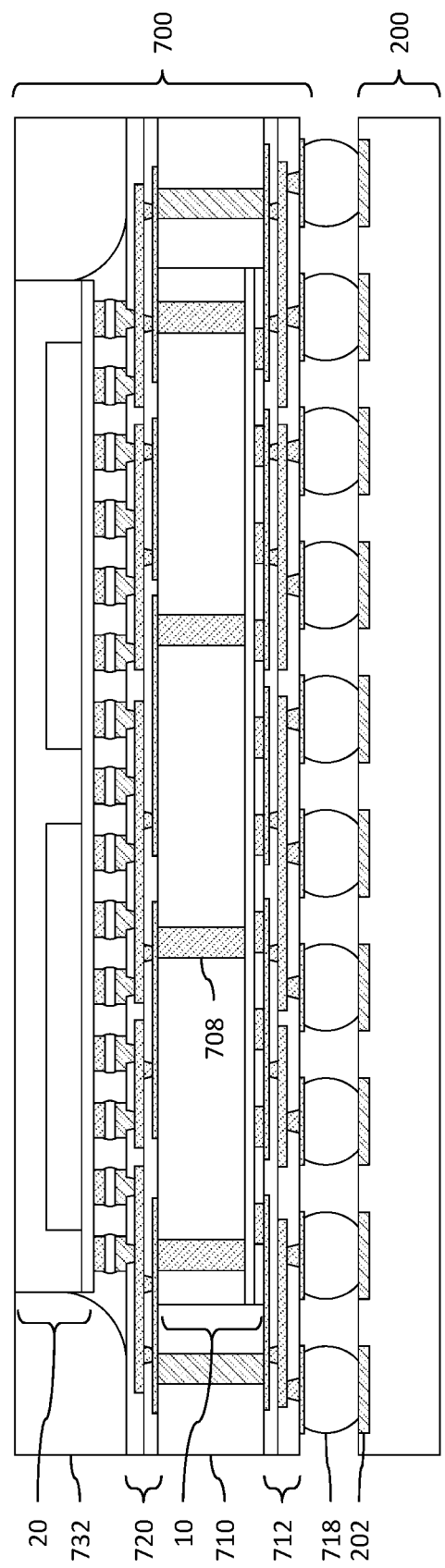

In FIG. 40, a singulation process is performed by sawing along scribe line regions, e.g., around the package region 702A. The singulation process includes sawing the redistribution structures 712, 720 and encapsulants 710, 732. The singulation process separates the package region 702A from adjacent package regions (not illustrated) to form an integrated circuit package 700. After singulation, the redistribution structures 712, 720 (e.g., the dielectric layers 714, 722) and the encapsulants 710, 732 are laterally coterminous.

The integrated circuit package 700 is then attached to a package substrate 200 using the conductive connectors 718. The package substrate 200 may be similar to the package substrate 200 described with respect to FIG. 6. For example, the package substrate 200 can include bond pads 202, which are connected to the conductive connectors 718.

Figure 41:
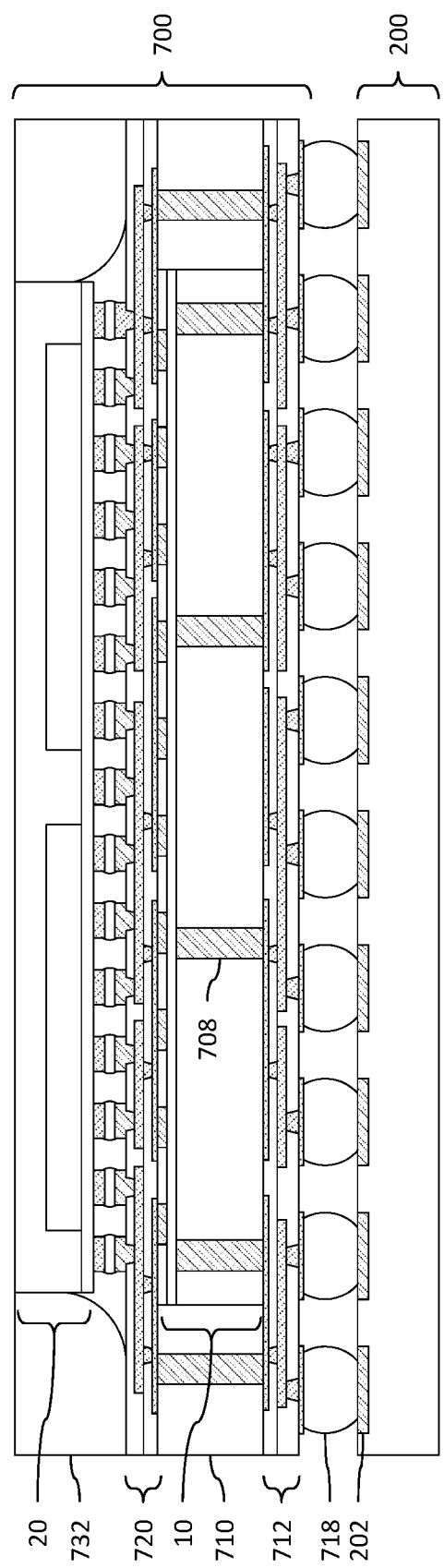
FIG. 41 is a cross-sectional view of an integrated circuit package, in accordance with some other embodiments.

FIG. 41 is a cross-sectional view of an integrated circuit package 700, in accordance with some other embodiments. This embodiment is similar to the embodiment described with respect to FIG. 40, except the front side of the processor device 10 faces the front side of the power gating device 20. The metallization patterns 724 of the redistribution structure 720 (e.g., $V_{DD}$ and $V_{SS}$ lines) are thus directly connected to the die connectors 16. The conductive vias 706, 708 are thus used for data signal lines.

Embodiments may achieve advantages. Forming integrated circuit packages with power gating devices 20 that are separate from the processor devices 10 allows the power gating device 20 to be formed with larger active devices than the processor device 10. Switch transistors of a large technology node may thus be used for power delivery. Switch transistors of a large technology node can accommodate greater rush currents and have a smaller voltage drop (e.g., IR drop) when the circuit blocks of the processor device 10 are turned on, and also have less power leakage. The power consumption of the resulting integrated circuit packages may thus be reduced.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an embodiment, a device includes: a processor die including circuit blocks, the circuit blocks including active devices of a first technology node; a power gating die including power semiconductor devices of a second technology node, the second technology node larger than the first technology node; and a first redistribution structure including first metallization patterns, the first metallization patterns including power supply source lines and power supply ground lines, where a first subset of the circuit blocks is electrically coupled to the power supply source lines and the power supply ground lines through the power semiconductor devices, and a second subset of the circuit blocks is permanently electrically coupled to the power supply source lines and the power supply ground lines.

In some embodiments, the device further includes: a package substrate; and a conductive connector connected to the package substrate and the first metallization patterns of the first redistribution structure. In some embodiments of the device, the processor die and the power gating die are directly bonded by dielectric-to-dielectric bonds and by metal-to-metal bonds, and the device further includes: a conductive via connected to the processor die and the first metallization patterns of the first redistribution structure; and a dielectric layer surrounding the conductive via and the power gating die, the dielectric layer and the power gating die each disposed between the first redistribution structure and the processor die, the first redistribution structure, the dielectric layer, and the processor die being laterally coterminous. In some embodiments of the device, the processor die and the power gating die are directly bonded by dielectric-to-dielectric bonds and by metal-to-metal bonds, and the device further includes: a conductive via connected to the processor die and the first metallization patterns of the first redistribution structure; a dielectric layer surrounding the conductive via and the power gating die, the dielectric layer and the power gating die each disposed between the first redistribution structure and the processor die, the dielectric layer and the processor die being laterally coterminous; and an encapsulant surrounding the processor die and the dielectric layer, the encapsulant and the first redistribution structure being laterally coterminous. In some embodiments of the device, the first metallization patterns of the first redistribution structure are connected to the power gating die, and the device further includes: a second redistribution structure disposed between the processor die and the power gating die, the second redistribution structure including second metallization patterns, the processor die connected to the second metallization patterns; a first encapsulant surrounding the power gating die; a conductive via extending through the first encapsulant, the conductive via connected to the first metallization patterns of the first redistribution structure and the second metallization patterns of the second redistribution structure; and a second encapsulant surrounding the processor die, the second encapsulant, the second redistribution structure, the first encapsulant, and the first redistribution structure being laterally coterminous. In some embodiments of the device, the first metallization patterns of the first redistribution structure are connected to the power gating die, and the device further includes: a second redistribution structure disposed between the processor die and the power gating die, the second redistribution structure including second metallization patterns, the processor die connected to the second metallization patterns; a first encapsulant surrounding the power gating die; a conductive via extending through the first encapsulant, the conductive via connected to the first metallization patterns of the first redistribution structure and the second metallization patterns of the second redistribution structure; a second encapsulant surrounding the processor die, the second encapsulant, the second redistribution structure, and the first encapsulant being laterally coterminous; and a third encapsulant surrounding the second encapsulant, the second redistribution structure, and the first encapsulant, the third encapsulant and the first redistribution structure being laterally coterminous. In some embodiments of the device, the first metallization patterns of the first redistribution structure are connected to the processor die, and the device further includes: a second redistribution structure disposed between the processor die and the power gating die, the second redistribution structure including second metallization patterns, the second metallization patterns connected to the processor die and the power gating die; a first encapsulant surrounding the processor die; a conductive via extending through the first encapsulant, the conductive via connected to the first metallization patterns of the first redistribution structure and the second metallization patterns of the second redistribution structure; and a second encapsulant surrounding the power gating die, the second encapsulant, the first encapsulant, the second redistribution structure, and the first redistribution structure being laterally coterminous. In some embodiments of the device, the power gating die is operable at runtime to receive a control signal from the processor die, and to turn one of the first subset of the circuit blocks of the processor die on or off responsive to the control signal. In some embodiments of the device, the active devices of the processor die are complementary metal-oxide-semiconductor devices, and the power semiconductor devices of the power gating die are insulated-gate bipolar transistor devices or double diffused metal-oxide-semiconductor devices.

In an embodiment, a device includes: a processor die including circuit blocks, the circuit blocks including active devices of a first technology node; a power gating die directly bonded to the processor die by dielectric-to-dielectric bonds and by metal-to-metal bonds, the power gating die including power semiconductor devices of a second technology node, the second technology node larger than the first technology node, the power semiconductor devices electrically coupled to a first subset of the circuit blocks; a dielectric layer surrounding the power gating die; first conductive vias extending through the dielectric layer, the first conductive vias electrically coupled to a second subset of the circuit blocks; and a first redistribution structure including first metallization patterns, the first metallization patterns including power supply source lines connected to the first conductive vias and the power gating die; a package substrate; and first conductive connectors connecting the package substrate to the first metallization patterns of the first redistribution structure.

In some embodiments of the device, the processor die, the dielectric layer, and the first redistribution structure are laterally coterminous. In some embodiments of the device, the processor die and the dielectric layer are laterally coterminous, and the device further includes: an encapsulant surrounding the processor die and the dielectric layer, the encapsulant and the first redistribution structure being laterally coterminous. In some embodiments, the device further includes: a second redistribution structure including second metallization patterns, the encapsulant disposed between the first redistribution structure and the second redistribution structure; second conductive vias extending through the encapsulant, the second conductive vias connected to the second metallization patterns of the second redistribution structure and the first metallization patterns of the first redistribution structure; a memory package; and second conductive connectors connecting the memory package to the second metallization patterns of the second redistribution structure. In some embodiments of the device, the active devices of the processor die are complementary metal-oxide-semiconductor devices, and the power semiconductor devices of the power gating die are insulated-gate bipolar transistor devices or double diffused metal-oxide-semiconductor devices. In some embodiments of the device, the processor die and the power gating die are directly bonded in a face-to-face manner. In some embodiments of the device, the processor die and the power gating die are directly bonded in a face-to-back manner.

In an embodiment, a method includes: bonding a power gating die to a wafer, the wafer including a processor die, the power gating die and the processor die including active devices of different pitches, the power gating die including first conductive vias; forming a dielectric layer around the power gating die and on the wafer; patterning openings in first dielectric layer, the openings exposing die connectors of the processor die; plating a conductive material in the openings and on the die connectors; planarizing the conductive material to form second conductive vias in the openings, the planarizing exposing the first conductive vias of the power gating die; and sawing the dielectric layer and the wafer to singulate the processor die.

In some embodiments, the method further includes: before the sawing, forming a redistribution structure on the power gating die, the dielectric layer, and the second conductive vias, the sawing including sawing the redistribution structure. In some embodiments, the method further includes, after the sawing: encapsulating the power gating die and the dielectric layer with an encapsulant; and forming a redistribution structure on the encapsulant, the power gating die, the dielectric layer, and the second conductive vias. In some embodiments of the method, the power gating die includes active devices of a larger technology node than the processor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a processor die comprising circuit blocks, the circuit blocks comprising active devices of a first technology node;
   a power gating die comprising power semiconductor devices of a second technology node, a pitch between adjacent ones of the power semiconductor devices of the second technology node being larger than a pitch between adjacent ones of the active devices of the first technology node; and
   a first redistribution structure comprising first metallization patterns, the first metallization patterns comprising power supply source lines and power supply ground lines, wherein a first subset of the circuit blocks is electrically coupled to the power supply source lines and the power supply ground lines through the power semiconductor devices, and a second subset of the circuit blocks is permanently electrically coupled to the power supply source lines and the power supply ground lines.

2. The device of claim 1 further comprising:
   a package substrate; and
   a conductive connector connected to the package substrate and the first metallization patterns of the first redistribution structure.

3. The device of claim 1, wherein the processor die and the power gating die are directly bonded by dielectric-to-dielectric bonds and by metal-to-metal bonds, and the device further comprises:
   a conductive via connected to the processor die and the first metallization patterns of the first redistribution structure; and
   a dielectric layer surrounding the conductive via and the power gating die, the dielectric layer and the power gating die each disposed between the first redistribution structure and the processor die, the first redistribution structure, the dielectric layer, and the processor die being laterally coterminous.

4. The device of claim 1, wherein the processor die and the power gating die are directly bonded by dielectric-to-dielectric bonds and by metal-to-metal bonds, and the device further comprises:
   a conductive via connected to the processor die and the first metallization patterns of the first redistribution structure;
   a dielectric layer surrounding the conductive via and the power gating die, the dielectric layer and the power gating die each disposed between the first redistribution structure and the processor die, the dielectric layer and the processor die being laterally coterminous; and
   an encapsulant surrounding the processor die and the dielectric layer, the encapsulant and the first redistribution structure being laterally coterminous.

5. The device of claim 1, wherein the first metallization patterns of the first redistribution structure are connected to the power gating die, and the device further comprises:
   a second redistribution structure disposed between the processor die and the power gating die, the second redistribution structure comprising second metallization patterns, the processor die connected to the second metallization patterns;
   a first encapsulant surrounding the power gating die;
   a conductive via extending through the first encapsulant, the conductive via connected to the first metallization patterns of the first redistribution structure and the second metallization patterns of the second redistribution structure; and
   a second encapsulant surrounding the processor die, the second encapsulant, the second redistribution structure, the first encapsulant, and the first redistribution structure being laterally coterminous.

6. The device of claim 1, wherein the first metallization patterns of the first redistribution structure are connected to the power gating die, and the device further comprises:
   a second redistribution structure disposed between the processor die and the power gating die, the second redistribution structure comprising second metallization patterns, the processor die connected to the second metallization patterns;
   a first encapsulant surrounding the power gating die;
   a conductive via extending through the first encapsulant, the conductive via connected to the first metallization patterns of the first redistribution structure and the second metallization patterns of the second redistribution structure;
   a second encapsulant surrounding the processor die, the second encapsulant, the second redistribution structure, and the first encapsulant being laterally coterminous; and
   a third encapsulant surrounding the second encapsulant, the second redistribution structure, and the first encapsulant, the third encapsulant and the first redistribution structure being laterally coterminous.

7. The device of claim 1, wherein the first metallization patterns of the first redistribution structure are connected to the processor die, and the device further comprises:
   a second redistribution structure disposed between the processor die and the power gating die, the second redistribution structure comprising second metallization patterns, the second metallization patterns connected to the processor die and the power gating die;
   a first encapsulant surrounding the processor die;
   a conductive via extending through the first encapsulant, the conductive via connected to the first metallization patterns of the first redistribution structure and the second metallization patterns of the second redistribution structure; and
   a second encapsulant surrounding the power gating die, the second encapsulant, the first encapsulant, the second redistribution structure, and the first redistribution structure being laterally coterminous.

8. The device of claim 1, wherein the power gating die comprises an integrated circuit configured to receive a control signal from the processor die, and to turn one of the first subset of the circuit blocks of the processor die on or off responsive to the control signal.

9. The device of claim 1, wherein the active devices of the processor die are complementary metal-oxide-semiconductor devices, and the power semiconductor devices of the power gating die are insulated-gate bipolar transistor devices or double diffused metal-oxide-semiconductor devices.

10. A device comprising:
- a processor die comprising circuit blocks, the circuit blocks comprising active devices of a first technology node;
- a power gating die directly bonded to the processor die by dielectric-to-dielectric bonds and by metal-to-metal bonds, the power gating die comprising power semiconductor devices of a second technology node, the second technology node larger than the first technology node, the power semiconductor devices electrically coupled to a first subset of the circuit blocks;
- a dielectric layer surrounding the power gating die;
- first conductive vias extending through the dielectric layer, the first conductive vias electrically coupled to a second subset of the circuit blocks; and
- a first redistribution structure comprising first metallization patterns, the first metallization patterns comprising power supply source lines connected to the first conductive vias and the power gating die;
- a package substrate; and
- first conductive connectors connecting the package substrate to the first metallization patterns of the first redistribution structure.

11. The device of claim 10, wherein the processor die, the dielectric layer, and the first redistribution structure are laterally coterminous.

12. The device of claim 10, wherein the processor die and the dielectric layer are laterally coterminous, and the device further comprises:
- an encapsulant surrounding the processor die and the dielectric layer, the encapsulant and the first redistribution structure being laterally coterminous.

13. The device of claim 12 further comprising:
- a second redistribution structure comprising second metallization patterns, the encapsulant disposed between the first redistribution structure and the second redistribution structure;
- second conductive vias extending through the encapsulant, the second conductive vias connected to the second metallization patterns of the second redistribution structure and the first metallization patterns of the first redistribution structure;
- a memory package; and
- second conductive connectors connecting the memory package to the second metallization patterns of the second redistribution structure.

14. The device of claim 10, wherein the active devices of the processor die are complementary metal-oxide-semiconductor devices, and the power semiconductor devices of the power gating die are insulated-gate bipolar transistor devices or double diffused metal-oxide-semiconductor devices.

15. The device of claim 10, wherein the processor die and the power gating die are directly bonded in a face-to-face manner.

16. The device of claim 10, wherein the processor die and the power gating die are directly bonded in a face-to-back manner.

17. A device comprising:
- a processor die comprising circuit blocks, the circuit blocks comprising active devices, the active devices being complementary metal-oxide-semiconductor devices;
- a power gating die connected to a first subset of the circuit blocks, the power gating die comprising power semiconductor devices, the power semiconductor devices being insulated-gate bipolar transistor devices or double diffused metal-oxide-semiconductor devices, wherein the power gating die is configured to receive a control signal from the processor die, and to turn one of the first subset of the circuit blocks of the processor die on or off responsive to the control signal;
- a dielectric layer around the power gating die;
- conductive vias extending through the dielectric layer, the conductive vias connected to a second subset of the circuit blocks; and
- a redistribution structure on the dielectric layer and the power gating die, the redistribution structure comprising metallization patterns, the metallization patterns connected to the conductive vias and to the power gating die.

18. The device of claim 17, wherein the redistribution structure, the dielectric layer, and the processor die are laterally coterminous.

19. The device of claim 17 further comprising:
- an encapsulant around the processor die and the dielectric layer.

20. The device of claim 17, wherein the active devices of the processor die and the power semiconductor devices of the power gating die have different pitches.

* * * * *